(12) United States Patent
Tsuge

(10) Patent No.: US 7,817,149 B2
(45) Date of Patent: Oct. 19, 2010

(54) SEMICONDUCTOR CIRCUITS FOR DRIVING CURRENT-DRIVEN DISPLAY AND DISPLAY

(75) Inventor: Hitoshi Tsuge, Osaka (JP)

(73) Assignee: Toshiba Matsushita Display Technology Co., Ltd., Tokyo (JP)

(*) Notice: Subject to any disclaimer, the term of this patent is extended or adjusted under 35 U.S.C. 154(b) by 773 days.

(21) Appl. No.: 11/669,333

(22) Filed: Jan. 31, 2007

(65) Prior Publication Data

US 2007/0120784 A1    May 31, 2007

Related U.S. Application Data

(63) Continuation of application No. 10/508,698, filed as application No. PCT/JP03/05165 on Apr. 23, 2003, now Pat. No. 7,180,513.

(30) Foreign Application Priority Data

Apr. 26, 2002  (JP) .............................. 2002-127638
Mar. 18, 2003  (JP) ............................... 2003-74549

(51) Int. Cl.
  *G09G 5/00* (2006.01)
(52) U.S. Cl. ........................... 345/211; 345/214; 345/76
(58) Field of Classification Search ................... 345/76, 345/77, 211, 214, 690; 315/169.3
  See application file for complete search history.

(56) References Cited

U.S. PATENT DOCUMENTS 4,910,480 A    3/1990  Crosby (Continued)

FOREIGN PATENT DOCUMENTS

CN    1294375 A    5/2001

(Continued)

OTHER PUBLICATIONS

Yumoto et al., "Pixel-Driving Methods for Large-Sized Poly-Si AM-OLED Displays," Proc. of Asia Display, Asia Display, IDW '01, pp. 1395-1398, 2001.

(Continued)

*Primary Examiner*—Richard Hjerpe
*Assistant Examiner*—Tom V Sheng
(74) *Attorney, Agent, or Firm*—Oblon, Spivak, McClelland, Maier & Neustadt, L.L.P.

(57) ABSTRACT

In a semiconductor circuit of a current output type, when display is performed by plural semiconductor circuit in one display panel, luminance unevenness for each block with a different semiconductor circuit occurs due to fluctuation in the semiconductor circuits.

In current output stages 14a and 14b, current mirror circuits are constituted at both ends of a chip, and a reference current to be a reference of gradation display is supplied from both the ends. Moreover, by increasing a resistance value of a gate line of the current mirror circuit of distributing a current to each output, deviation of a transistor threshold value in the chip was compensated for, and output currents at left and right ends were matched. Moreover, reference currents were made the same by connecting resistors for reference current generation 11c to 11f each other at least between semiconductor circuits connected side by side, and fluctuation of current values across all semiconductor circuits decreased to 1% or less, whereby unevenness which occurred in boundaries of chips could be eliminated.

18 Claims, 81 Drawing Sheets

U.S. PATENT DOCUMENTS

| | | | | |
|---|---|---|---|---|
| 4,967,192 | A * | 10/1990 | Hirane et al. | 345/211 |
| 5,684,365 | A | 11/1997 | Tang et al. | |
| 5,714,968 | A * | 2/1998 | Ikeda | 345/77 |
| 5,903,234 | A | 5/1999 | Kimura | |
| 5,952,789 | A | 9/1999 | Stewart et al. | |
| 5,959,600 | A | 9/1999 | Uchino et al. | |
| 5,990,629 | A | 11/1999 | Yamada et al. | |
| 6,072,415 | A | 6/2000 | Cheng | |
| 6,091,203 | A | 7/2000 | Kawashima et al. | |
| 6,219,113 | B1 | 4/2001 | Takahara | |
| 6,229,506 | B1 | 5/2001 | Dawson et al. | |
| 6,246,180 | B1 | 6/2001 | Nishigaki | |
| 6,332,661 | B1 | 12/2001 | Yamaguchi | |
| 6,351,255 | B1 | 2/2002 | Ishizuka et al. | |
| 6,359,605 | B1 | 3/2002 | Knapp et al. | |
| 6,369,786 | B1 | 4/2002 | Suzuki | |
| 6,373,454 | B1 | 4/2002 | Knapp et al. | |
| 6,384,817 | B1 | 5/2002 | Janssen et al. | |
| 6,501,466 | B1 | 12/2002 | Yamagishi et al. | |
| 6,525,704 | B1 | 2/2003 | Kondo et al. | |
| 6,528,951 | B2 | 3/2003 | Yamazaki et al. | |
| 6,531,827 | B2 | 3/2003 | Kawashima | |
| 6,531,996 | B1 | 3/2003 | Murade | |
| 6,542,138 | B1 | 4/2003 | Shannon et al. | |
| 6,556,176 | B1 * | 4/2003 | Okuyama et al. | 345/76 |
| 6,567,327 | B2 | 5/2003 | Tsuchi | |
| 6,577,302 | B2 | 6/2003 | Hunter et al. | |
| 6,583,775 | B1 | 6/2003 | Sekiya et al. | |
| 6,586,888 | B2 | 7/2003 | Kitahara et al. | |
| 6,608,620 | B1 | 8/2003 | Suzuki et al. | |
| 6,628,355 | B1 | 9/2003 | Takahara | |
| 6,653,796 | B2 * | 11/2003 | Kimura | 315/169.3 |
| 6,734,636 | B2 | 5/2004 | Sanford et al. | |
| 6,747,417 | B2 | 6/2004 | Meade et al. | |
| 6,756,951 | B1 | 6/2004 | Ishizuka et al. | |
| 6,765,560 | B1 * | 7/2004 | Ozawa | 345/204 |
| 6,872,973 | B1 | 3/2005 | Koyama et al. | |
| 6,879,110 | B2 * | 4/2005 | Koyama | 315/169.1 |
| 6,909,409 | B2 | 6/2005 | Tanada | |
| 6,924,601 | B2 | 8/2005 | Date | |
| 6,937,219 | B2 * | 8/2005 | Chen et al. | 345/90 |
| 6,943,759 | B2 | 9/2005 | Tam | |
| 6,992,647 | B2 | 1/2006 | Hanada et al. | |
| 7,126,568 | B2 * | 10/2006 | LeChevalier | 345/84 |
| 7,173,612 | B2 | 2/2007 | Nanno et al. | |
| 7,528,812 | B2 * | 5/2009 | Tsuge et al. | 345/78 |
| 2001/0048106 | A1 | 12/2001 | Tanada | |
| 2001/0048408 | A1 | 12/2001 | Koyama et al. | |
| 2002/0008686 | A1 | 1/2002 | Kumada et al. | |
| 2002/0050962 | A1 | 5/2002 | Kasai | |
| 2002/0060636 | A1 | 5/2002 | Kazuhiro et al. | |
| 2002/0067134 | A1 | 6/2002 | Kawashima | |
| 2002/0118150 | A1 | 8/2002 | Kwon | |
| 2002/0135309 | A1 | 9/2002 | Okuda | |
| 2003/0184568 | A1 | 10/2003 | Date et al. | |
| 2005/0030264 | A1 | 2/2005 | Tsuge et al. | |
| 2005/0041002 | A1 | 2/2005 | Takahara et al. | |
| 2005/0057580 | A1 | 3/2005 | Yamano et al. | |
| 2005/0168490 | A1 | 8/2005 | Takahara | |
| 2005/0168491 | A1 | 8/2005 | Takahara et al. | |
| 2005/0180083 | A1 | 8/2005 | Takahara et al. | |
| 2006/0279260 | A1 | 12/2006 | Tsuge | |
| 2007/0080905 | A1 | 4/2007 | Takahara | |
| 2007/0126667 | A1 | 6/2007 | Nakamura et al. | |
| 2007/0222718 | A1 | 9/2007 | Takahara | |

FOREIGN PATENT DOCUMENTS

| | | |
|---|---|---|
| CN | 1552050 A | 12/2004 |
| EP | 0 419 255 A2 | 3/1991 |
| EP | 0 737 957 A1 | 10/1996 |
| EP | 0 821 490 A1 | 1/1998 |
| EP | 0 883 191 A2 | 12/1998 |
| EP | 1 094 436 A2 | 4/2001 |
| EP | 1 102 234 A2 | 5/2001 |
| EP | 1 130 565 A1 | 9/2001 |
| EP | 1 282 104 A1 | 2/2003 |
| JP | 58-54728 | 3/1983 |
| JP | 63-290413 A | 11/1988 |
| JP | 1-193797 | 8/1989 |
| JP | 3-57310 | 3/1991 |
| JP | 3-118168 | 5/1991 |
| JP | 4-42619 | 2/1992 |
| JP | 6-314977 A | 11/1994 |
| JP | 8-234683 | 9/1996 |
| JP | 8-286639 A | 11/1996 |
| JP | 8-340243 A | 12/1996 |
| JP | 9-223967 | 8/1997 |
| JP | 9-319323 | 12/1997 |
| JP | 10-11032 A | 1/1998 |
| JP | 10-232649 | 9/1998 |
| JP | 10-319908 | 12/1998 |
| JP | 11-3048 | 1/1999 |
| JP | 11-143429 | 5/1999 |
| JP | 11-202295 | 7/1999 |
| JP | 11-265162 A | 9/1999 |
| JP | 11-282420 | 10/1999 |
| JP | 11-311970 | 11/1999 |
| JP | 2000-105574 A | 4/2000 |
| JP | 2000-122608 A | 4/2000 |
| JP | 2000-293245 | 10/2000 |
| JP | 2001-42822 A | 2/2001 |
| JP | 2001-42827 A | 2/2001 |
| JP | 2001-60076 A | 3/2001 |
| JP | 2001-84927 A | 3/2001 |
| JP | 2001-092370 A | 4/2001 |
| JP | 2001-134217 A | 5/2001 |
| JP | 2001-147659 A | 5/2001 |
| JP | 2001-147675 A | 5/2001 |
| JP | 2001-195014 A | 7/2001 |
| JP | 2001-255843 A | 9/2001 |
| JP | 2001-306031 A | 11/2001 |
| JP | 2001-312243 A | 11/2001 |
| JP | 2002-40990 A | 2/2002 |
| JP | 2002-55654 A | 2/2002 |
| JP | 2002-514320 A | 5/2002 |
| JP | 2002-182612 A | 6/2002 |
| JP | 2002-518691 A | 6/2002 |
| JP | 2002-189448 A | 7/2002 |
| JP | 2002-215095 A | 7/2002 |
| JP | 2002-215096 A | 7/2002 |
| JP | 2002-287682 A | 10/2002 |
| JP | 2003-29708 A | 1/2003 |
| JP | 2003-66865 A | 3/2003 |
| JP | 2003-66906 | 3/2003 |
| JP | 2003-66908 A | 3/2003 |
| JP | 2003-99001 A | 4/2003 |
| JP | 2003-108065 A | 4/2003 |
| JP | 2003-108066 A | 4/2003 |
| JP | 2003-114644 A | 4/2003 |
| JP | 2003-114645 A | 4/2003 |
| JP | 2003-150104 A | 5/2003 |
| JP | 2003-150109 A | 5/2003 |
| JP | 2003-216100 A | 7/2003 |
| JP | 2003-283267 A | 10/2003 |
| JP | 2005-266735 A | 9/2005 |
| KR | 1985-0007703 | 12/1985 |
| KR | 1999-027857 | 4/1999 |
| KR | 2001-0050632 | 6/2001 |
| KR | 2001-0062310 | 7/2001 |
| KR | 2002-0014676 | 2/2002 |
| KR | 2002-0021362 | 3/2002 |
| KR | 2003-0002464 | 1/2003 |
| KR | 2003-0022084 | 3/2003 |

| | | | |
|---|---|---|---|
| WO | WO 97-29548 A1 | 8/1997 |
| WO | WO 98/33165 | 7/1998 |
| WO | WO 98/48403 A1 | 10/1998 |
| WO | WO 99/50817 | 10/1999 |
| WO | WO 99/65011 A2 | 12/1999 |
| WO | WO 99/65012 A2 | 12/1999 |
| WO | WO 01/06484 | 1/2001 |
| WO | WO 03/023750 A1 | 3/2003 |
| WO | WO 03/023752 A1 | 3/2003 |
| WO | WO 03/027998 A1 | 4/2003 |

OTHER PUBLICATIONS

U.S. Appl. No. 11/865,749, filed Oct. 2, 2007, Takahara, et al.

* cited by examiner

GRADATION DATA OF CERTAIN OUTPUT TERMINAL 284

PRE-CHARGE JUDGMENT SIGNAL 285

GRADATION DATA 284

PRE-CHARGE JUDGMENT SIGNAL 285

GRADATION DATA 284

PRE-CHARGE JUDGMENT SIGNAL 285

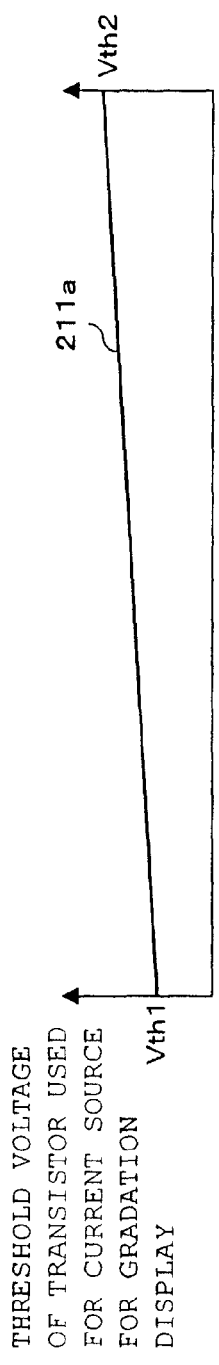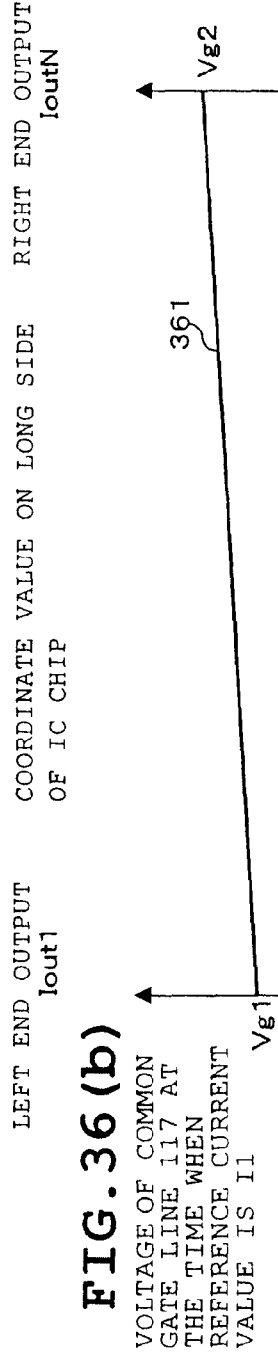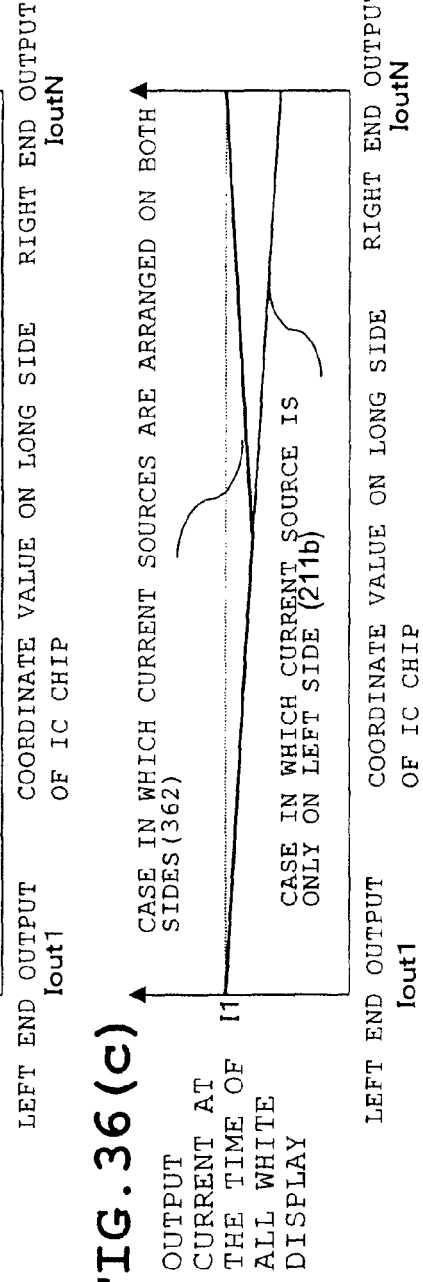

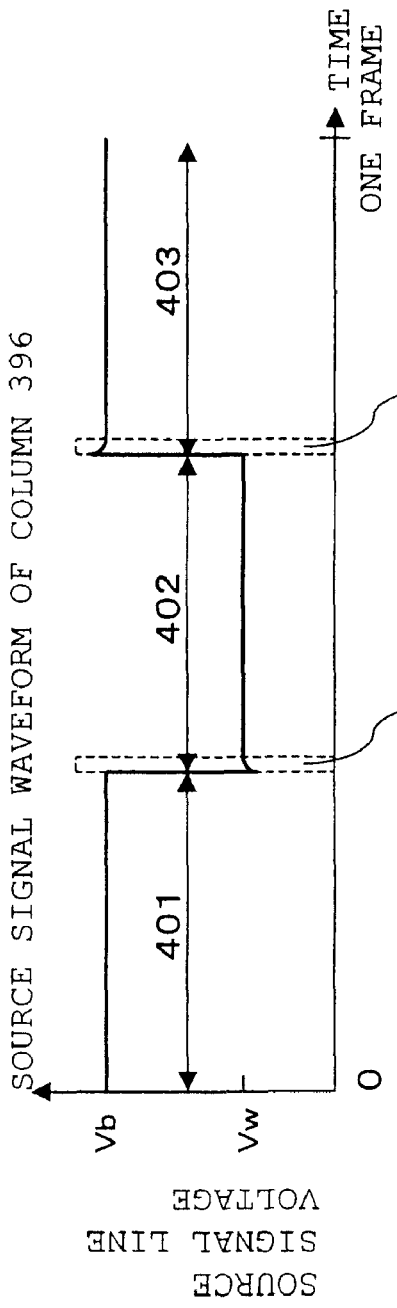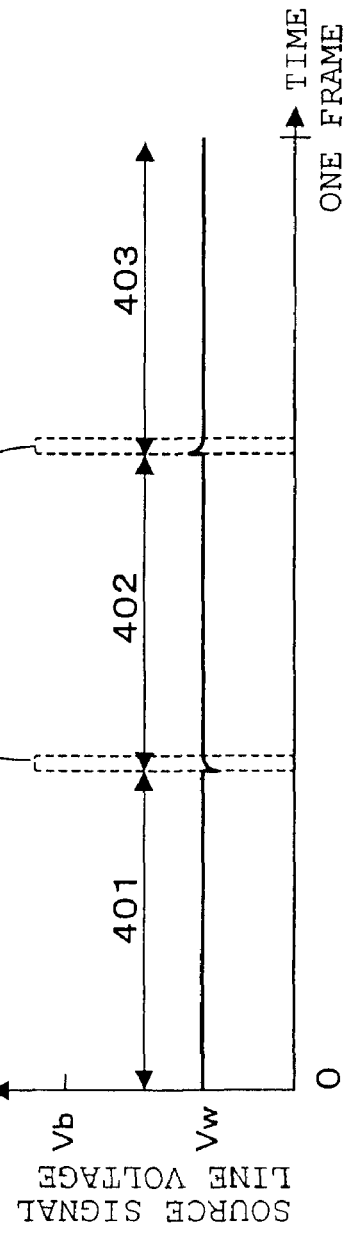

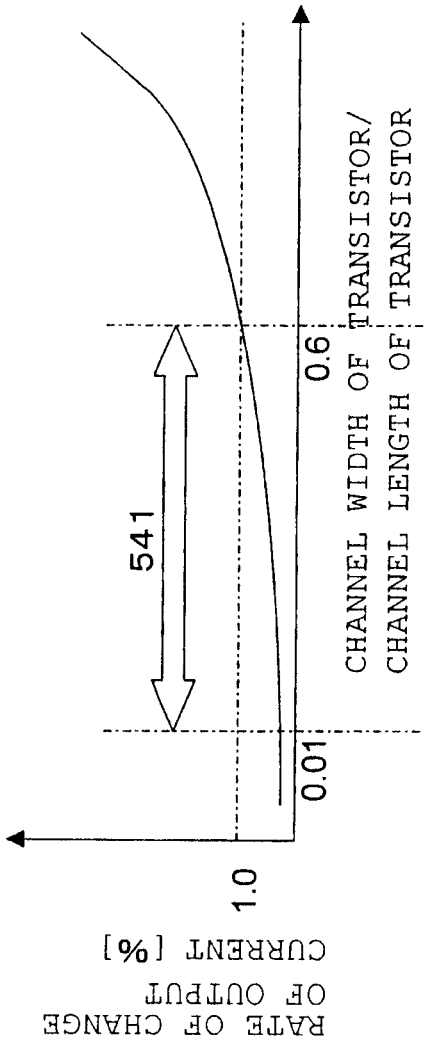
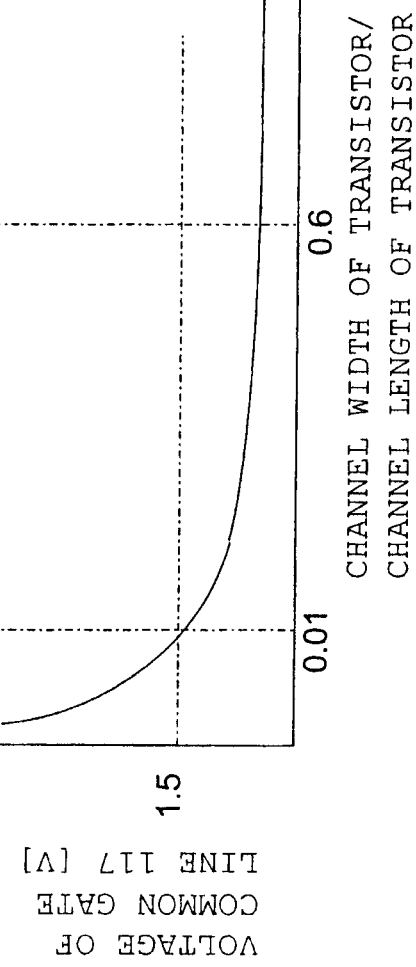
FIG. 54 (a)
FIG. 54 (b)

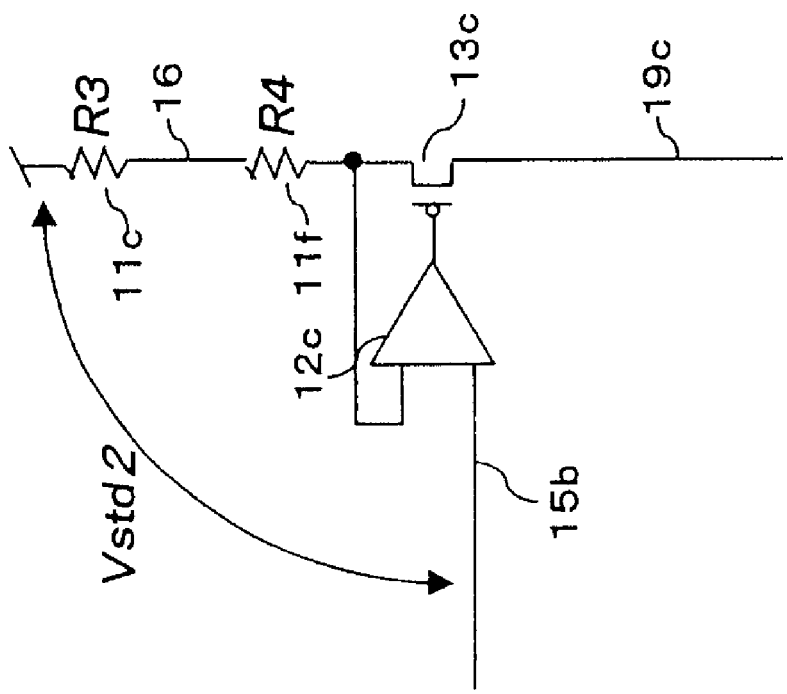
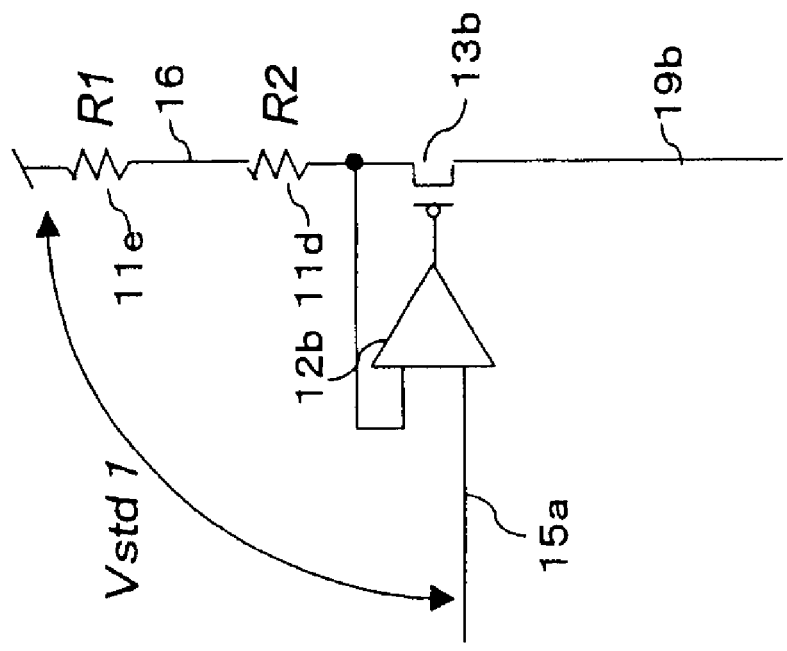
FIG. 66

CASE IN WHICH PIXEL IS N

SEMICONDUCTOR CIRCUITS FOR DRIVING CURRENT-DRIVEN DISPLAY AND DISPLAY

TECHNICAL FIELD

The present invention relates to a driving semiconductor circuit group or the like for a current drive type display device of performing current output which is used for a display device of performing gradation display according to an amount of current such as an organic field luminous element.

BACKGROUND ART

An organic luminous element is hopeful for a display device of the next generation, because the organic luminous element is a self-luminous element, and therefore, for example, the device does not require a backlight required in a liquid crystal display device, and has a wide viewing angle.

A sectional view of an element structure of a general organic luminous element is shown in FIG. 2. The organic luminous element has a structure in which an organic layer 22 is sandwiched by a cathode 21 and an anode 23. When a DC power supply 24 is connected to this organic luminous element, holes and electrons are injected into the organic layer 22 from the anode 23 and the cathode 21, respectively. The injected holes and electrons move to the counter electrodes in the organic layer 22 due to an electric field formed by the power supply 24. The electrons and the holes are combined again within the organic layer 22 in the course of the movement to generate excitons. Luminescence is observed in a process in which energy of the excitons is deactivated. Luminescent colors are different depending upon energy inherent in the excitons, and light having a wavelength of energy substantially corresponding to a value of an energy band gap inherent in the organic layer 22 is generated.

In order to take out the light generated in the organic layer to the outside, a material, which is transparent in a visible light region, is used for at least one of the electrodes. A material, which has a low work function, is used for the cathode in order to facilitate injection of electrons into the organic layer. For example, a material such as aluminum, magnesium, or calcium is used. A material such as an alloy of these metals or aluminum-lithium alloy may be used for durability and a lower work function.

On the other hand, a material having a large ionization potential is used for the anode owing to its easiness to inject holes. In addition, since the cathode does not have transparency, a transparent material is often used for this electrode. Therefore, in general, an ITO (Indium Tin Oxide), gold, indium zinc oxide (IZO), or the like is used.

In recent years, in an organic luminous element using a low molecular material, in order to increase luminous efficiency, as shown in FIG. 3(a), the organic layer 22 may be constituted by plural layers (in this case, four layers). An electron injection layer 31 is provided in order to make it easy to inject electrons into the organic layer from the cathode 21. Similarly, a hole injection layer 34 is used for improving easiness to inject holes from the anode 23. These injection layers are often formed at thickness of about 5% to 20% with respect to thickness of the organic layer 22. This makes it possible to increase the number of carriers for both electrons and holes to be injected into the organic layer. As materials used for these layers, a material having a value of electron affinity close to the work function of the cathode 21 is used in the case of the electron injection layer 31, and a material having a value of ionization potential close to the value of the anode 23 is used in the case of the hole injection layer 34.

On the other hand, materials used for an electron transport layer 32 and a hole transport layer 33 are materials having high mobility of carriers to be transported. In addition, a material having high fluorescence is used for one of the layers, and the layer contributes to luminescence. In other words, one of the layers also functions as a luminous layer. At present, since there are many luminous materials having an electron transport property, in general, the electron transport layer 32 also functions as the luminous layer. In this layer, the carriers for both electrons and holes, which have been injected and moved, are combined again, and light is emitted to the outside. Thus, a material of emitting light having a desired wavelength is used for the electron transport layer 32. As representative materials, there are an aluminum-quinoline complex for green, a europium complex for red, and the like. Note that, in the case in which the electron transport layer 32 and the hole transport layer 33 are used as the luminous layer, one of the layers is not always constituted by one material but maybe constituted by a material obtained by scattering a fluorescent pigment (guest material) in a certain material (host material).

Luminance of the organic luminous element formed in this way is proportional to a current as shown in FIG. 4(a) and is in a nonlinear relation with respect to a voltage as shown in FIG. 4(b). Therefore, in order to perform gradation control, it is better to control the organic luminous element according to a value of current.

An example in the case in which organic luminous elements are incorporated in a passive matrix type display device is shown in FIG. 5 organic luminous elements 55 are arranged in points of intersection of segment signal lines 56 and common signal lines 57 such that a current from the segment signal lines 56 is flown to any one of the organic luminous elements on the identical segment signal lines 56 according to an operation of a common driver 52. Gradation display is performed by the current flowing to the segment signal lines 56.

Therefore, a segment driver 51 is required to be a driver of a current output type.

On the other hand, in the case of an active matrix type, display devices are roughly divided into those of two systems, namely, a voltage drive system and a current drive system.

The voltage drive system is a method of using a source driver of a voltage output type, converting a voltage into a current inside a pixel, and supplying the converted current to organic luminous elements.

The current drive system is a method of using a source driver of a current output type, giving only a function of retaining a value of current, which is outputted for one horizontal scanning period, inside a pixel, and supplying the same value of current as the source driver to organic luminous elements.

An example of a circuit structure inside a pixel of the voltage drive system is shown in FIG. 6. A voltage supplied from a source signal line 60 is applied to a driving transistor 62 through a transistor 66 within a period of selecting the pixel. Note that a capacitor 65 is used for retaining information during one frame even after the period of selecting the pixel has ended.

A current flows from an EL power supply line 64 to an organic luminous element 63 according to a gate voltage of the driving transistor 62—drain current characteristic. It is possible to change an amount of current flowing to the organic luminous element 63 by changing a value of voltage to be applied to the source signal line 60.

However, in this system, there is a problem in that, if there is fluctuation in a voltage/current characteristic of the driving transistor 62, according to the fluctuation, fluctuation is caused in the current flowing to the organic luminous element.

This pixel circuit is often formed of a low-temperature polysilicon process. In the low-temperature polysilicon process, unevenness is easily caused in an amount of laser irradiation used at the time of polycrystallization, and fluctuation is also caused in characteristics of a transistor according to this unevenness of irradiation. In such a voltage drive system, there is a problem in that, since it is difficult to eliminate this unevenness of irradiation in a process, streaks corresponding to a direction of laser irradiation are caused, and unevenness of display is caused.

On the other hand, examples of the current drive system are shown in FIGS. 7 and 8. The system of FIG. 7 uses a current copier system in a pixel circuit. The system of FIG. 8 uses a current mirror system.

A circuit at the time of operation of a pixel 74 in FIG. 7 is shown in FIGS. 9(*a*) and (*b*).

When a pixel is selected, as shown in FIG. 9(*a*), a signal is outputted from a gate driver 71 such that a gate signal line 61*a* of a row of the pixel brings a switch into a conduction state and a gate signal line 61*b* of the line brings a switch into a non-conduction state. A state of the pixel circuit at this point is shown in FIG. 9(*a*). At this point, a current flowing to the source signal line 60, which is a current attracted into a source driver 17, flows through a path indicated by dotted line 101. Thus, a current identical with the current flowing to the source signal line 60 flows to a transistor 72. Then, a potential of a node 102 changes to a potential corresponding to a current/voltage characteristic of the transistor 72.

Next, when the pixel changes to an unselected state, the circuit is changed to a circuit as shown in FIG. 9(*b*) by the gate signal lines 61. A current flows from the EL power supply line 64 to the organic luminous element 63 through a path of dotted line indicated by 103. This current depends upon the potential of the node 102 and the current/voltage characteristic of the transistor 72.

In FIGS. 9(*a*) and (*b*), the potential of the node 102 does not change. Therefore, a drain current flowing to the identical transistor 72 is identical in FIGS. 9(*a*) and (*b*). Consequently, a current of the same value as the value of current flowing to the source signal line 60 flows to the organic luminous element 63: Even if there is fluctuation in the current/voltage characteristic of the transistor 72, values of currents 101 and 103 are not affected in principle, and uniform display without influence of fluctuation in characteristics of a transistor can be realized.

Similarly, in the case of the current mirror system of FIG. 8, a current flowing to the source signal line 60 through a path indicated by Iw in FIG. 10(*a*) flows in the pixel at the time when a row is selected. A voltage corresponding to a gate potential at the time when the current Iw flows to a transistor 82*b* is applied to a node 105.

A current through a path indicated by Ie of FIG. 10(*b*) flows in the pixel at the time when a row is not selected. A potential of the node 105 is retained between period of (a) and (b) by a capacitor 105. Therefore, if characteristics of transistors 82*a* and 82*b* are equal, Iw=Ie.

It is likely that a current flowing to an organic luminous element changes with respect to fluctuation in transistor characteristics. However, since the transistors 82*a* and 82*b* are located in the identical pixel circuit and arranged close to each other compared with the case of the voltage drive, it is possible to reduce fluctuation in a current. Unevenness of display is small compared with the voltage drive.

Therefore, it is necessary to use the current drive system in order to obtain uniform display. For that purpose, the source driver 17 must be a driver IC of a current output type.

An example of an output stage of a current driver IC, which outputs a value of current according to a gradation, is shown in FIG. 11. An analog current is outputted from current outputs 114 by a digital/analog conversion unit 116. The analog/digital conversion unit is constituted by plural (at least the number of bits of the gradation data 115) current sources for gradation display 113 and switches 118, and a common gate line 117 which regulates a value of current flown by one current source for gradation display 113.

In FIG. 11, an analog current is outputted in response to the input 115 of three bits. It is selected by the switches 118 whether the current sources 113 of the number corresponding to a weight of bits are connected to the current output 114, whereby a current corresponding to a gradation can be outputted in such a manner that a current equivalent to one current source 113 is outputted in the case of data 1 and a current equivalent to seven current sources 113 is outputted in the case of data 7. A current output type driver can be realized by arranging 116 of this structure by the number corresponding to the number of outputs of the driver. In order to compensate for a temperature characteristic of the transistors 113, a voltage of the common gate line 117 is determined by a distributing mirror transistor 112. The transistor 112 and the current source group 113 are formed in a current mirror structure, and a current per one gradation is determined according to a value of a reference current 19. With this structure, an output current changes according to a gradation, and a current per one gradation is determined according to a reference current.

Examples of a display device using an organic luminous element are shown in FIGS. 12 to 14. FIGS. 12(*a*) and (*b*) show a television, FIG. 13 shows a digital camera or a digital video camera, and FIG. 14 shows a personal digital assistant. Since a response speed of the organic luminous element is high, the organic luminance element is a display panel suitable for these display devices which has many opportunities to display motion images.

When the number of source signal lines of these display devices increases, as shown in FIG. 15, it is required to use plural current output type source driver ICs 17 with respect to one display panel 151. In this case, if output currents of the driver ICs 17 have fluctuation of 1% or more among chips, luminance is different in each display area of 152*a* and 152*c*, and block unevenness is caused. Therefore, a measure for cascade connection of the driver ICs 17 is required.

In order to reduce fluctuation of output currents among different chips, it is necessary to make a value of the reference current 19 uniform. As a conventional technique of making a reference current uniform, there are known systems such as shown in FIG. 16 (e.g., see Japanese Patent Application Laid-Open No. 2000-293245) and FIG. 19. Note that, since there is no detailed description about an output stage 164, the output stage shown in FIG. 3 is applied.

In the method of FIG. 16, one original current 161 is inputted to reference current distribution units 162 in the driver ICs 17 to generate plural reference currents. A circuit structure example of a reference current distribution unit is shown in FIG. 17. Plural reference currents 163*a* to 163*c* are outputted to the original current 161 by a current mirror circuit. These reference currents 163 are supplied to the driver ICs 17, respectively, to make reference currents of all the driver ICs 17, which are connected in cascade, equal, whereby the block unevenness is eliminated. Note that there is also a method in which 161 is voltage input rather than a current, and the voltage input is connected to a connection line 185 to an operational amplifier 183 shown in FIG. 18. The voltage is changed to a current by a current/voltage conversion unit 184, and a current flowing to a resistor 182 becomes an original current. There is also a method in which this current is distributed by a current mirror to output the reference current 162. The resistor 182 may be incorporated in the driver ICs 17 or may be provided externally.

In a second method of supplying an identical reference current to the plural driver ICs 17 shown in FIG. 19, the reference current 161 is directly inputted to an output stage 164 in a first driver 17a. In a current delivery unit 191, a transistor 201 is connected to a common data line 117 to take a current mirror structure with respect to a reference current. If the reference current is outputted directly, a direction of the current is reversed. Thus, the current direction is further changed by a current mirror structure consisting of transistors 202 and 203, whereby the reference current is supplied to another driver IC 17 by 192. Consequently, the identical reference current flows to the respective driver ICs. Note that the entire disclosure of Japanese Patent Application Laid-Open No. 2000-293245 described above is incorporated herein by reference in its entirety.

In the structure of FIG. 16, in the case in which a display device using plural driver ICs is manufactured, the number of driver ICs, which can be arranged in plural form, is limited by the number of current outputs of the reference current distribution unit 162. For example, in the structure of FIG. 17, only three driver ICs can be arranged at the maximum. In addition, if 162 is arranged in the outside, since another semiconductor circuit is required, there is a problem in that packaging cost and a module structure are complicated.

In addition, in a structure shown in FIG. 20, it is necessary to pass a current through a current mirror circuit twice in order to generate a reference current, and fluctuation tends to increase. Since it is necessary to increase a transistor size in order to control the fluctuation, it is required to increase a chip size. In addition, a current passes through a current mirror of two stages for one chip, in the case of N (N: natural number) chip connection, since the current mirror is repeated 2N times, the original current 161 and an Nth reference current tend to deviate from each other.

In addition, in a method of regulating a current per one gradation of each output with a current mirror using the structure of FIG. 11 in a structure of an output stage as well, as a transistor of a mirror source and a transistor for output are further apart from each other, the current is affected by fluctuation of characteristics of the transistors more easily due to characteristics of the current mirror.

For example, the distributing mirror transistor 112 is arranged at a left end, and the digital analog conversion unit 116 is arranged in the vicinity of an output pad. In that case, if there is shift of a threshold voltage as shown in FIG. 21(a) in a silicon wafer, output currents are different at left and right ends of the driver IC as shown in FIG. 21(b). For example, when the threshold voltage fluctuates as indicated by 211a, since a voltage of the common gate line 117 forming the current mirror is uniform, the current output at the right end decreases compared with the mirror source at the left end. Similarly, relations as indicated by 212ab and 213ab are obtained.

Therefore, even if a reference current value is uniform in all the drivers IC 17, in the case in which plural driver ICs having such an output characteristic are arranged, a difference is caused in current values at boundaries of the driver ICs as shown in FIG. 22. Consequently, block unevenness is caused.

In order to eliminate unevenness for each IC in current driver ICs, there are objects of making it possible to input a reference current uniformly and making current values at left and right ends of an identical chip the same.

DISCLOSURE OF THE INVENTION

A first present invention is a driving semiconductor circuit group for a current drive type display device constituted by arranging plural driving semiconductor circuits wherein, said driving semiconductor circuits comprises: a drive current output mechanism having a common gate line, first and second current distributing means which are provided at both ends of said common gate line and receive input of a reference current, and plural drive current generating means which are provided along said common gate line and generate drive currents on the basis of the reference current to be distributed from said current distributing means in a current mirror system; and reference current generating means which are provided in the vicinity of said current distributing means and generate the reference current from a reference voltage signal having a reference voltage and predetermined power supplies having a voltage higher than the reference voltage, wherein said plural driving semiconductor circuits are arranged, such that the ends of said common gate line of the respective driving semiconductor circuits are adjacent to each other, and wherein a pair of the reference current generating means adjacent to each other in a pair of said driving semiconductor circuits adjacent to each other acquire the predetermined power supplies from the opposed driving semiconductor circuits each other and generate the reference current from the predetermined power supplies and the reference voltage signal to be supplied to said driving semiconductor circuits, said driving semiconductor circuit at least includes plural resistance elements connected in series which are provided between said predetermined power supplies of each of said pair of reference current generating means adjacent to each other and said pair of reference current generating means corresponding to the power supplies, respectively, and a part of said plural resistance elements connected in series are formed on a chip of one of said pair of driving semiconductor circuit adjacent to each other, and the remainder of said plural resistance elements are formed on a chip of the other of said pair of driving semiconductor circuits adjacent to each other.

In addition, a second present invention is a driving semiconductor circuit group for a current drive type display device constituted by arranging plural driving semiconductor circuits, which includes: a drive current output mechanism having a common gate line, first and second current distributing means which are provided at both ends of the common gate line and receive input of a reference current, and plural drive current generating means which are provided along the common gate line and generate drive currents on the basis of the reference current to be distributed from the current distributing means in a current mirror system; and reference current generating means which are provided in the vicinity of the current distributing means and generate the reference current from a reference voltage signal having a reference voltage and predetermined power supplies having a voltage higher than the reference voltage, such that the ends of the common gate line of the respective driving semiconductor circuits are adjacent to each other, in which a pair of the reference current generating means adjacent to each other in a pair of the driving semiconductor circuits adjacent to each other acquire the predetermined power supplies from the opposed driving semiconductor circuits each other and generate the reference current from the predetermined power supplies and the reference voltage signal to be supplied to the driving semiconductor circuits, and resistance elements are provided between the predetermined power supplies of the respective pair of reference current generating means adjacent to each other and the pair of reference current generating means corresponding to the power supplies, respectively.

In addition, a third present invention is the driving semiconductor circuit group for a current output type drive device of the first or the second present invention, wherein a ratio of a sum of channel areas of a semiconductor element group used for said first and second current distributing means with respect to a sum of channel areas of a semiconductor element group used for said drive current generating means is substantially 0.01 or more and 0.5 or less.

In addition, a fourth present invention is the driving semiconductor circuit group for a current output type drive device of the first or the second present invention, wherein a value of (channel width)/(channel length) of a semiconductor element of a semiconductor element group used for said drive current generating means is substantially 0.01 or more and 0.6 or less.

In addition, a fifth present invention is the driving semiconductor circuit group for a current output type drive device of the first or the second present invention, wherein a total resistance value of said common gate line is substantially set to a value equal to or larger than a larger one of a value, which is found by dividing a voltage of a difference between a maximum value and a minimum value of a gate voltage with respect to a reference current value in a use process by a value of substantially 0.5% of the reference current (Is×0.005) (Vgb−Vgw)/(Is×0.005), and 1 KΩ, and equal to or smaller than 5 MΩ.

In addition, a sixth present invention is the driving semiconductor circuit group for a current output type drive device of the first or the second present invention, the driving semiconductor circuit group determining, with first switching means group, whether or not said drive current generating means is connected to an output stage according to the input signal, comprising a current path forming unit which allows a predetermined current value to flow to said drive current generating means via second switching means group for determining a state opposite to a state determined by said first switching means group.

In addition, a seventh present invention is a driving semiconductor circuit group constituted by arranging plural driving semiconductor circuits for a current drive type display device, which includes: a drive current output mechanism having first and second current distributing means which receive input of a reference current, and plural drive current generating means which generate drive currents on the basis of the reference current to be distributed from the current distributing means; and reference current generating means which generate the reference current from a reference voltage signal having a reference voltage and predetermined power supplies having a voltage higher than the reference voltage, such that respective outputs of the reference current are adjacent to each other, in which in a pair of the driving semiconductor circuits adjacent to each other, the respective reference current generating means acquire the predetermined power supplies from the opposed driving semiconductor circuits each other and generate the reference current from the predetermined power supplies and the reference voltage signal to be supplied to the driving semiconductor circuits, the drive current output mechanism has a multi-stage structure, each stage of the multi-stage structure has at least one set having a current source and a delivery unit which takes out plural outputs from the current source, a current source of a first stage of the multi-stage structure is the reference current to be distributed from the current distributing means, the plural outputs of the delivery unit of a last stage of the multi-stage structure are the drive currents, the plural outputs of the delivery units of the respective stages excluding the last stage are given to the current source of the set of a stage below the stages, respectively.

In addition, an eighth present invention is the driving semiconductor circuit group for a current drive type display device of the seventh present invention, in which the driving semiconductor circuits have at least plural resistance elements connected in series which are provided between the predetermined power supplies of the reference current generating means for the respective pair of driving semiconductor circuits adjacent to each other and the pair of reference current generating means corresponding to the power supplies, respectively, and a part of the plural resistance elements connected in series are formed on a chip of one of the pair of driving semiconductor circuits adjacent to each other, and the remainder of the resistance elements are formed on a chip of the other of the pair of driving semiconductor circuits adjacent to each other.

Further, a ninth present invention is the driving semiconductor circuit group for a current drive type display device of the seventh present invention, in which the driving semiconductor circuits have at least plural resistance elements connected in parallel which are provided between the predetermined power supplies of the reference current generating means of the respective pair of driving semiconductor circuits adjacent to each other and the pair of reference current generating means corresponding to the power supplies, respectively, and a part of the plural resistance elements connected in parallel are formed on a chip of one of the pair of driving semiconductor circuits adjacent to each other, and the remainder of the resistance elements are formed on a chip of the other of the pair of driving semiconductor circuits adjacent to each other.

Moreover, a tenth present invention is the driving semiconductor circuit group for a current drive type display device of the seventh present invention, including resistance elements which are provided between the predetermined power supplies of the respective reference current generating means and the pair of reference current generating means corresponding to the power supplies, respectively.

In addition, an eleventh present invention is a display device comprising the driving semiconductor circuit group of any one of the first to the tenth present inventions.

BRIEF DESCRIPTION OF THE DRAWINGS

FIG. 36 is a diagram showing a change in a threshold voltage of a transistor in an IC chip and an output current characteristic corresponding to the change in the case in which the output stage of FIG. 34 is used;

FIG. 40 is a diagram showing source signal line voltage waveforms in columns of 396 and 397 in the case in which image display shown in FIG. 39 is performed;

FIG. 54 is a diagram showing a relation between a change rate of an output current and a gate signal line voltage with respect to a channel width/a channel length of a transistor;

FIG. 66 is a diagram in which two different ICs are used in FIG. 1;

DESCRIPTION OF SYMBOLS

Figure 1:
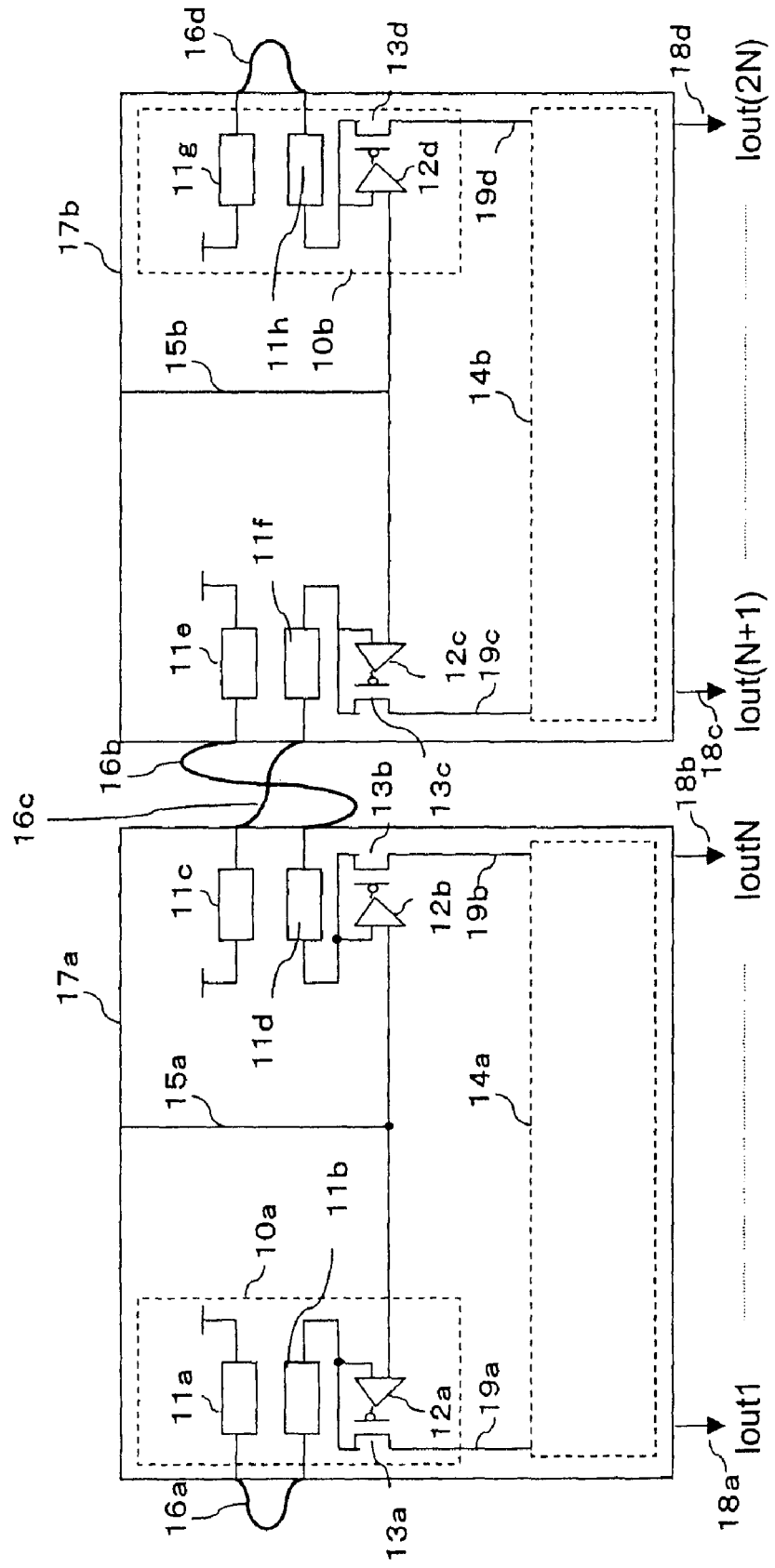
FIG. 1 is a diagram showing an external connection wire bound at the time when plural reference current generation units of driver ICs are used in an embodiment of the present invention.
Figure 2:
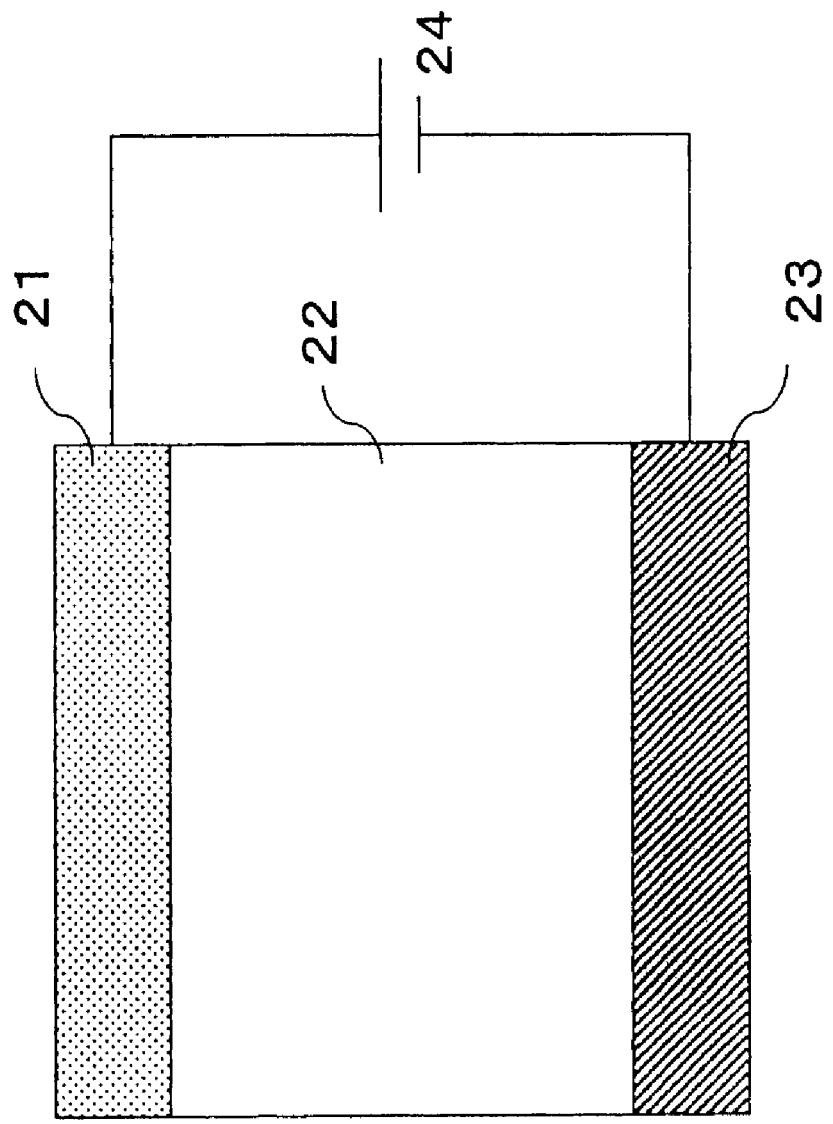
FIG. 2 is a diagram showing a structure of an organic luminance element.
Figure 3:
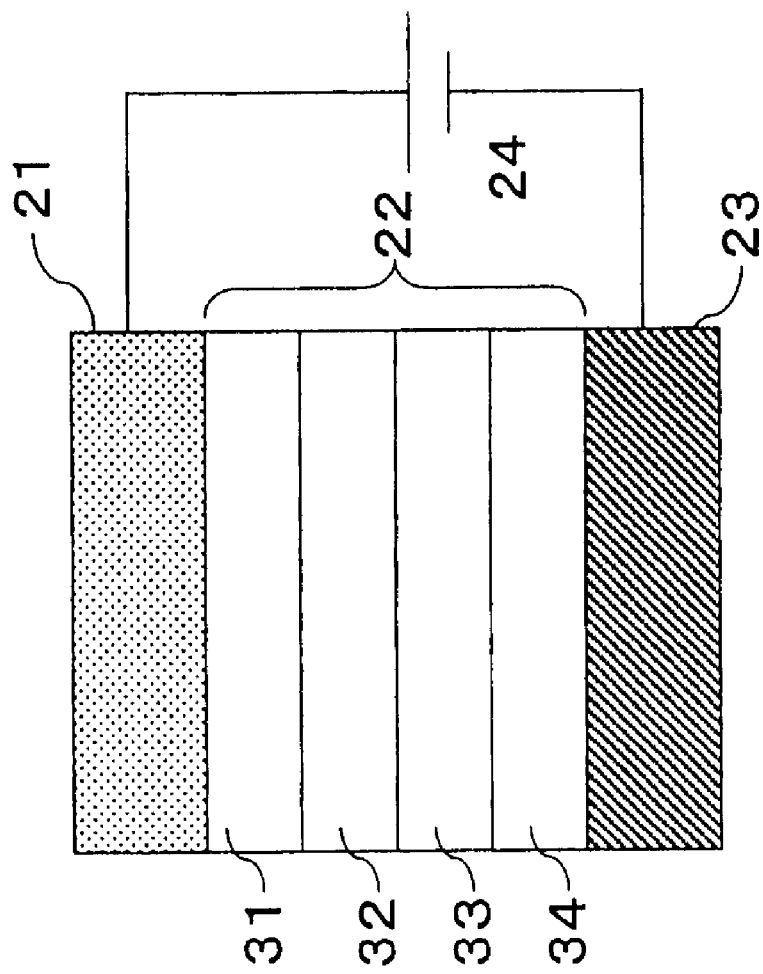
FIG. 3 is a diagram showing a structure of an organic luminance element in which plural organic layers are present.
Figure 4:
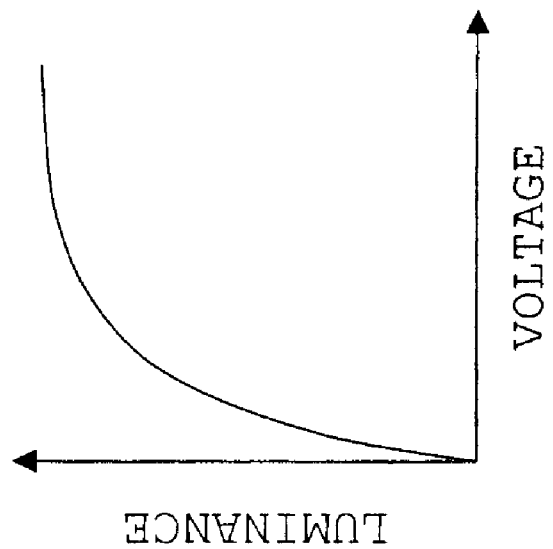
FIG. 4 is a diagram showing a current-voltage-luminance characteristic of an organic luminance element.
Figure 4:
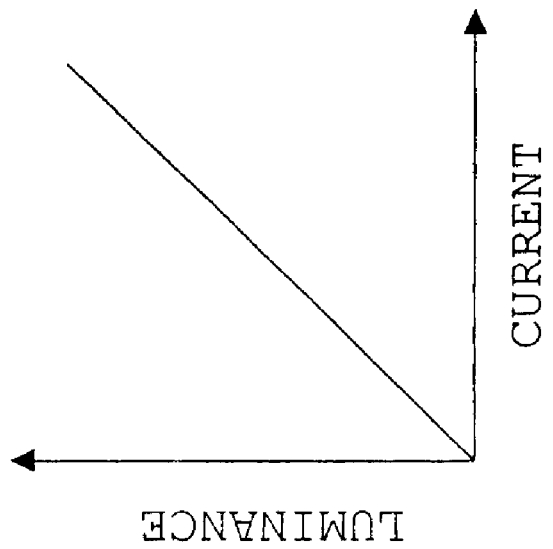
Figure 5:
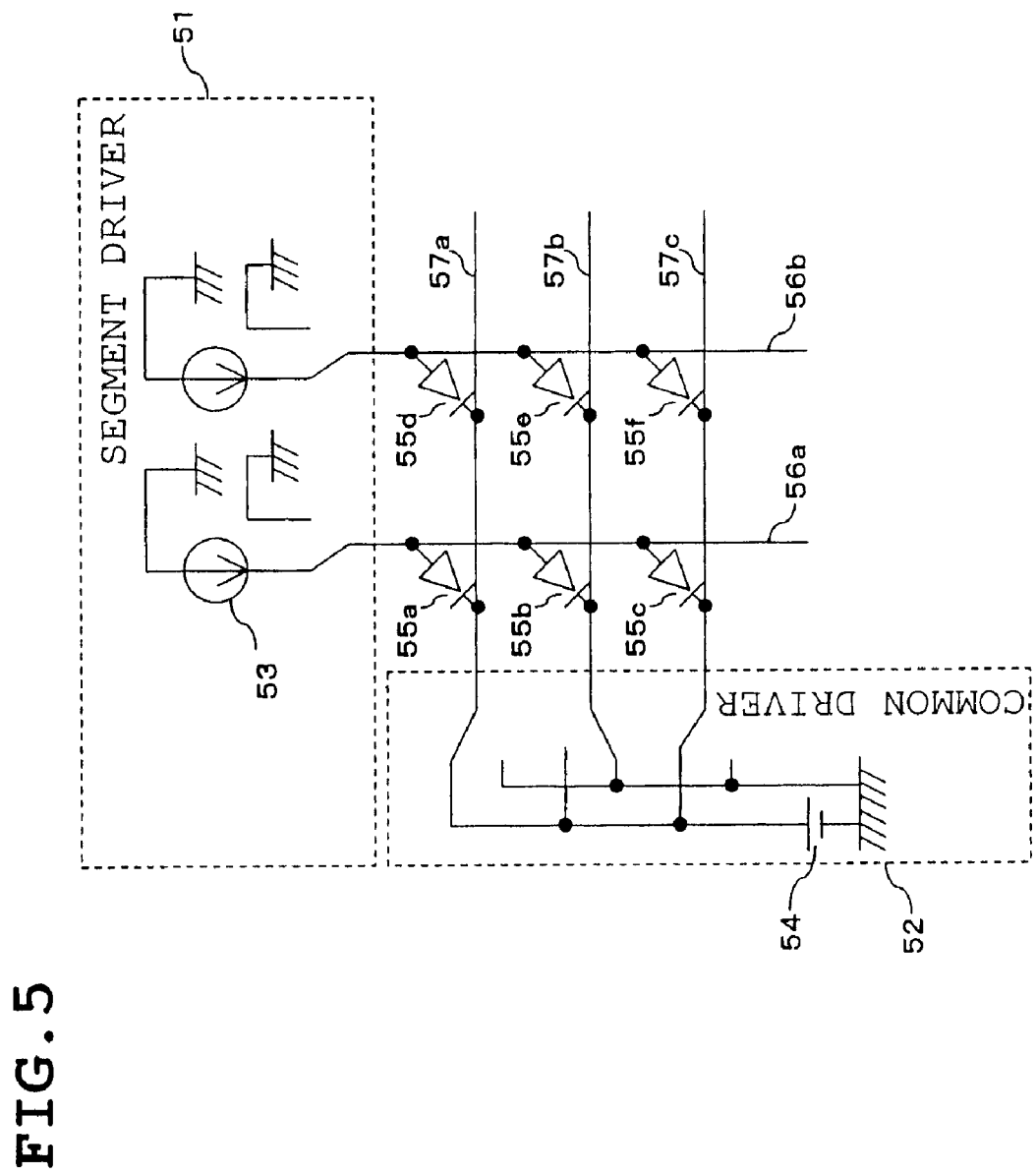
FIG. 5 is a diagram showing a passive matrix type display device using organic luminance elements.
Figure 6:
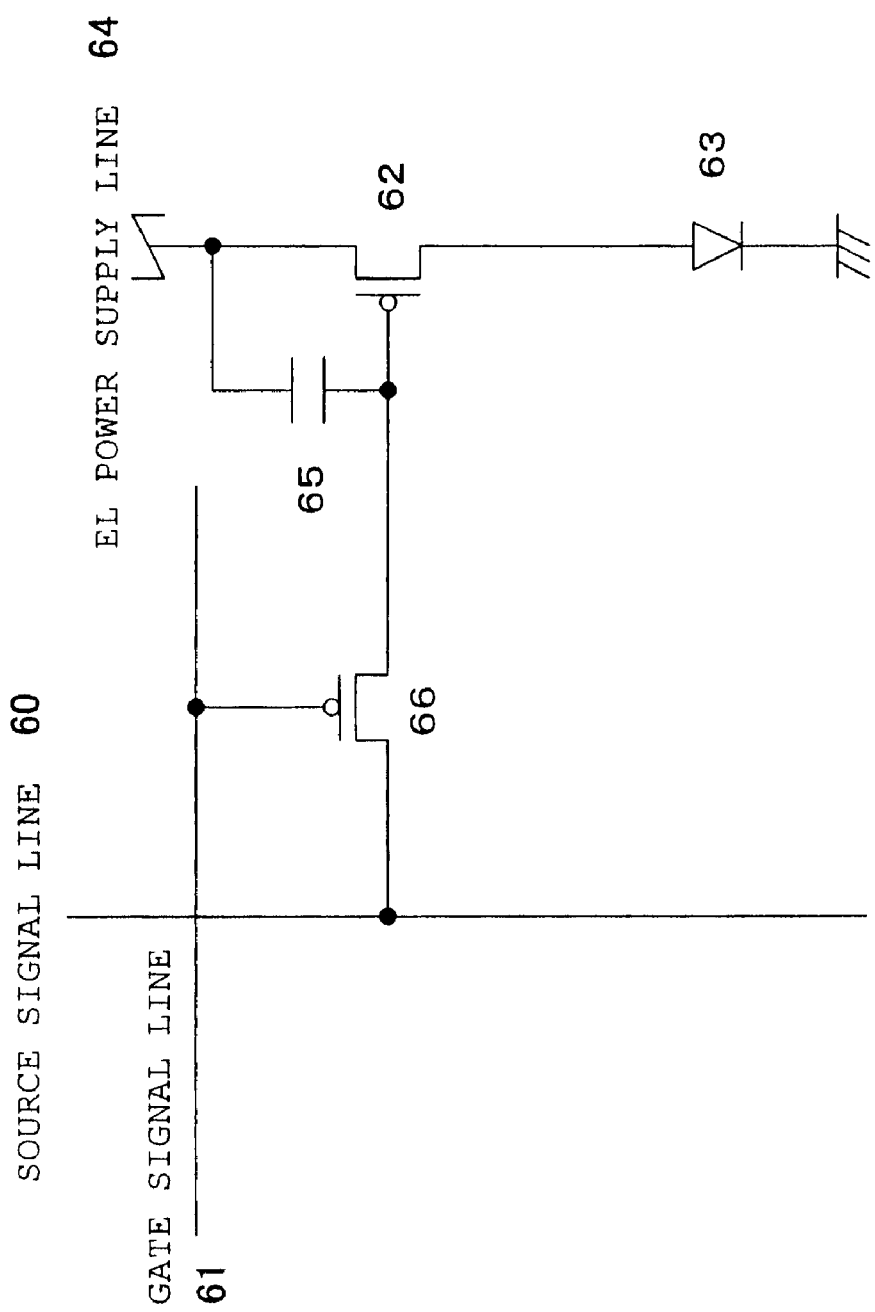
FIG. 6 is a diagram showing an example of a pixel circuit for one pixel in an active matrix type display device using organic luminance elements.

10 Reference current generation unit
11 Resistance element
12 Operational amplifier
13 Transistor
14 Current output stage
15 Reference voltage signal line
16 External wiring
17 Driver IC
18 Current output
19 Reference current line

BEST MODE FOR CARRYING OUT THE INVENTION

Embodiments of the present invention will be hereinafter described with reference to the drawings.

Figure 23:
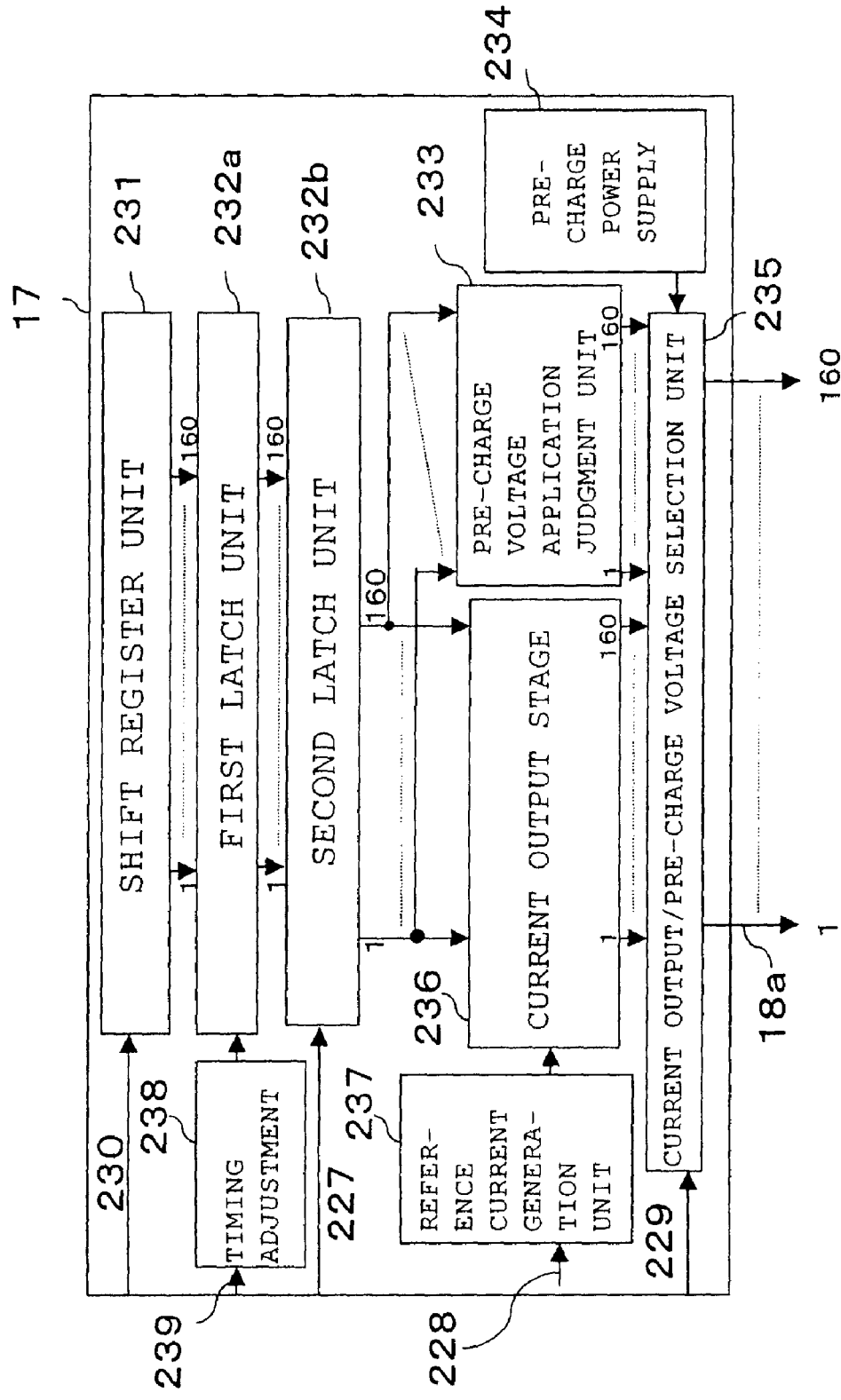
FIG. 23 is a circuit block diagram of a driver IC in the embodiment of the present invention.

A structure of a current output type source driver IC 17 in an embodiment of the present invention is shown in FIG. 23. In this example, the current output type source driver IC 17 is a driver with the number of stages of a shift register of 160 and having 160 outputs. Since the number of outputs can be realized simply by increasing and reducing the numbers of shift registers 231, latch units 232, current output stages 236, pre-charge voltage application judgment units 233, and current output/pre-charge voltage selection units 235, which are required for one output, according to an increase and a decrease of the number of outputs, it is possible to cope with an arbitrary number of outputs. However, if the number of outputs increases, since a chip size becomes too large and general versatility is lost, about 600 is the maximum practically.

In the structure of FIG. 23, an input of a video signal 239 is distributed to each output terminal by the shift register unit 231 and two latch units 232. The distributed video signal is inputted to the current output stage 236 and the pre-charge voltage application judgment unit 233. In the current output stage 236, a current value corresponding to a gradation is outputted from the video signal and a reference current which is generated by the reference current generation unit 237. On the other hand, in the pre-charge voltage application judgment unit 233, a signal is generated for judging by the video signal whether a current corresponding to a gradation is outputted or a pre-charge voltage is outputted. A current or a voltage is outputted to the outside of the drive IC 17 via the current-output/pre-charge-voltage-selection-unit 235 which selects according to the output signal of the pre-charge voltage application judgment unit 233 whether to output a current according to the graduation or to supply a voltage from the pre-charge power supply 234.

The voltage outputted from the pre-charge power supply 234 turns into a voltage value necessary for displaying black on a display panel. A method of applying this pre-charge voltage is a configuration peculiar to the driver IC 17 of performing gradation display on an active matrix type display device according to a current output. Note that, in a driver IC for a passive matrix, the pre-charge voltage application judgment unit 233, the pre-charge power supply 234, and the current output/pre-charge voltage selection unit 235 are unnecessary.

Figure 7:
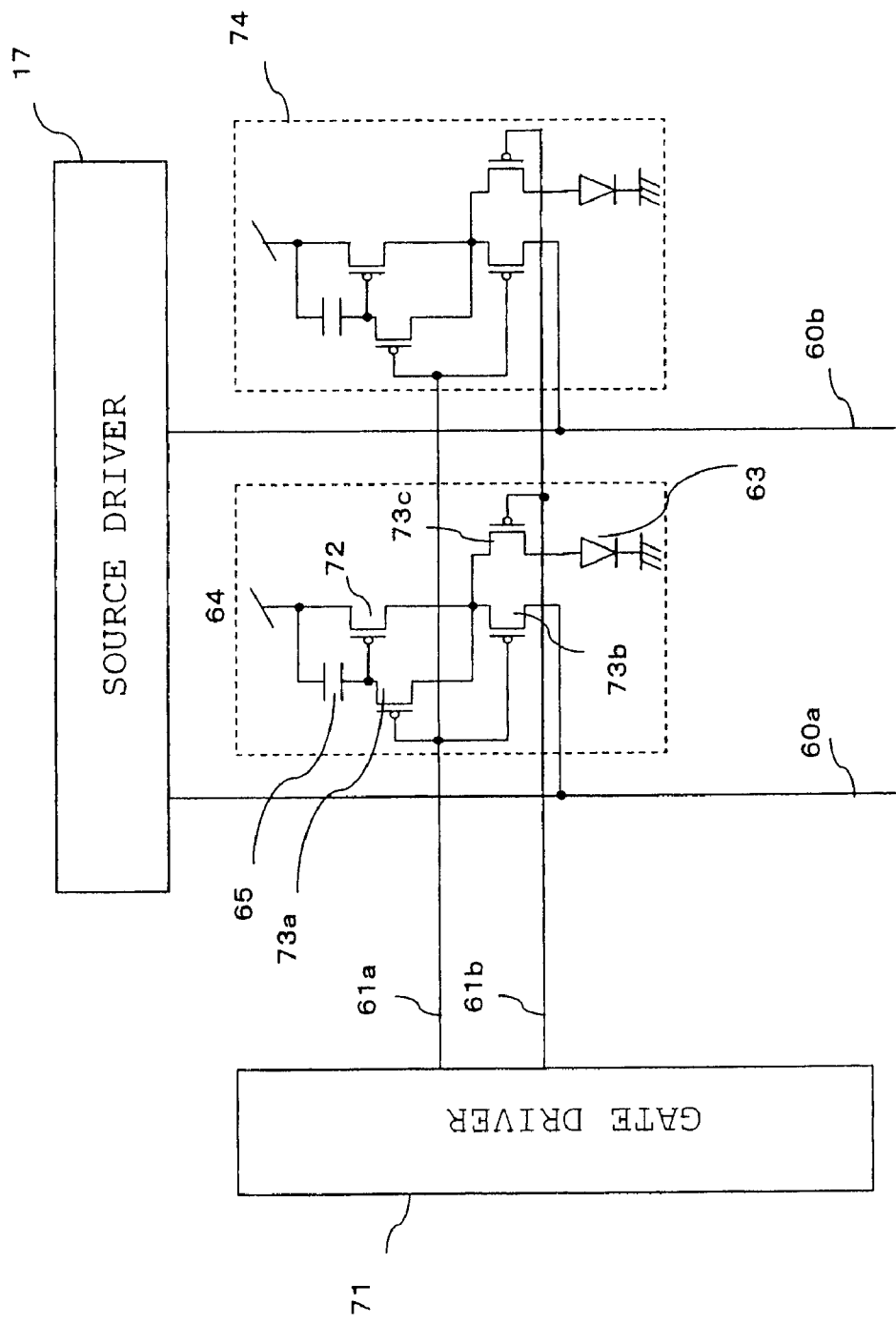
FIG. 7 is a diagram showing a circuit of an active matrix type display device using a pixel circuit of a current copier structure.
Figure 9:
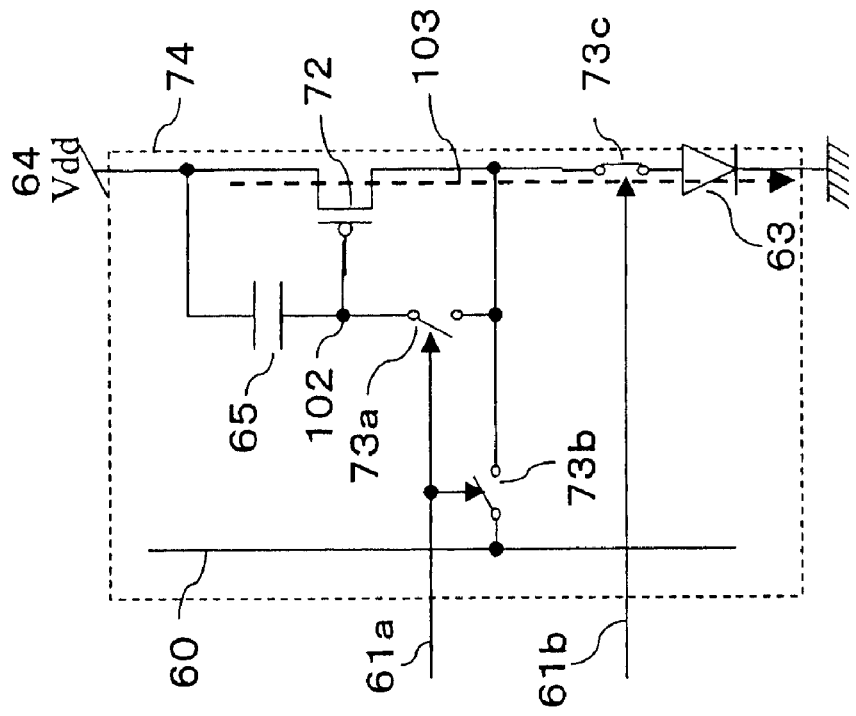
FIG. 9 is a diagram showing an operation of a current copier circuit.
Figure 9:
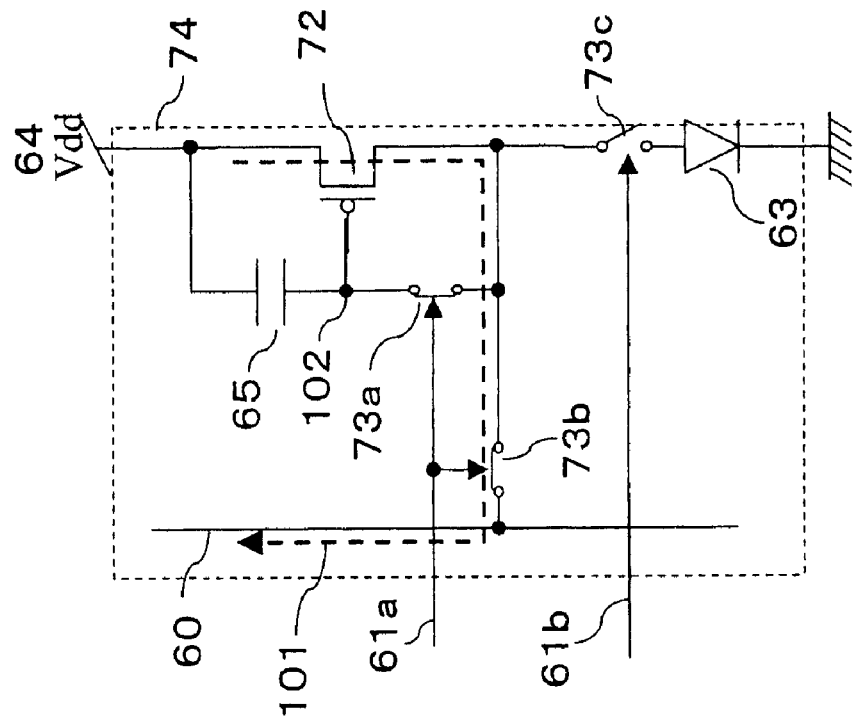
Figure 10:
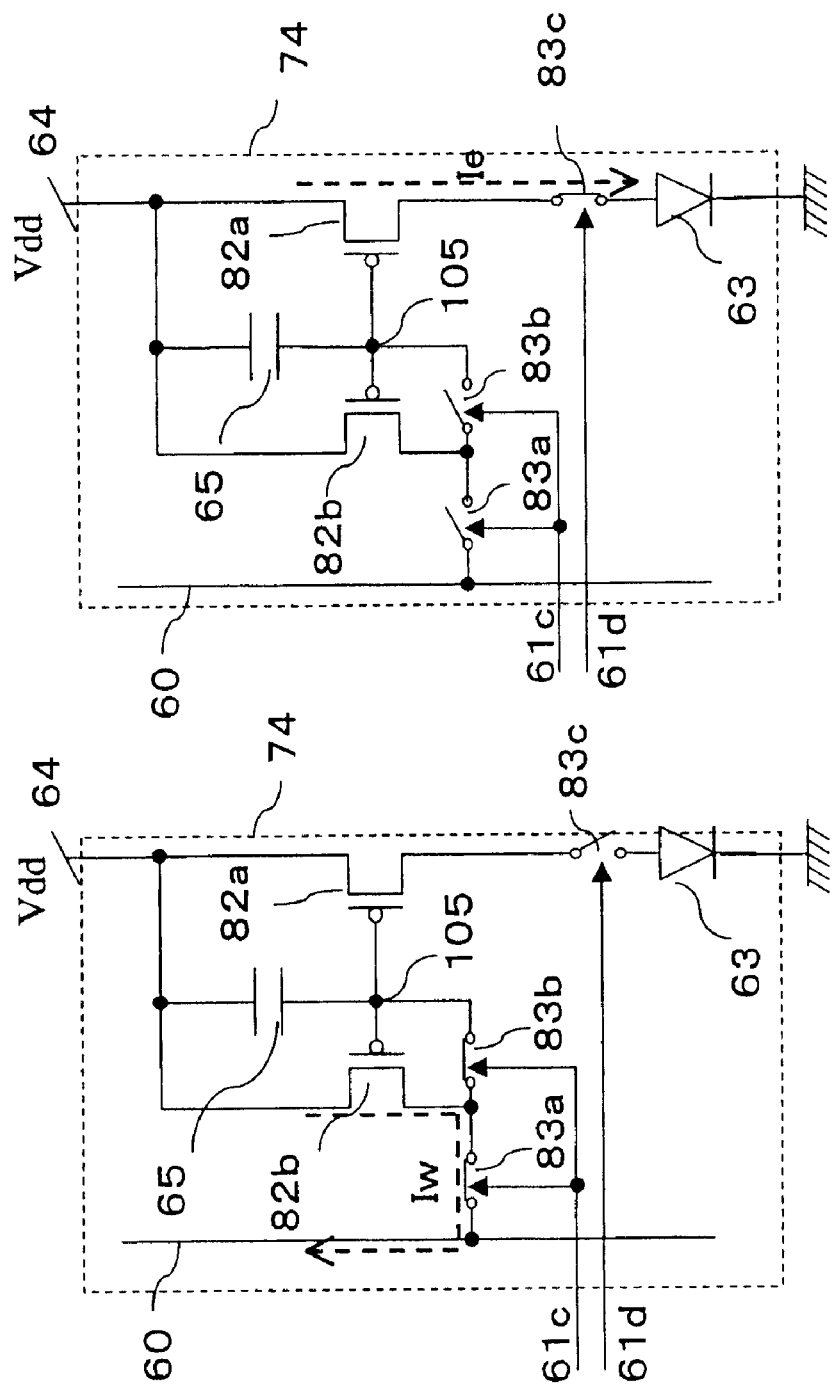
FIG. 10 is a diagram showing an operation of a current mirror circuit.
Figure 24:
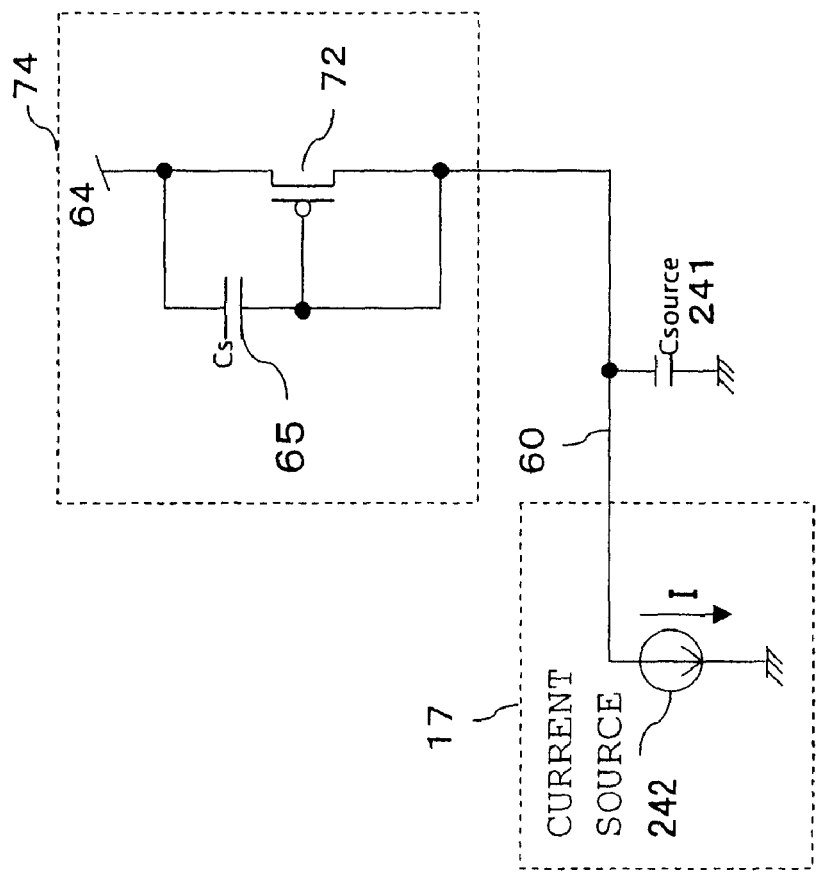
FIG. 24 is a diagram showing an equivalent circuit at the time when a source signal line current flows to a pixel in a pixel circuit of a current copier structure.
Figure 24:
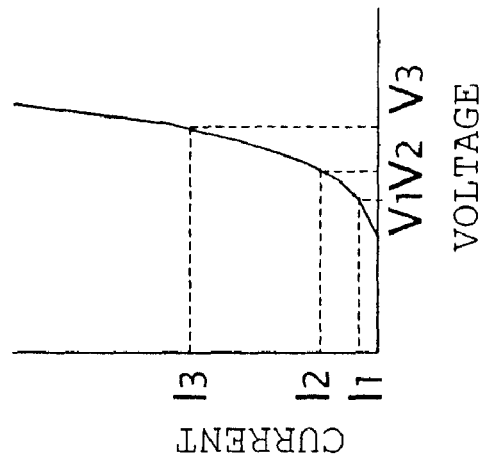

For example, a case in which a predetermined current value is written in a certain pixel from a source signal line in an active matrix type display device of a pixel structure shown in FIG. 7 will be considered. An equivalent circuit of one pixel in this case is as shown in FIG. 9(*a*), and an extracted circuit relating to a current path from the output stage of the source driver IC 17 to the pixel in the case in which a pre-charge circuit is not present is as shown in FIG. 24(*a*).

A current I corresponding to a gradation flows from the inside of the driver IC 17 as a lead-in current in a form of a current source 242. This current is taken into the inside of the pixel 74 through a source signal line 60. The taken-in current flows through the drive transistor 72. In other words, the current I flows to the source driver IC 17 from the EL power supply line 64 via the drive transistor 72 and the source signal line 60 in the selected pixel 74.

When a video signal changes and a current value of the current source 242 changes, a current flowing to the drive transistor 72 and the source signal line 60 also changes. At that point, a voltage of the source signal line changes according to a current-voltage characteristic of the drive transistor 72. In the case in which the current-voltage characteristic of the drive transistor 72 is FIG. 24(*b*), for example, when it is assumed that a current value flown by the current source 242 has changed from I2 to I1, a voltage of the source signal line changes from V2 to V1. This change in the voltage is caused by the current of the current source 242.

A stray capacitor 241 is present in the source signal line 60. In order to change the source signal line voltage from V2 to V1, it is necessary to draw a charge of this stray capacitor. A time $\Delta T$ required for this drawing is $\Delta Q$ (the charge of the stray capacitor)=I (a current flowing to the source signal line)$\times \Delta T$=C (a stray capacitance value)$\times \Delta V$. Here, when it is assumed that $\Delta V$ (a signal line amplitude in a black display time from a white display time) is 5[V], C=10 pF, and I=10 nA, $\Delta T$=50 millisecond is required. This means that, since the time is longer than one horizontal scanning period (75 μsec) at the time when QCIF+size (the number of pixels 176×220) is driven at a frame frequency of 60 Hz, if it is attempted to perform black display on a pixel below a white display pixel, switch transistors 73*a* and 73*b* of writing a current in a pixel close while a source signal line current is changing, and therefore halftones are memorized in the pixel, whereby the pixel glistens at luminance between white and black.

A value of I decreases as a gradation becomes lower, and it becomes difficult to draw the charge of the stray capacitor 241, there is a problem in that a signal before the luminance changes to a predetermined luminance is written inside the pixel. This problem occurs more conspicuously in display of a lower gradation. To put it in an extreme way, a current of the current source 242 at the time of black display is 0, and it is impossible to draw the charge of the stray capacitor 241 without flowing a current.

Therefore, a structure in which a voltage source with an impedance lower than that of the current source 242 is prepared to apply the voltage source to the source signal line 60 as required is adopted. This voltage source is equivalent to the pre-charge power supply 234 of FIG. 23, and a mechanism for allowing application of the voltage source is 235.

Figure 25:
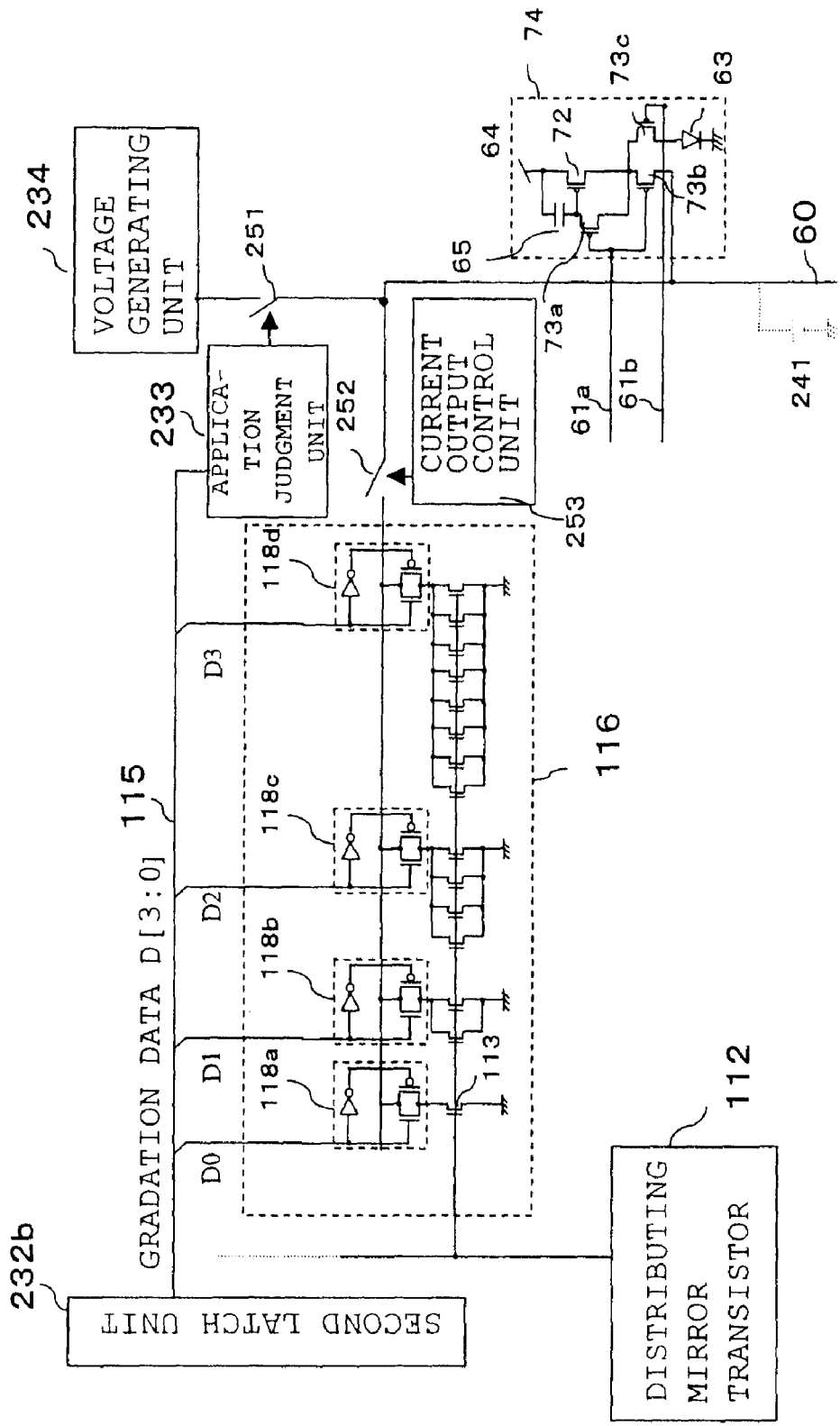
FIG. 25 is a diagram showing a relation among a current output at one output terminal, a pre-charge voltage application unit, and a change over switch.

A schematic circuit with respect to one source signal line 60 is shown in FIG. 25. A voltage supplied from the voltage generation unit 234 is applied to the source signal line 60, whereby the charge of the stray capacitor 241 can be charged and discharged. As the voltage supplied from the voltage generation unit 234, a voltage corresponding to each gradation current may be supplied according to the characteristics of FIG. 24(*b*). However, a circuit size increases because a digital/analog conversion unit corresponding to the gradation data 115 is required also in the voltage generation circuit, and the drive transistor 72 has fluctuation in characteristics for each pixel, therefore, the corresponding voltage is different with respect to an identical gradation current. Therefore, even if a voltage corresponding to a gradation is outputted by providing the digital/analog conversion unit, a predetermined current is not written, and it is necessary to correct a current to the predetermined current with the current source 116 after that.

Consequently, it can be said that it is practically sufficient in terms of cost (chip area) versus effect to generate only a voltage corresponding to a black gradation, for which it is most difficult to write a current value, as the voltage to be generated in the voltage generation unit 234.

Figure 81:
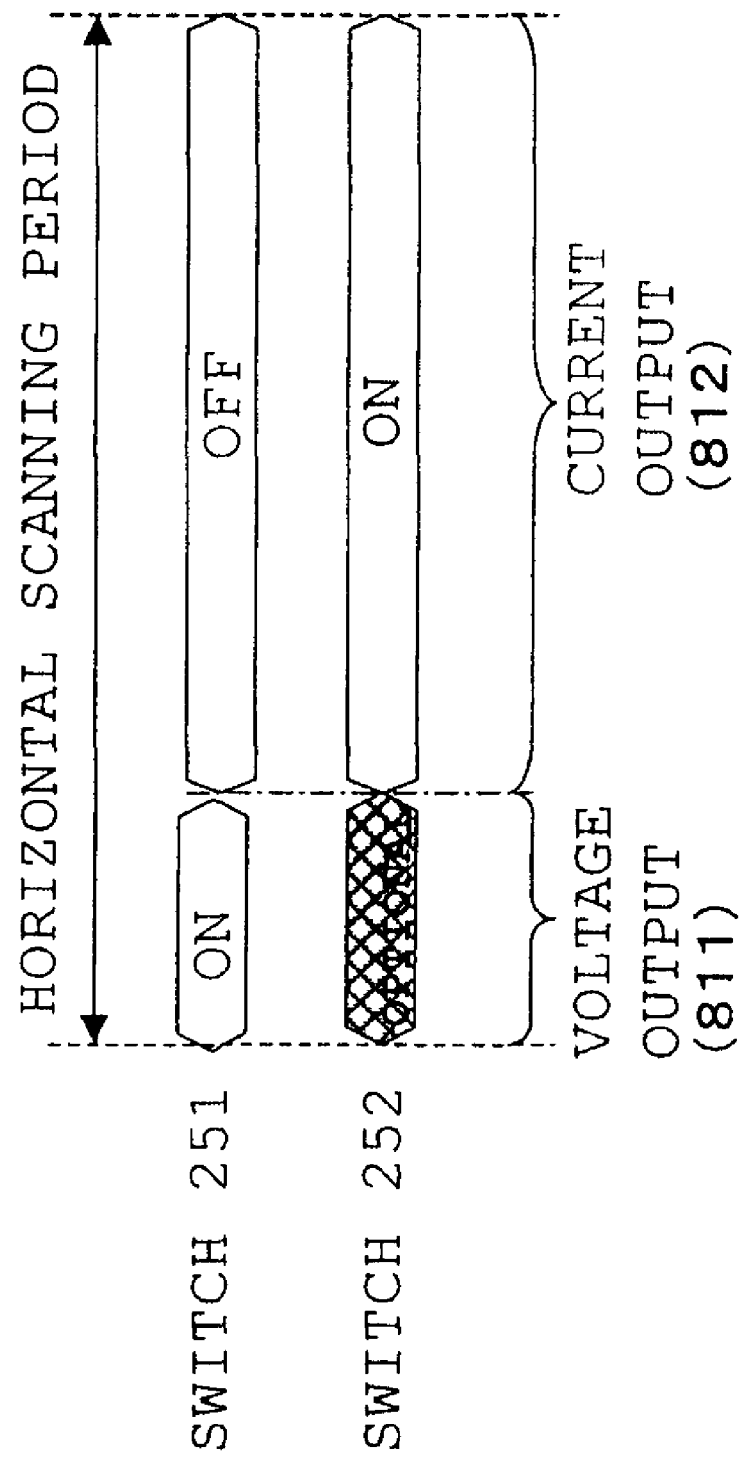
FIG. 81 is a diagram showing a relation between a period in which a pre-charge voltage is applied within one horizontal scanning period and a period in which a current based upon gradation data is outputted.

Operation timing within one horizontal scanning period of the switches 251 and 252 is shown in FIG. 81. At the beginning of the horizontal scanning period, a pre-charge voltage from the voltage generation unit 234 is applied in order to reset the charge of the stray capacitor 241 (a period 811). Since the charge is reset by a voltage, the object is attained even if this period is short. Thus, this period only has to be about 2 μsec at the maximum. Next, in a period 822, only the switch 252 is brought into a conduction state to supply a current corresponding to a gradation to the pixel 74. Note that since an operation for writing a predetermined current value in the period 822 is slow, and it is desired to secure the period 822 as long as possible, it is necessary to limit the period 811 to about 10% of a maximum one horizontal scanning period.

Moreover, by using an output of the pre-charge voltage application judgment unit 233 as a control mechanism for the switch 251, it becomes possible to select whether or not a pre-charge voltage is inputted according to a value of input gradation data (select pre-charge function).

Since the voltage value to be outputted from the voltage generation unit 234 is only the voltage corresponding to the current at the time of a black gradation (hereinafter referred to as black voltage), for example, in the case in which it is assumed that the gradation data 115 displays a white gradation for continuous plural horizontal scanning periods, a source signal line repeats black, white, black, and white states. If pre-charge is not performed, the white state occurs continuously. In other words, on the contrary, by performing pre-charge, a change in a signal line is intensified, and in addition, it is likely that display is not fully white depending upon a current at the time of white display, and insufficiency of a writing current is caused.

Thus, it is sufficient to use the pre-charge judgment unit 233 such that pre-charge is not performed in a gradation for which a relative large amount of current flows and only a gradation, for which a current hardly changes to a predetermined current, near the black gradation is assisted by the pre-charge power supply 234. For this purpose, the pre-charge voltage application judgment unit 233 is provided in each output such that an operation of the switch 251 can be changed according to a value of the gradation data 115. It is most effective that a judgment output has a period in which a pre-charge voltage is inputted only at the time when a gradation is 0 (black), and a pre-charge voltage is not inputted at the time of display in other gradations. By setting luminance at the time of a lowest gradation to be low, contrast increases, and it becomes possible to display a more beautiful picture.

In an organic luminance element which is used as a display element, since an element structure is different for each luminescent color, and a carrier injection efficiency, carrier mobility, a quantum effect of a phosphor, and the like vary, it is likely that a luminescence start current varies for each luminescent color.

Figure 26:
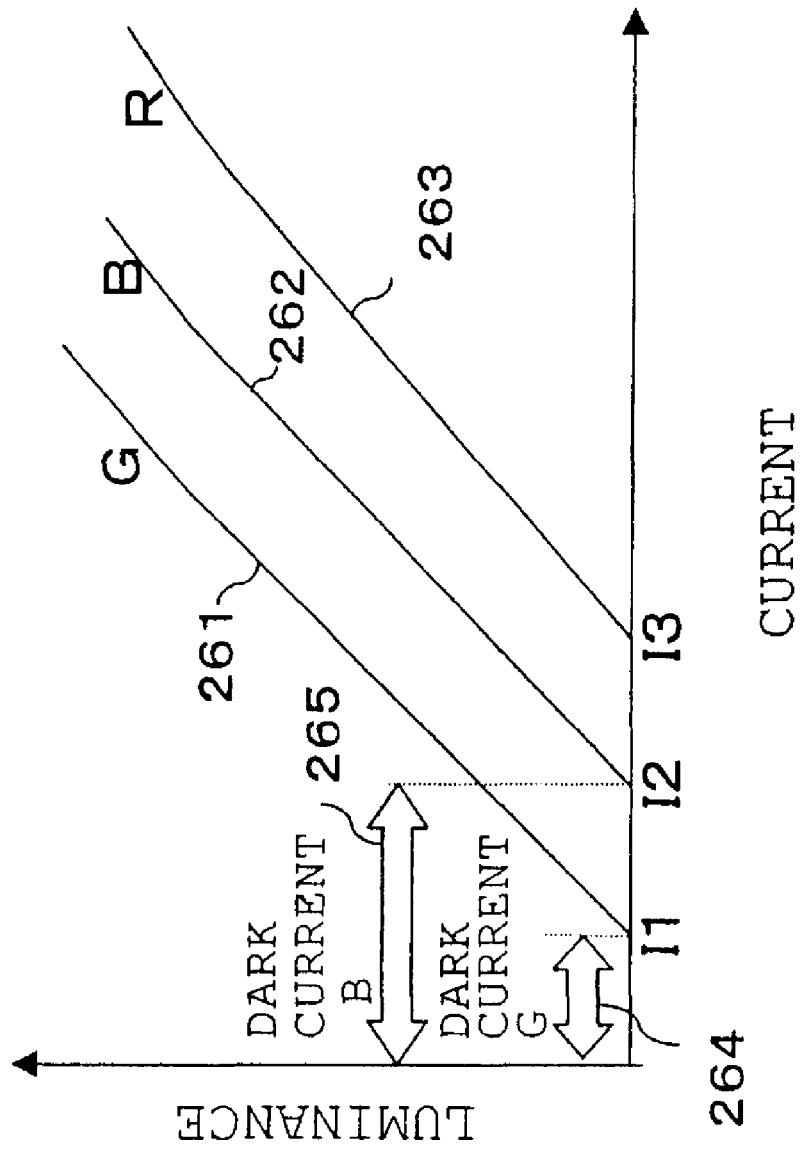
FIG. 26 is a diagram showing a difference of a luminance to current characteristic according to a luminescent color.

An example is shown in straight lines 261 to 263 indicating correspondence of a current and luminance of FIG. 26. Green, blue, and red emit light when a current of I1 or more, I2 or more, and I3 or more is flown, respectively. Then, even if it is assumed that there is no fluctuation in the drive transistor 72 of the pixel 74, a black voltage varies from V1 to V3 for each display color as shown in FIG. 24(b). Since a longer time is required until a current changes to a predetermined current as the current becomes lower, if it is attempted to set a pre-charge voltage with one power supply, the entire voltage of V1 is applied to all elements.

In this way, although black floating blurry glistening at the time of black display is eliminated, when it is attempted to display white next time, it is necessary to change a voltage more in a red display pixel by a voltage of (V3−V1) compared with the case in which there is no pre-charge. Therefore, when white display is performed next time, a problem occurs in that the color changes to white less easily by a degree of increased voltage change.

Figure 27:
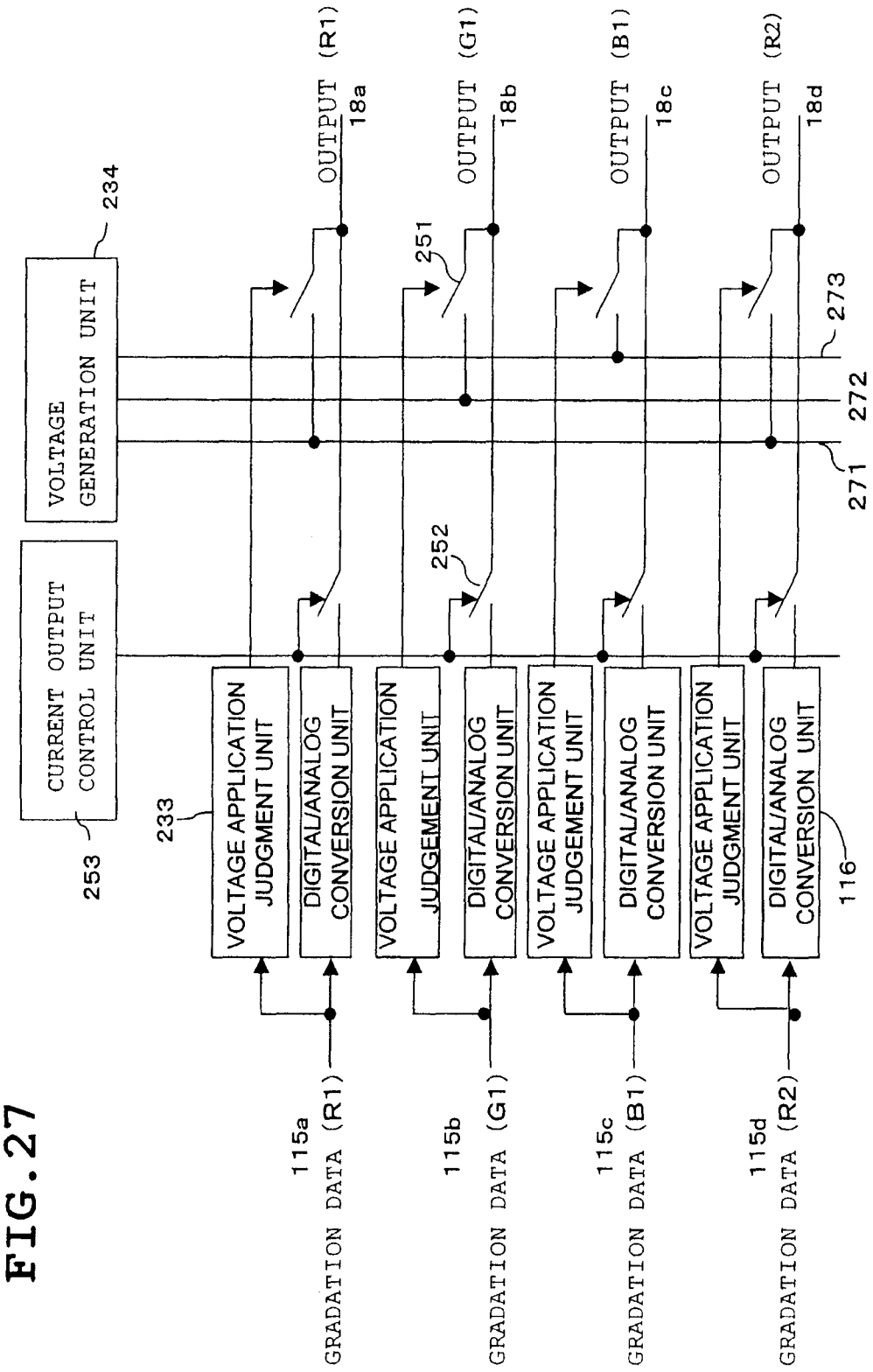
FIG. 27 is a diagram showing a circuit block which can output a pre-charge voltage different for each display color.

Thus, the pre-charge power supply 234 is provided separately for each display color. A block diagram is shown in FIG. 27. Here, a description will be made assuming that R, G, and B are outputs to red, green, and blue luminance elements, respectively. Note that display colors may be three colors of cyan, yellow, and magenta rather than three primary colors of red, green, and blue.

Three outputs of the voltage generation unit 234 are provided. Output 271, 272, and 273 perform outputs to source signal lines of R, G, and B, respectively. In this case, an output voltage of 271 is set so as to be substantially equal to a voltage of the source signal line 60 at the time when the drive transistor 72 of the pixel 74 flows the current of I3. The outputs 272 and 273 only have to output values substantially equal to voltages of the source signal line 60 at the time when the currents of I1 and I2 flow to the pixel transistor 72, respectively. Consequently, a proper voltage value can be directly applied to a pixel for each display color.

Therefore, a source signal line potential to be changed at the time of current output may be low, it is possible to change a current to a predetermined current value in a shorter time, and a structure in which insufficiency of writing occurs less easily is obtained.

Incidentally, in a pattern in which there is no change in a source signal line such as black display on the entire screen, if a pre-charge voltage is applied only at the beginning of one frame, thereafter, a predetermined gradation flows sufficiently only with black current.

That is, even at the time of same black display, a time during which a current changes to a predetermined current value only with the current is different depending upon a current value flown to the source signal line in the previous horizontal scanning period, and as an amount of change increases, the change takes longer time. For example, although it takes time to perform black display after white display, in the case in which black display is performed after black display, since a change in a signal line is only a change by fluctuation in the drive transistor 72, a time required for the change is short.

Thus, a signal for judging whether or not to apply a pre-charge voltage (pre-charge judgment signal 281) in synchronization with gradation data 239 is introduced for each color, whereby it is also possible to implement a structure in which presence or absence of pre-charge can be selected in an arbitrary gradation or in an identical gradation.

Figure 28:
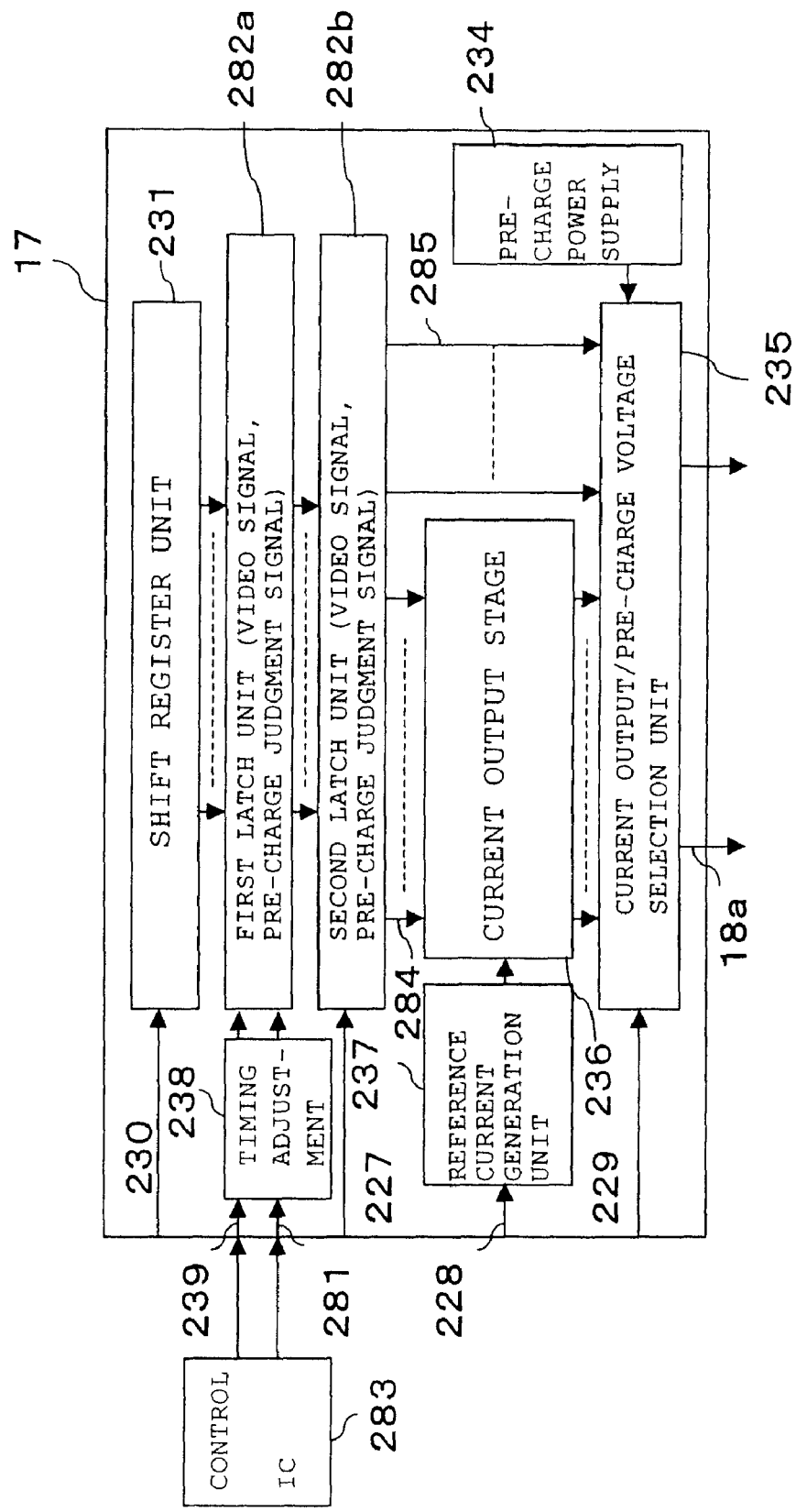
FIG. 28 is a block diagram of a driver IC at the time when it can be selected from the outside whether pre-charge is performed for each video signal for one dot.

A structure of the driver IC 17 in this case is shown in FIG. 28. The pre-charge judgment signal 281 is applied to the gradation data 239. Following this, since latch units 282 are also required to latch a pre-charge judgment signal, latch units of the number equivalent to the number of video signal bits+one bit are provided.

Whether a pre-charge voltage is applied or a current corresponding to a gradation is outputted is determined by the current output/pre-charge voltage selection unit 235 according to a pre-charge judgment signal line 285 and a pre-charge ON/OFF signal 229. When both of pre-charge ON/OFF signal 229 and a signal sent on the pre-charge judgment signal line 285 allow to perform pre-charge are inputted, a voltage supplied from the pre-charge power supply 234 is outputted to 18. In other periods, a current from a current output stage is outputted to 18.

Figure 29A:
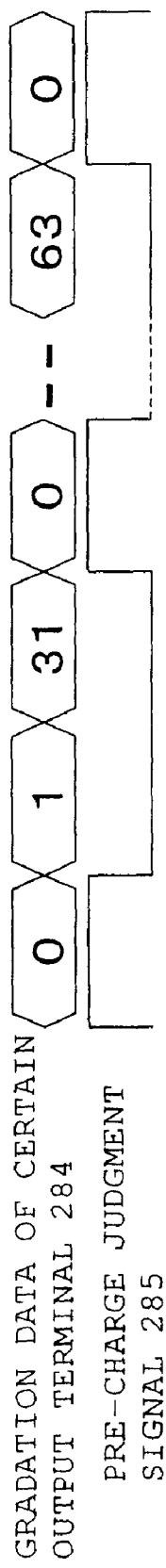
FIG. 29 is a diagram showing a relation between gradation data and a pre-charge judgment signal.
Figure 29B:
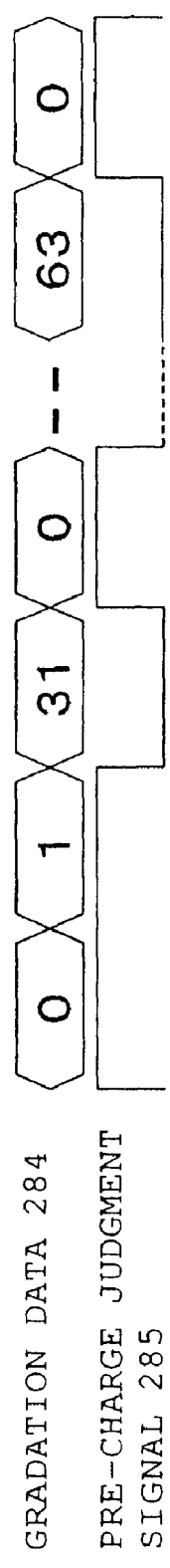
Figure 29C:
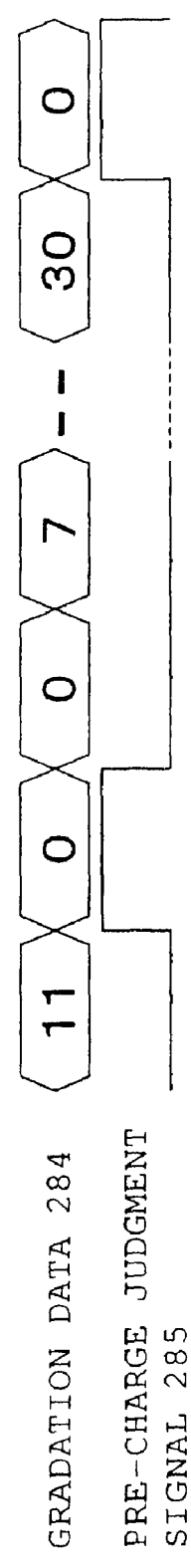

For example, FIG. 29(a) shows an example in which pre-charge is inputted when a gradation is 0, FIG. 29(b) shows an example in which pre-charge is inputted when a gradation is 0 and 1, and FIG. 29(c) shows a case in which pre-charge is inputted when a gradation is 0 and when a gradation in the previous period is not 0 (pre-charge is performed when a gradation is 0 but, even if a gradation is 0, pre-charge is not performed if it continues).

This method has an advantage that, unlike the method mentioned above, it can be selected whether or not pre-charge is performed according to a state of a source signal line of one horizontal scanning period earlier even in an identical gradation.

Note that this pre-charge judgment signal is supplied from a control IC 283. According to a command operation of the control IC 283, the pre-charge judgment signal 281 can be outputted with a pattern thereof changed as shown in FIGS. 29(a) to (c).

It is possible to change setting of pre-charge flexibly from the outside of the source driver IC 17 depending on a capacity of the source signal line or a length of one horizontal scanning period, and there is an advantage that general versatility increases.

Figure 11:
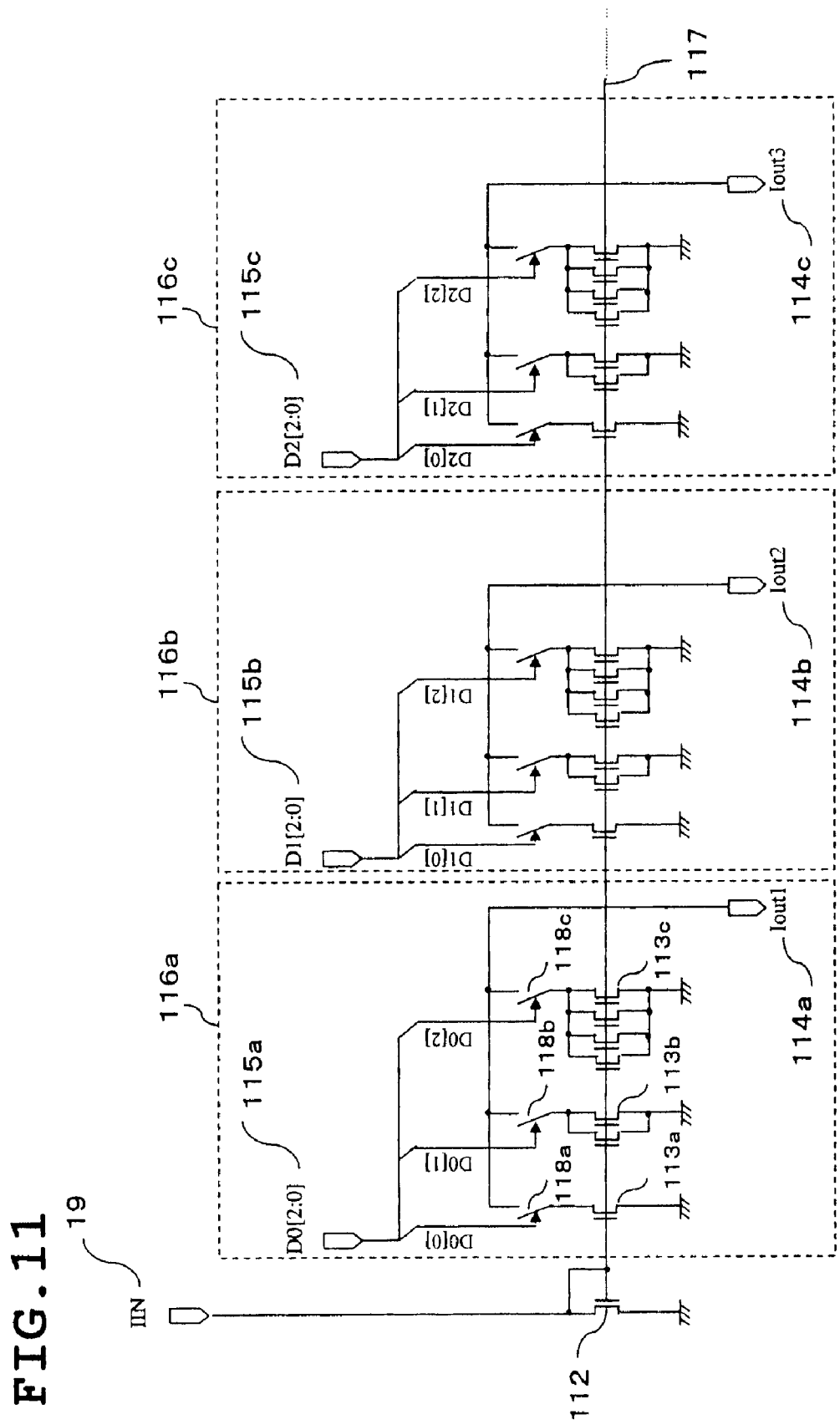
FIG. 11 is a diagram showing a circuit of outputting a current to each output of a current output type driver.
Figure 12:
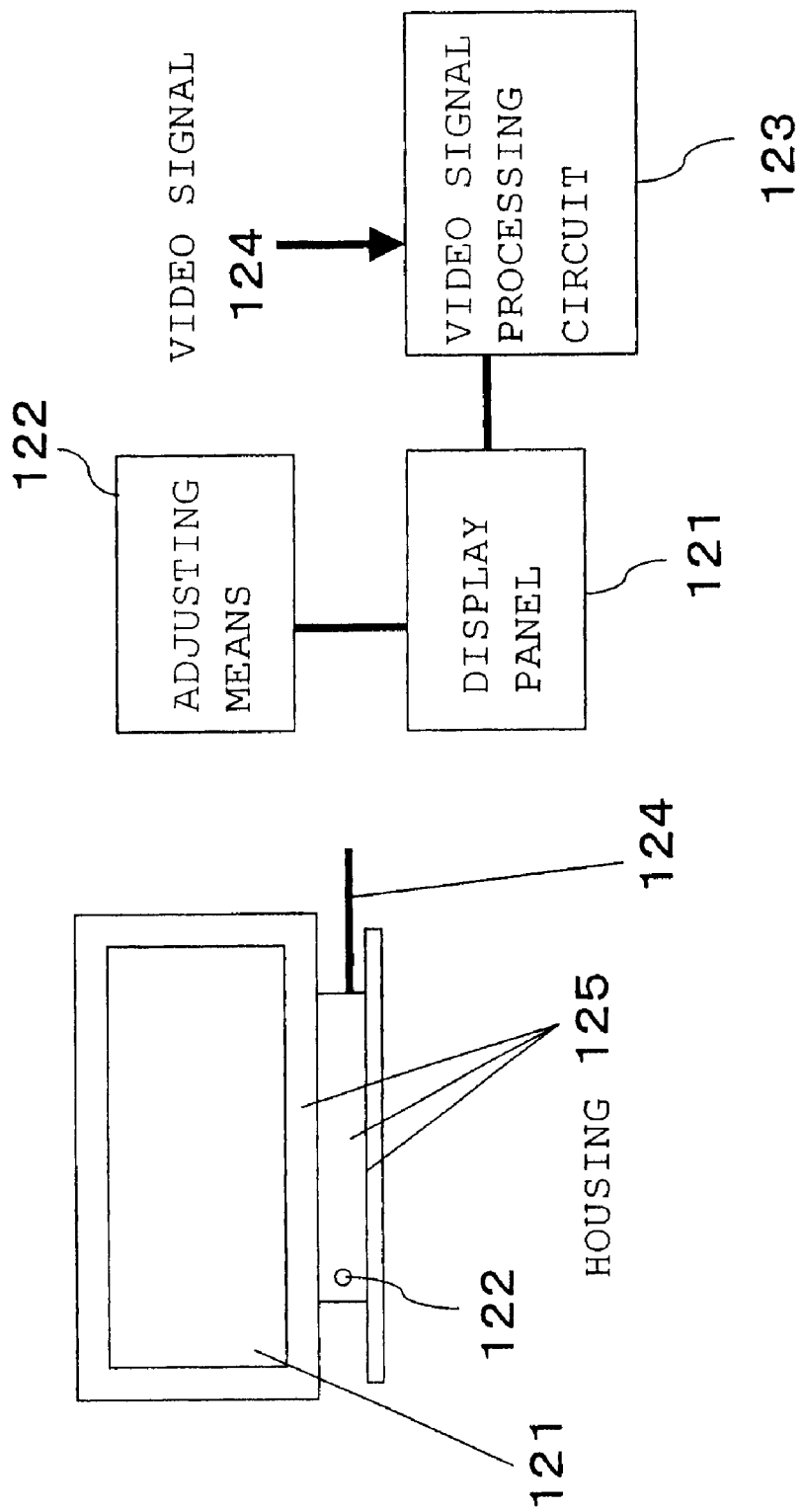
FIG. 12 is a diagram showing a case in which a display device using the embodiment of the present invention is applied to a television.
Figure 13:
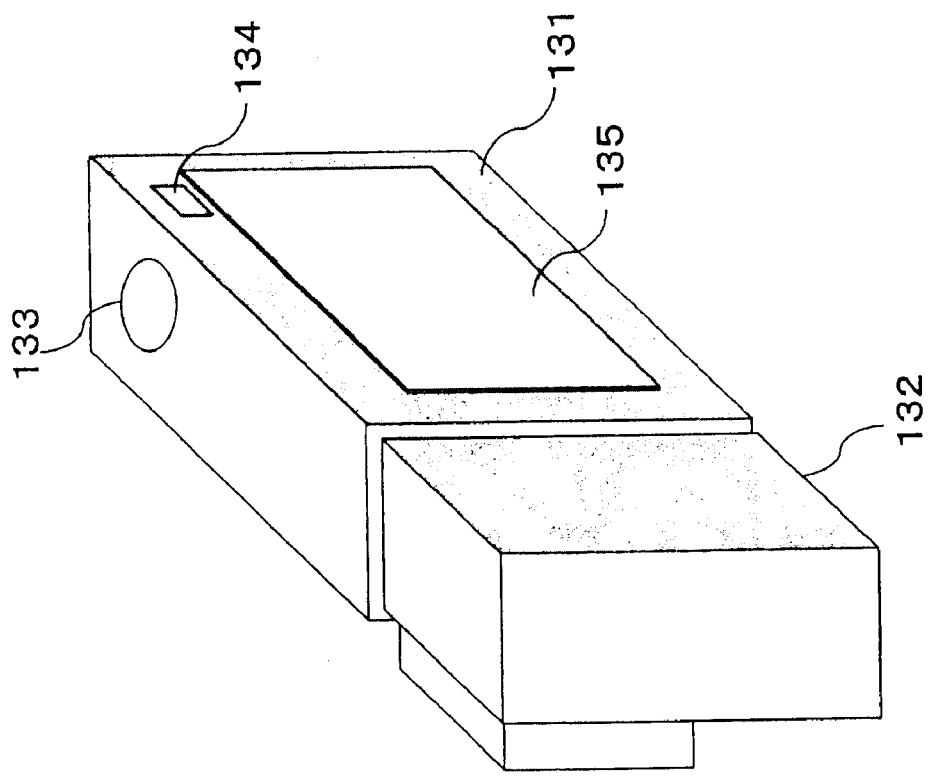
FIG. 13 is a diagram showing a case in which the display device using the embodiment of the present invention is applied to a digital camera.
Figure 30:
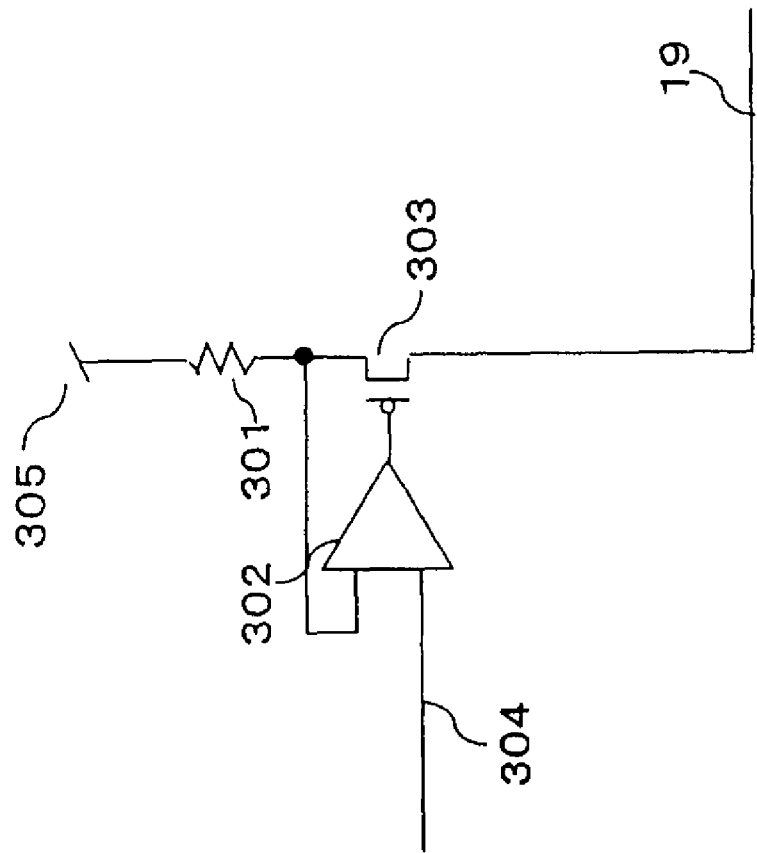
FIG. 30 is a diagram showing a circuit of a reference current generation unit.

FIG. 30 is a diagram showing a reference current generation circuit. A reference current defines a current value per one gradation in the structure of the output stage shown in FIG. 11. Therefore, unless fluctuation in the reference current 19 for each driver IC 17 is not small, block unevenness occurs in boundaries of ICs.

Thus, a structure of a reference current generation circuit subjected to feedback as shown in FIG. 30 is adopted. In this circuit, the reference current 19 is a value found by dividing a potential difference between a power supply 305 and a reference voltage signal line 304 by a resistance element 301. Fluctuation in the current 19 depends upon fluctuation in the resistance element 301 and an input deviation of an operational amplifier 302.

The fluctuation in the resistance element 301 can be controlled to about 0.5% if a commercially available chip resistance element is used.

On the other hand, an input deviation of the operational amplifier 302 is about 15 mV. Influence of an output deviation can be reduced by increasing a potential difference between both ends of a resistor compared with 15 mV. For example, if a structure in which a potential difference is 2 V or more is adopted, it becomes possible to control fluctuation due to an output deviation to 0.75% or less.

In this way, a current source, in which fluctuation in a reference current among the driver ICs 17 is controlled to 1% or less, is formed.

Figure 31:
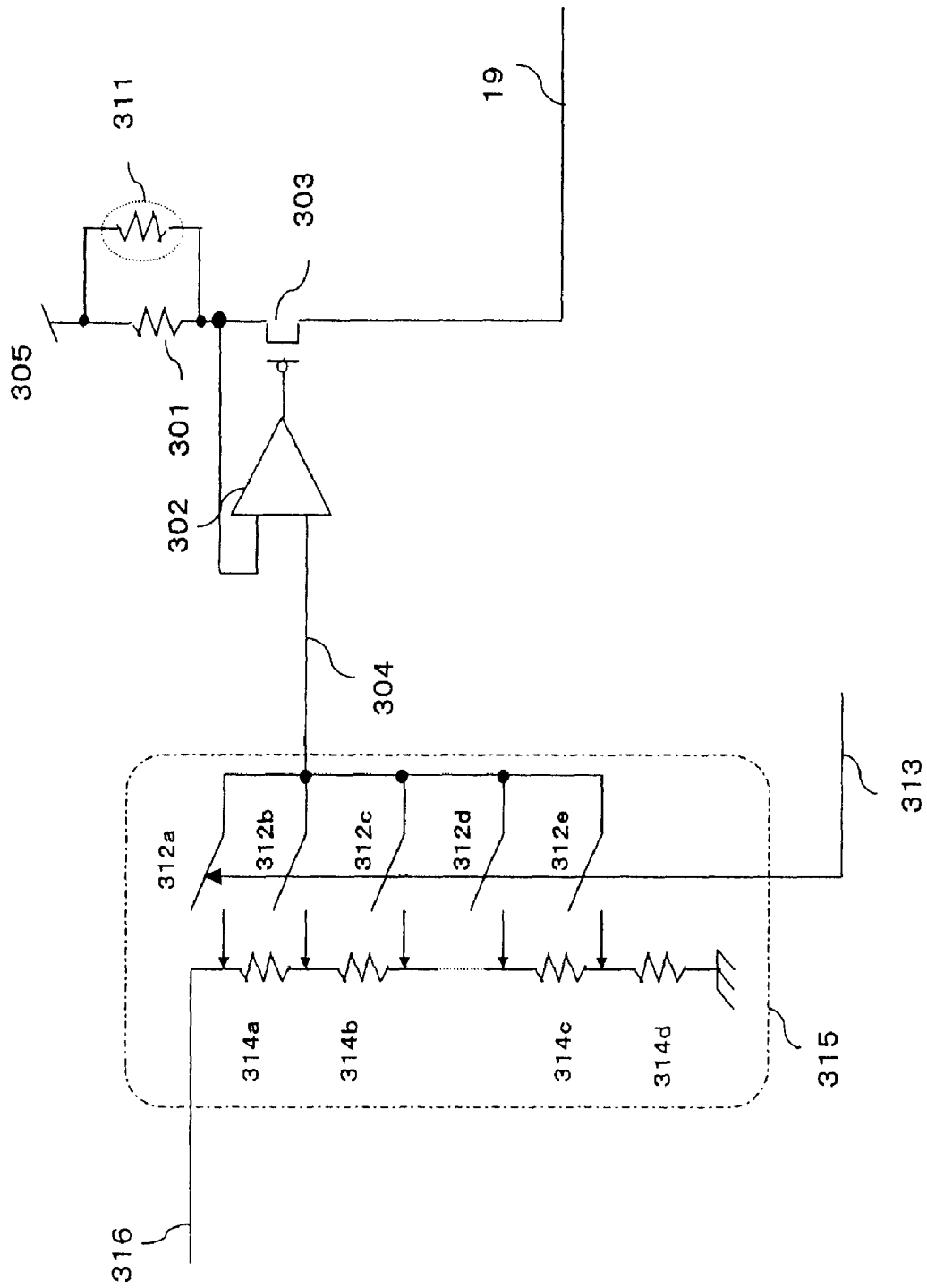
FIG. 31 is a diagram showing a reference current generation unit which can change a reference current to be generated according to control data.

Moreover, by adopting a structure as shown in FIG. 31, this power supply can compensate for a temperature characteristic and change a reference current value in a programmable manner.

As the compensation of a temperature characteristic, it becomes possible to change a reference current value by providing a temperature compensation element 311 in parallel with the resistance element 301 to change a resistance value according to temperature, and it is possible to compensate for a temperature characteristic of an organic luminance element. The organic luminance element slightly has temperature dependency in a current to luminance characteristic, and luminance decreases as temperature rises. Thus, if a combined resistance of 301 and 311 is reduced by the temperature compensation element 311 such that an amount of current increases when temperature rises, a temperature characteristic can be compensated for.

In addition, since a voltage adjustment unit 315 is provided, a voltage value of the reference voltage signal line 304 can be changed according to a value of the control data 313, and a reference current changes.

Figure 14:
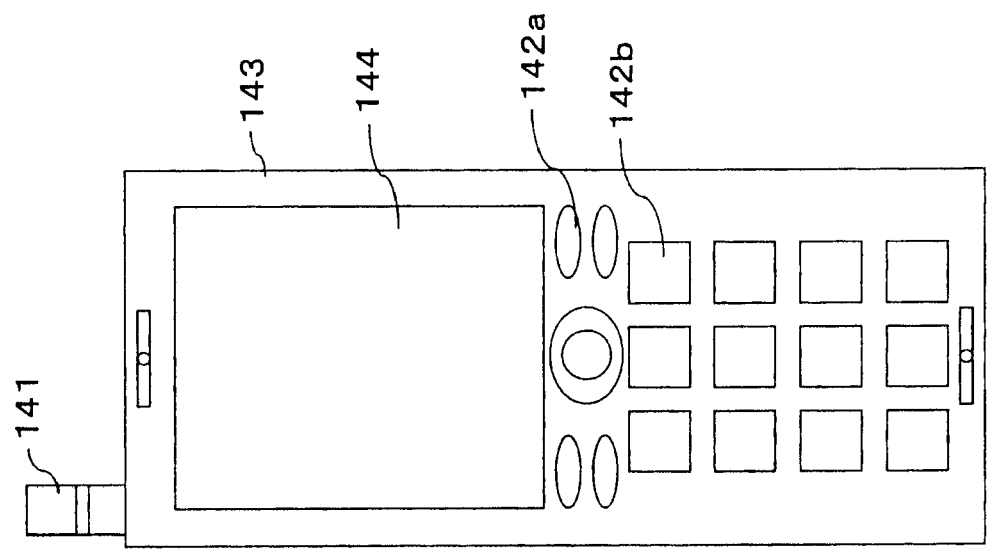
FIG. 14 is a diagram showing a case in which the display device using the embodiment of the present invention is applied to a personal digital assistant.
Figure 15:
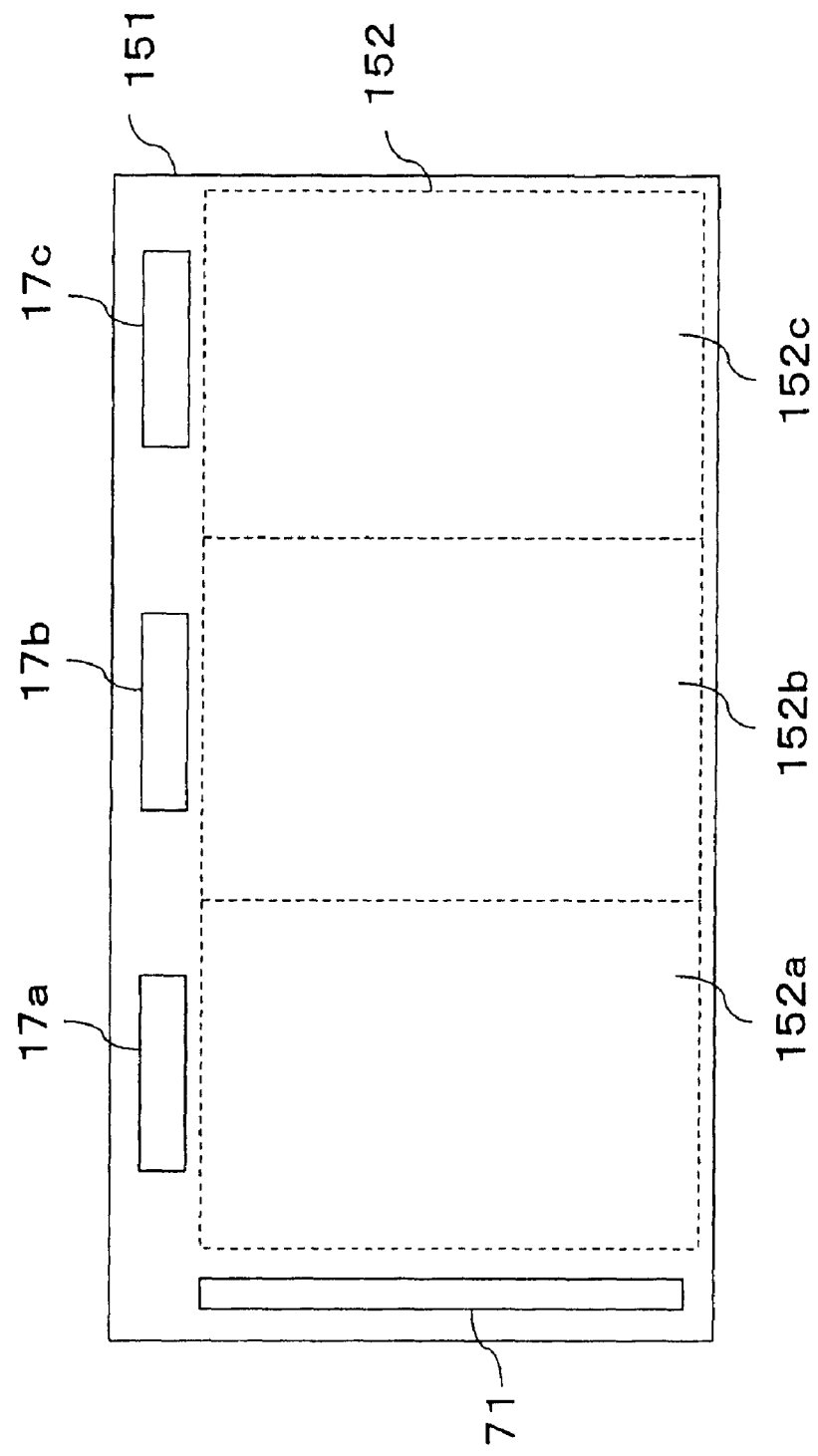
FIG. 15 is a diagram showing a display panel using plural source driver ICs.
Figure 16:
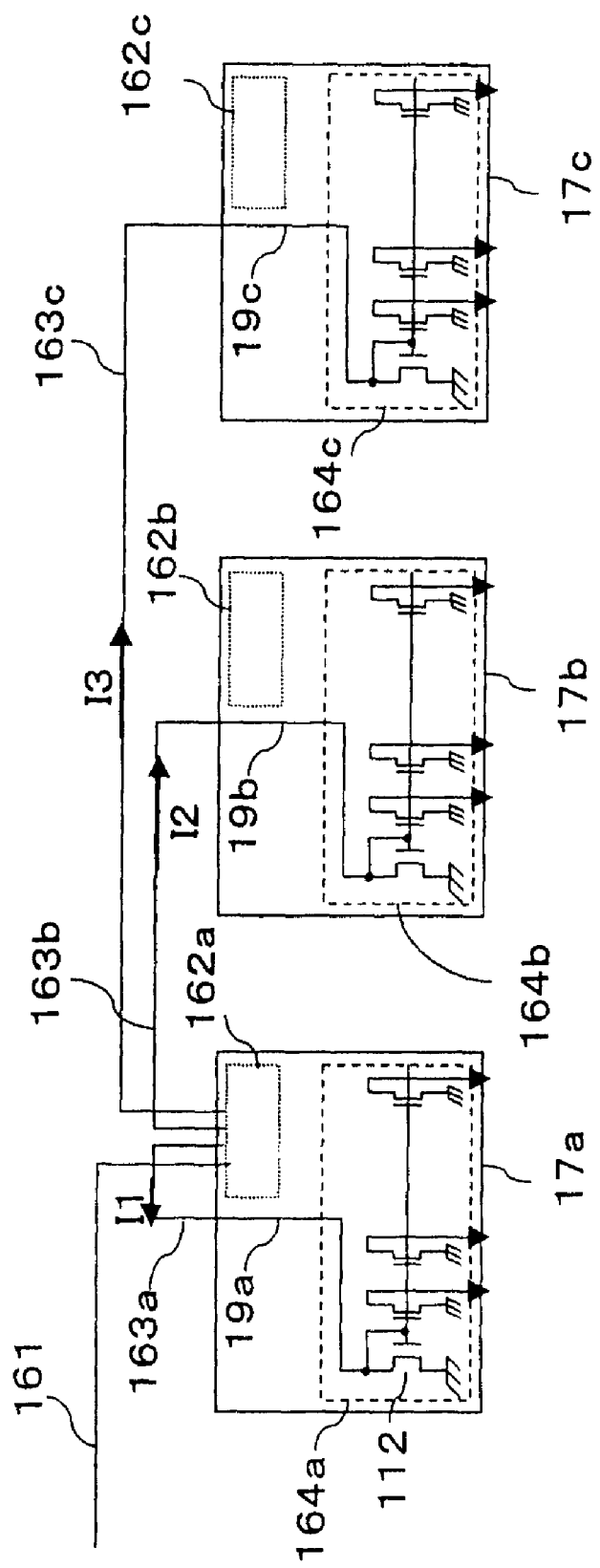
FIG. 16 is a diagram showing a method of connecting plural driver ICs in cascade in a conventional method.
Figure 17:
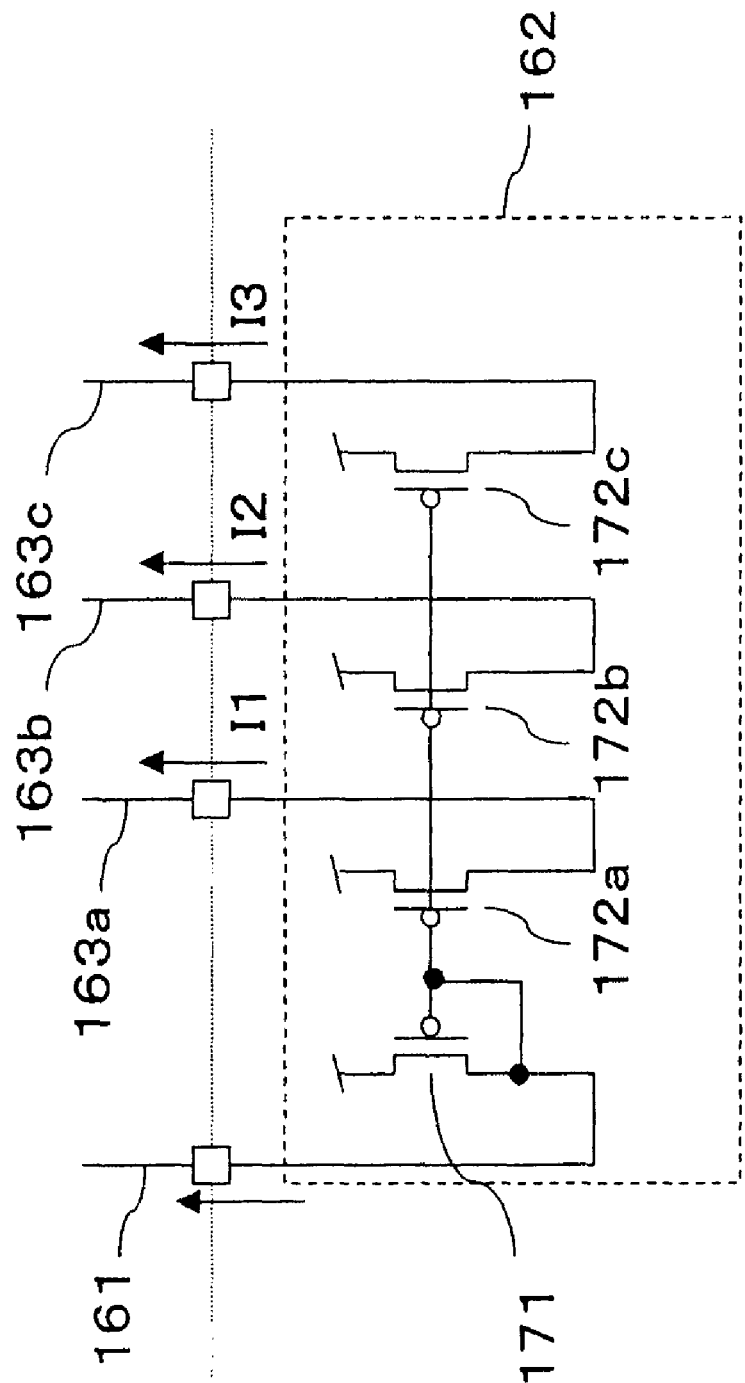
FIG. 17 is a diagram showing an example of a circuit of a reference current distribution unit in FIG. 16.
Figure 18:
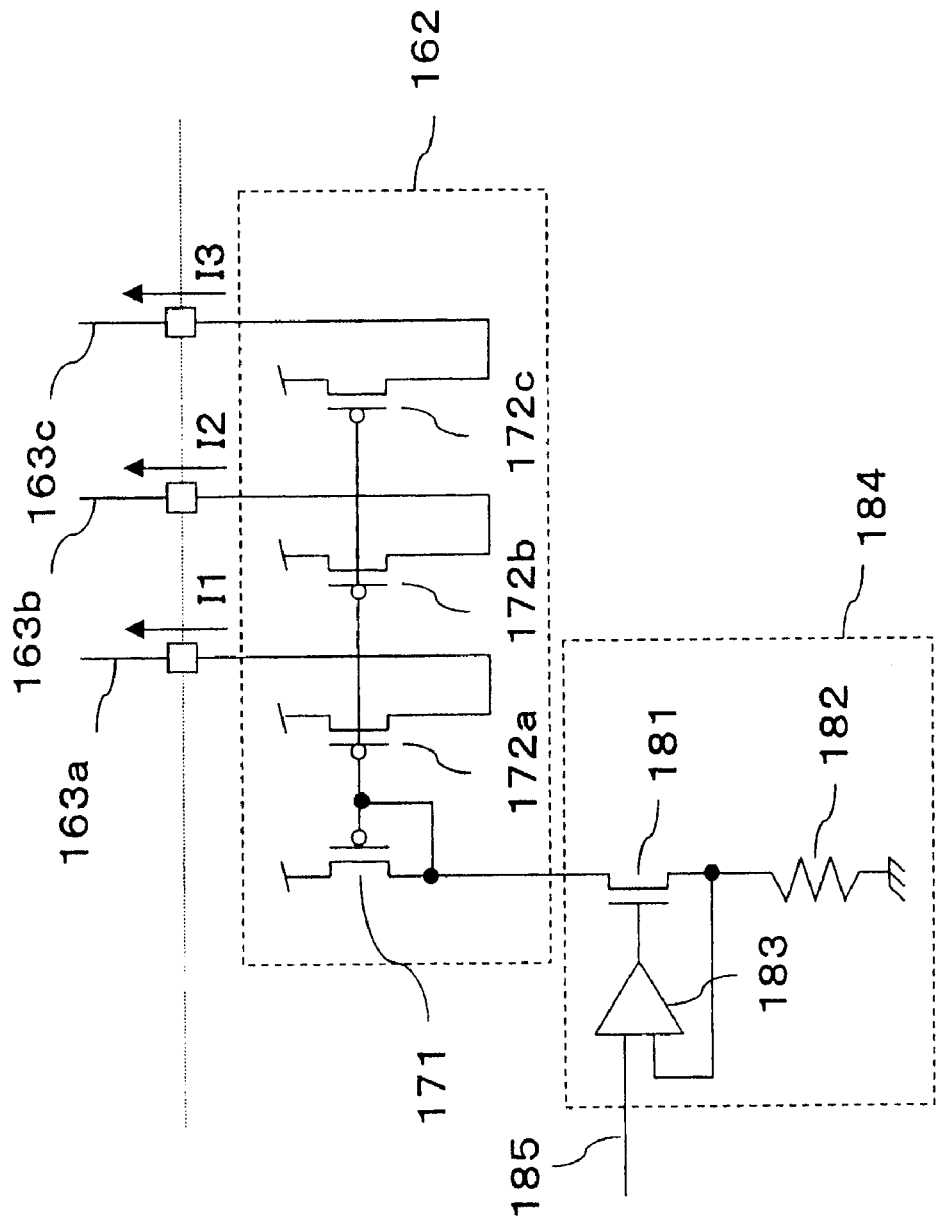
FIG. 18 is a diagram showing an example of the circuit of the reference current distribution unit in FIG. 16 and a circuit of generating a reference current.
Figure 19:
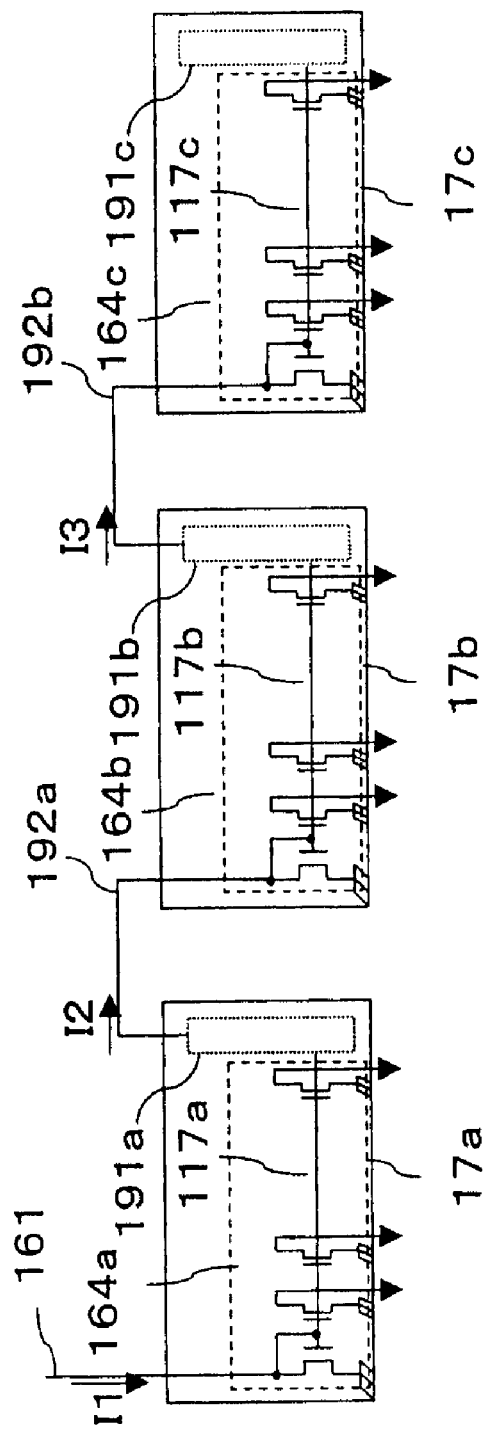
FIG. 19 is a diagram showing a method of connecting plural driver ICs in cascade in a conventional method.
Figure 20:
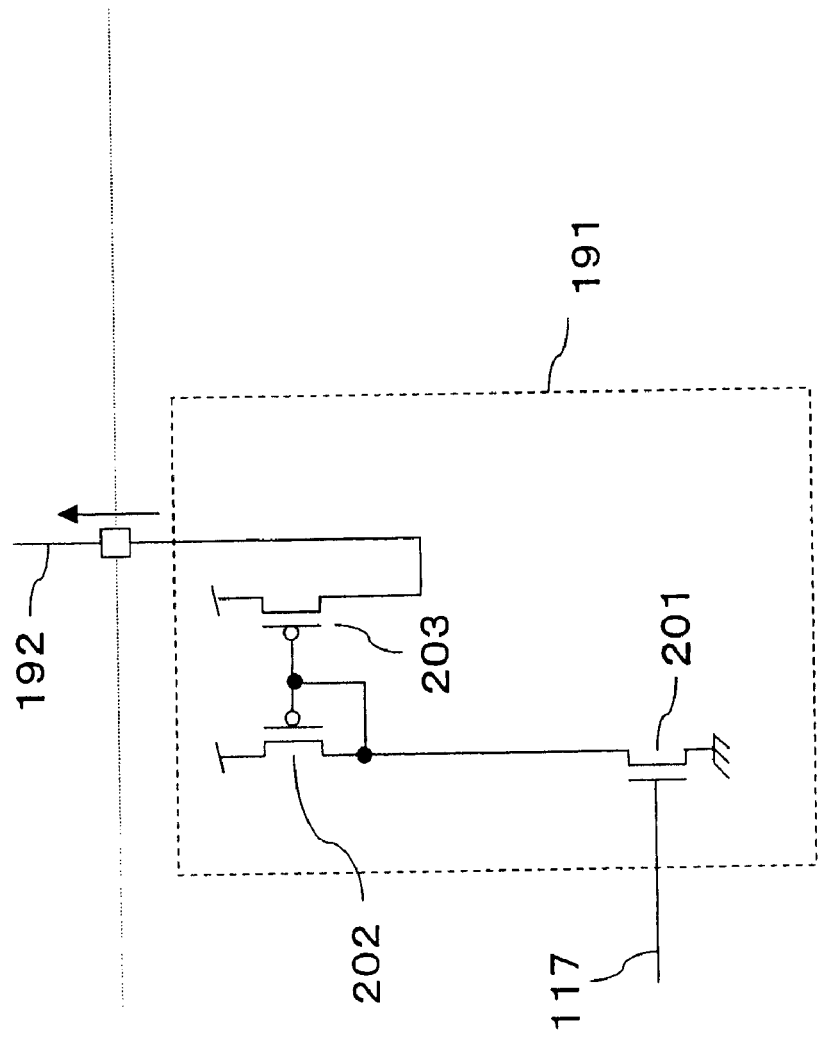
FIG. 20 is a diagram showing an example of a circuit of a current delivery unit 191 in FIG. 19.

This function makes it possible to, for example, in a semiconductor circuit incorporated in the display device of the personal digital assistant of FIG. 14, flow the predetermined reference current 19 at the time of input to a key 142, lower the reference current after a fixed time to decrease luminance of the display panel, and reduce power consumption of the display panel and the semiconductor circuit in order to lengthen a life of a battery of the personal digital assistant.

Figure 33:
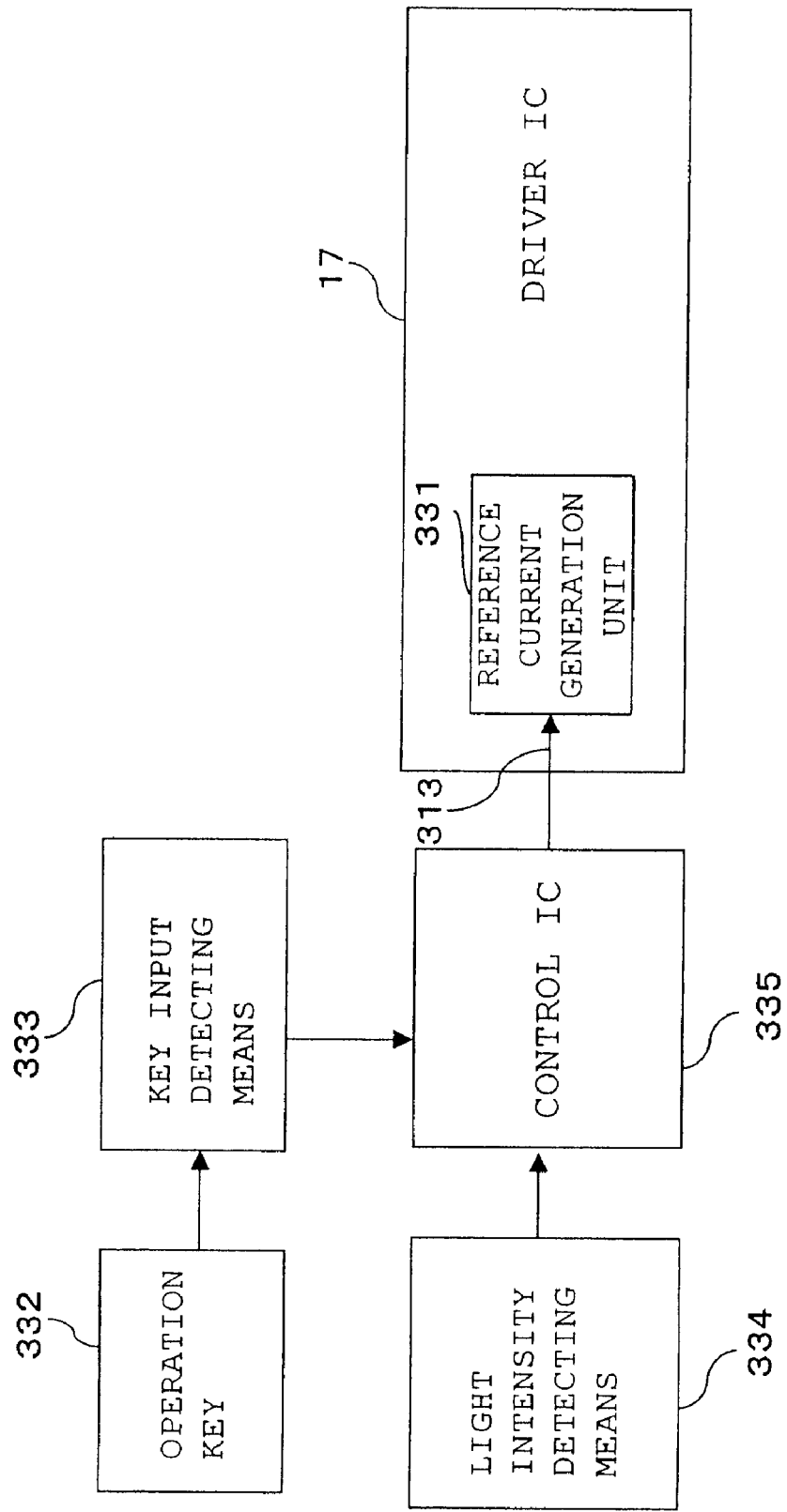
FIG. 33 is a circuit block diagram of changing a reference current according to key input or extraneous light.

A circuit block for realizing this is shown in FIG. 33. Detecting means 333 of detecting key input is provided with respect to operation keys to judge whether key input has been performed. A result of the judgment is sent to a control IC 335. The control IC 335 rewrites a value of the control data 313 which controls a generated current value of the reference current generation unit 331 of the source driver IC17. Consequently, it becomes possible to change a reference current value to be generated according to whether key input has been performed. If a counter function is provided in the control IC 335, it also becomes possible to return the reference current value to the original setting after a fixed time.

Similarly, in the case in which it is desired to change luminance of the display panel according to extraneous light in order to improve visual recognition, it also becomes possible to rewire a value of the control data 313, which sets a reference current, on the basis of a result of detection of light intensity detecting means 334, and realize reduction of power consumption by increasing luminance under strong extraneous light and decreasing luminance in the dark.

Figure 32:
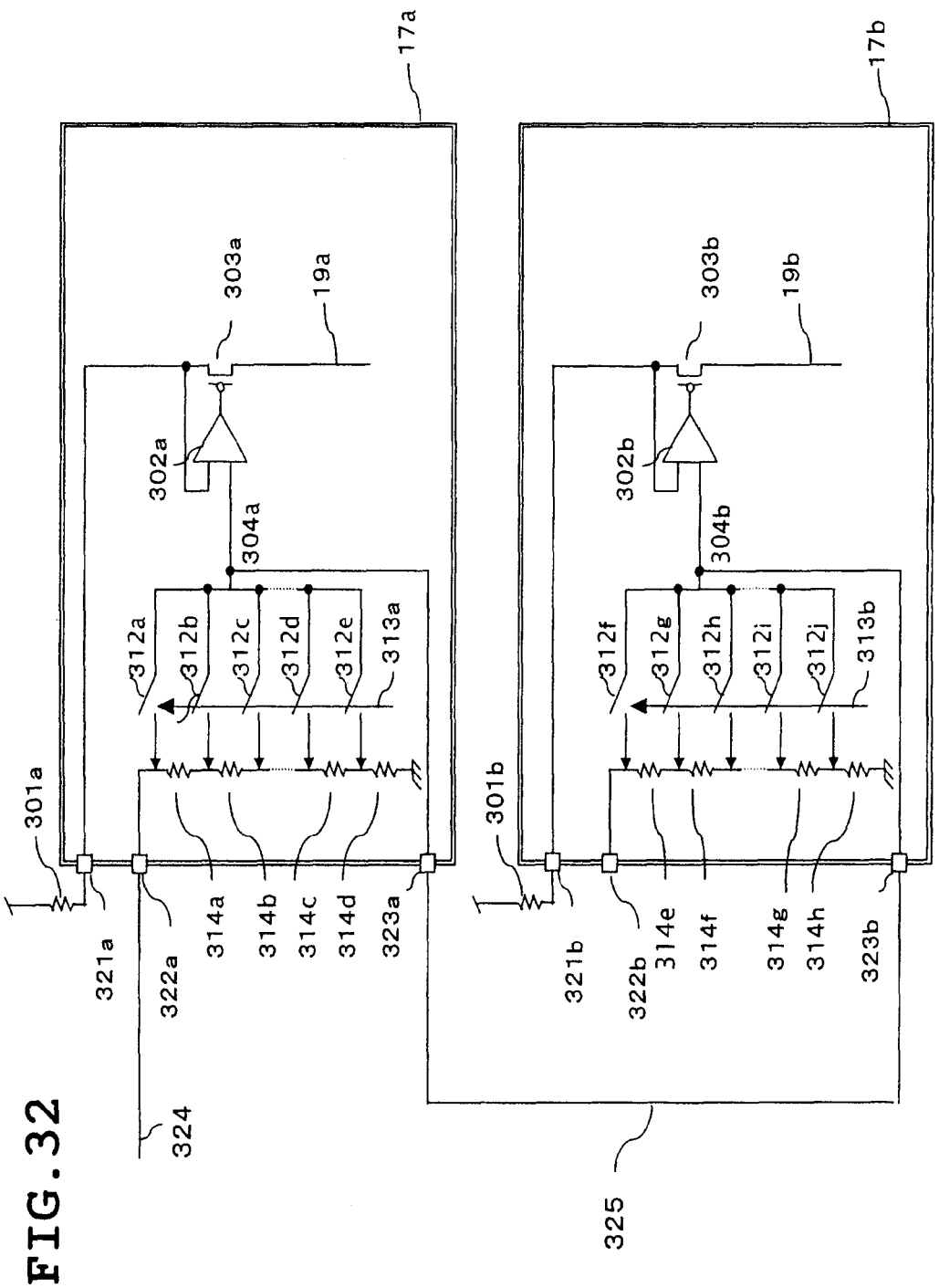
FIG. 32 is a diagram showing a circuit and an external wiring of supplying an identical reference current to plural driver ICs.

In the case in which plural chips are arranged side by side in one display device, it becomes possible to rewrite control data of one driver IC 17 by performing connection of a reference current generation unit as shown in FIG. 32 to change a reference current of all of the other driver ICs 17. This method reduces fluctuation in a reference voltage among the chips by connecting an output of the voltage adjustment unit 315 in one driver IC 17 to the reference voltage signal line 304 of all the driver ICs 17 in an identical display panel. Moreover, since only one driver IC 17 is sufficient for inputs of the control data 313 and the reference voltage 324, winding of wiring of an external input signal line decreases, and it becomes possible to reduce a frame of the display panel. In addition, this system of distributing a voltage is effective because there is no fluctuation compared with a conventional method of distributing a reference current to each driver. This is because it is difficult to distribute an identical current but it is easy to distribute an identical voltage.

In this way, it becomes possible to supply a reference current among driver ICs without fluctuation.

Next, a structure of an output stage will be considered.

Figure 34:
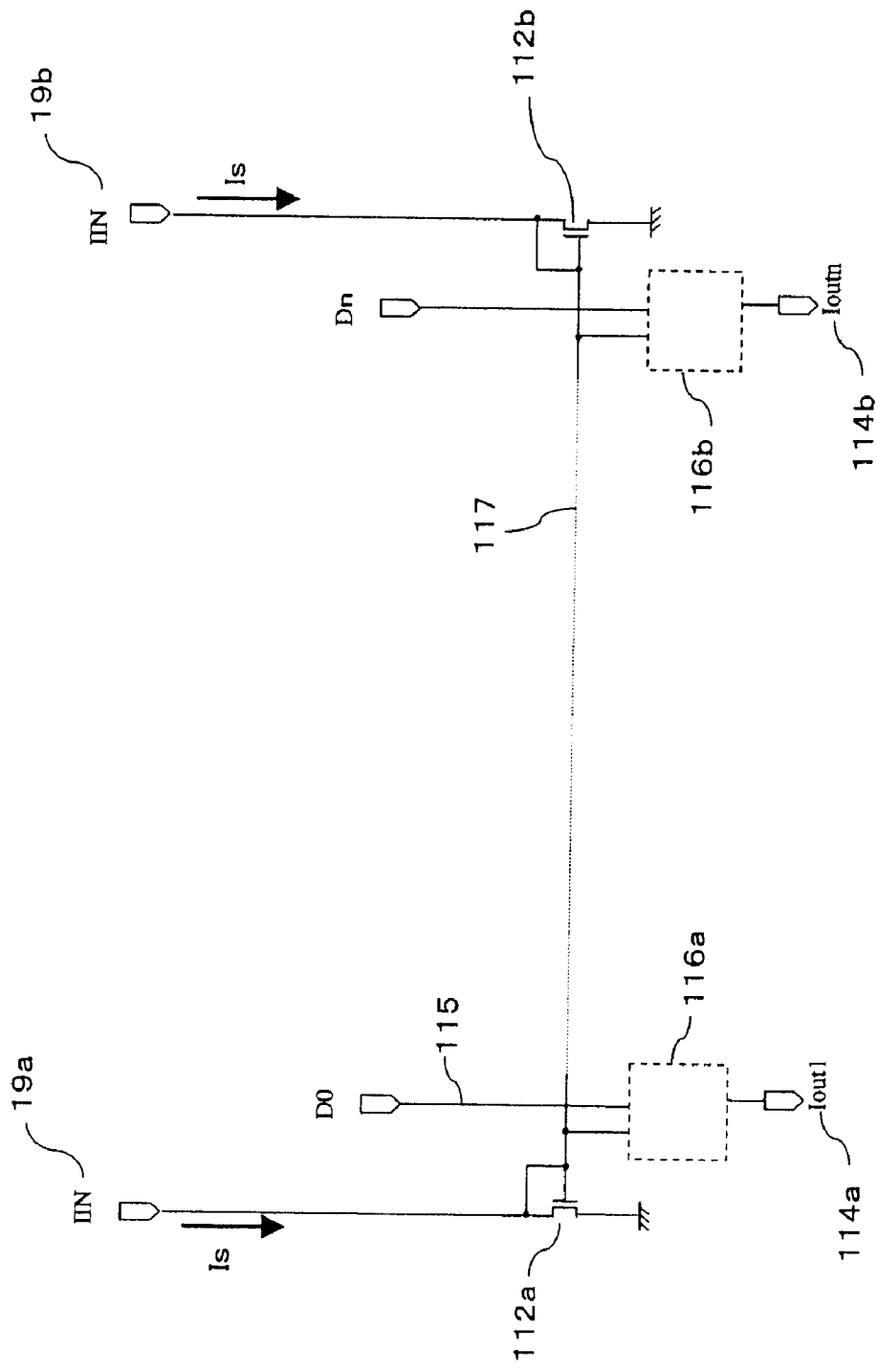
FIG. 34 is a diagram showing a current output stage where current values at left and right ends are equal in the embodiment of the present invention.

A current output unit of the driver IC 17 of this embodiment has a structure as shown in FIG. 34. The structure is different from the structure of FIG. 11 in that the reference current 19 is supplied from both ends of an output stage. The digital/analog conversion unit 116, which converts video signal data into an amount of output current, has a structure of FIG. 35, for example, in the case of 6 bit data. Here, the current source for gradation display 113 is outputted using the number corresponding to a weight of bits. However, a method of increasing a channel width instead of the number may be adopted.

In addition, the common gate line 117 is formed of a material having a high resistance. Consequently, even in the case in which there is a change 211$a$ in a threshold voltage of a transistor at both ends of a chip as shown in FIG. 36($a$), it becomes possible to vary a potential of the common gate line 117 at the left and right ends of the chip according to a wiring resistance of the common gate line 117 (see a straight line 361 in the figure). As a result, a gate voltage at the right end, which conventionally has been Vg1, can be increased to Vg2. Since an output current value depends upon a gate voltage, a current output changes from 211$b$ to 362 when the structure of FIG. 11 adopted. Consequently, it becomes possible to make current values at the left and right equal.

Since current outputs at the left and right ends of an identical chip are equal, and a reference current defining a current value per one gradation can be supplied without fluctuation among chips, elimination of block unevenness, which tends to occur in boundaries of the driver ICs 17, can be realized.

Figure 37:
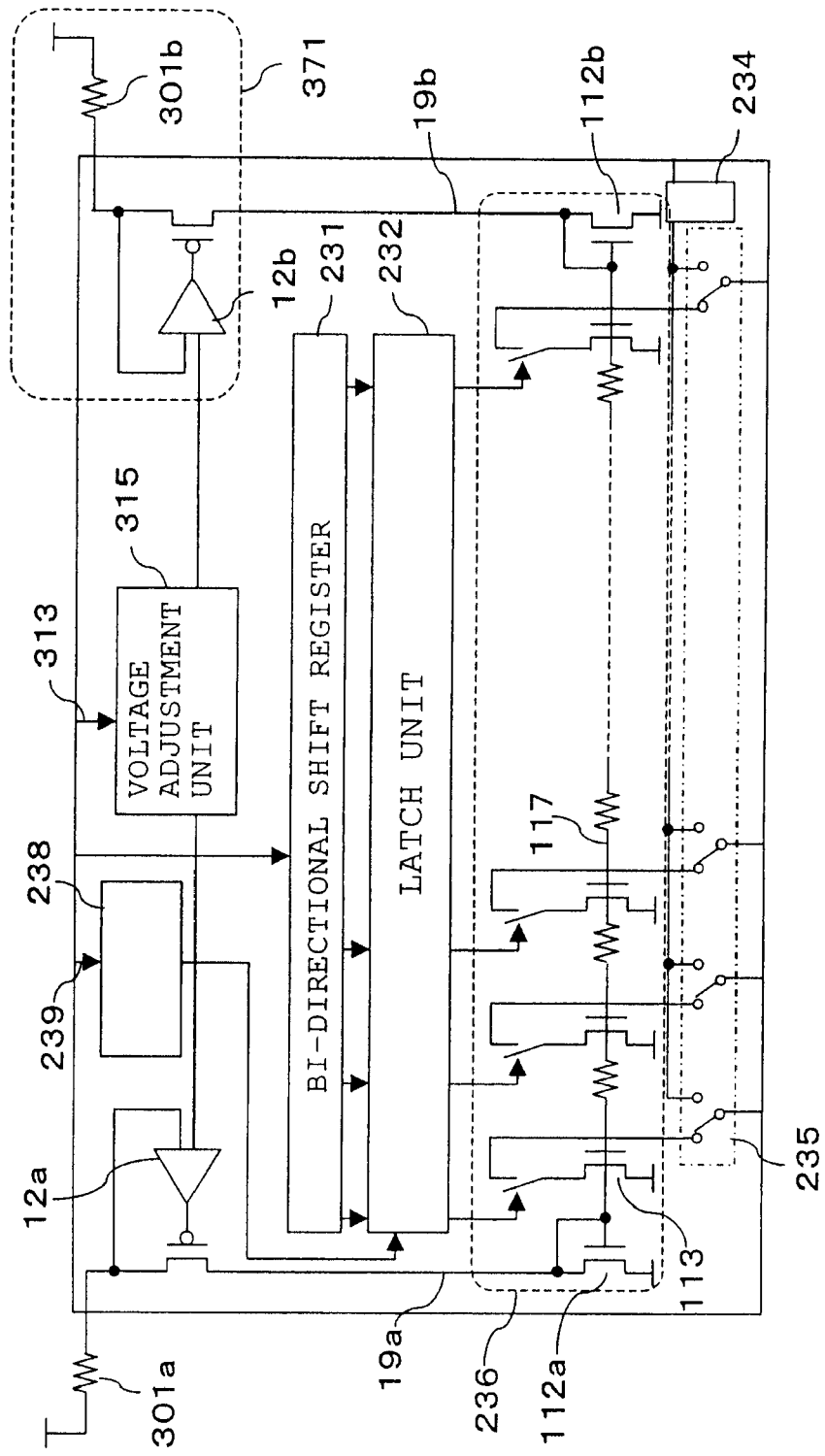
FIG. 37 is a circuit diagram of a driver IC utilizing the circuit structures of FIG. 31 and FIG. 34.

A schematic block diagram of a driver IC in that case is shown in FIG. 37.

The current output stage 236 is constituted by a current mirror. In order to cope with a gentle change of a transistor characteristic in a wafer, the common gate line 117 is constituted by a high resistance material. A reference current generation unit of supplying a current to left and right ends of a chip has a structure as indicated by 371, fluctuation at the left and right can be controlled to about 0.7% at the maximum. It is also possible to further reduce the fluctuation if a resistor with small fluctuation is used for an externally attached resistance 301 to be used. Outputs of the voltage adjustment unit 315 having different output voltage values are inputted to left and right operational amplifiers 12 of the reference current generation unit 371 according to the control data 313, whereby left and right reference currents 19$a$ and 19$b$ are made equal, and it becomes possible to change the reference currents simultaneously according to the control data 313.

After a delay in external wiring is adjusted and synchronized with an internal circuit by a timing adjustment unit 238, an input video signal 239 is distributed to each output terminal according to an output of the bi-directional shift register 231 and latched in the latch unit 232 of two stages in order to maintain a horizontal scanning period value. The latched video signal data is inputted to the current output stage 236.

The current output stage 236 distributes the reference current 19 to each output with a current mirror structure. In this figure, a transistor of a mirror source is 112, and a transistor of flowing a distributed current is 113.

Figure 35:
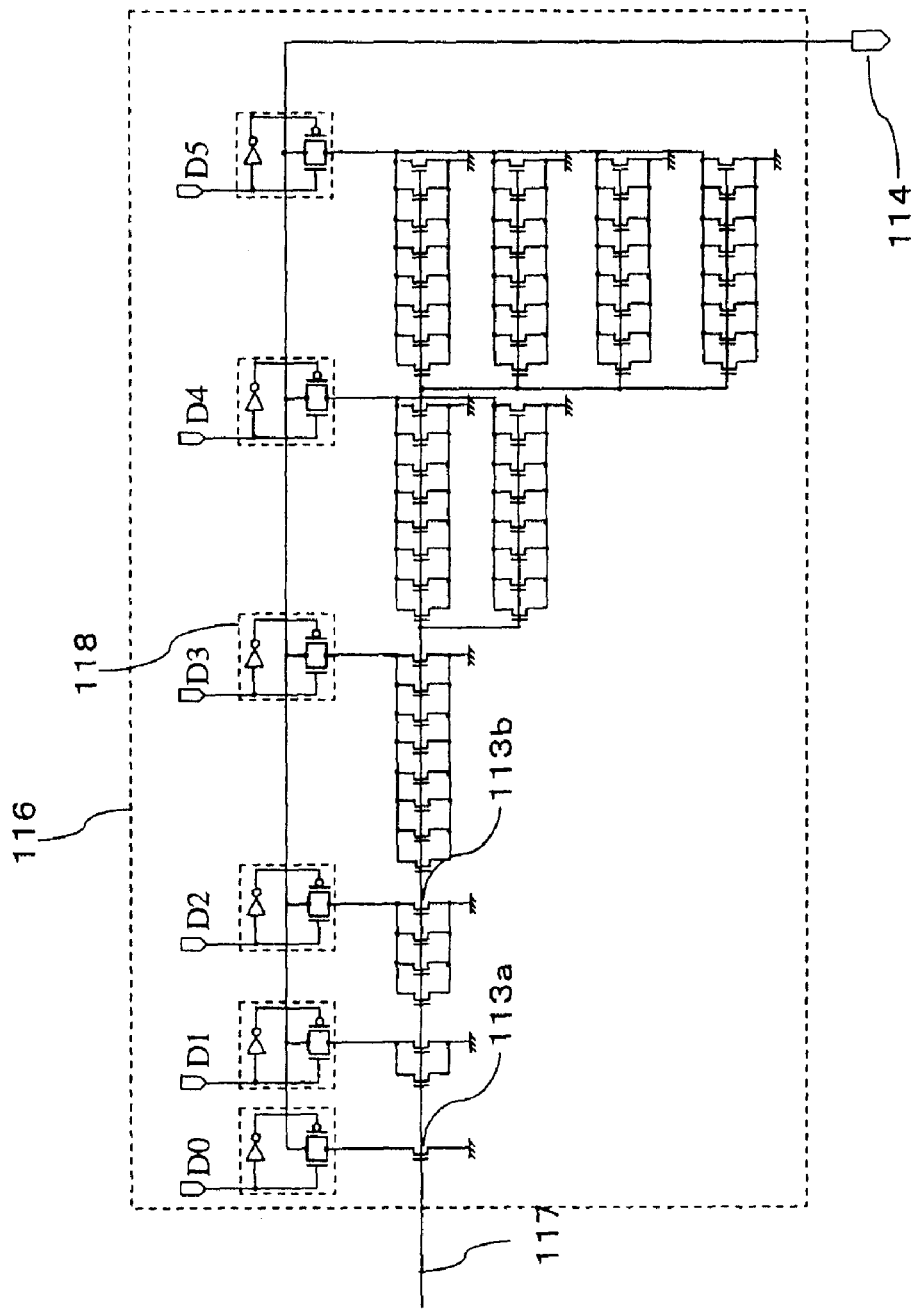
FIG. 35 is a diagram showing a digital/analog conversion unit of outputting a corresponding current from video signal data.

The distributed current is outputted via the switch 118 which is provided on a drain side of the current source for gradation display 113 of turning ON/OFF the switch on the basis of data outputted from the latch unit 232. In this example, since one bit is used, the switch 118 is OFF when the data is 0, and a current for one transistor of 113 flows as an output current when a current is 0 and the data is 1. This current value is determined according to a mirror ratio with the transistor of 112 and a reference current value. Note that, other than one bit, if a circuit having the structure of FIG. 35 is arranged in each output, it is also possible to perform an output of six bits and 256 gradations.

The current output is further inputted to the current output/pre-charge voltage selection unit 235. This is for performing charging and discharging of a charge with a voltage source at the time of low gradation display shown in FIG. 24 to cope with the difficulty in changing a charge of a stray capacitor with a micro current. There is a switching unit which can select which of an output from the pre-charge power supply 234 and a current output of the current output unit is outputted. Note that, other than the structure of FIG. 37, this switching unit may be provided with two switches as indicated by 251 and 252 of FIG. 25. These switches may be provided with a function of performing high impedance output for electrically separating the driver IC 17 and the display panel.

Figure 38:
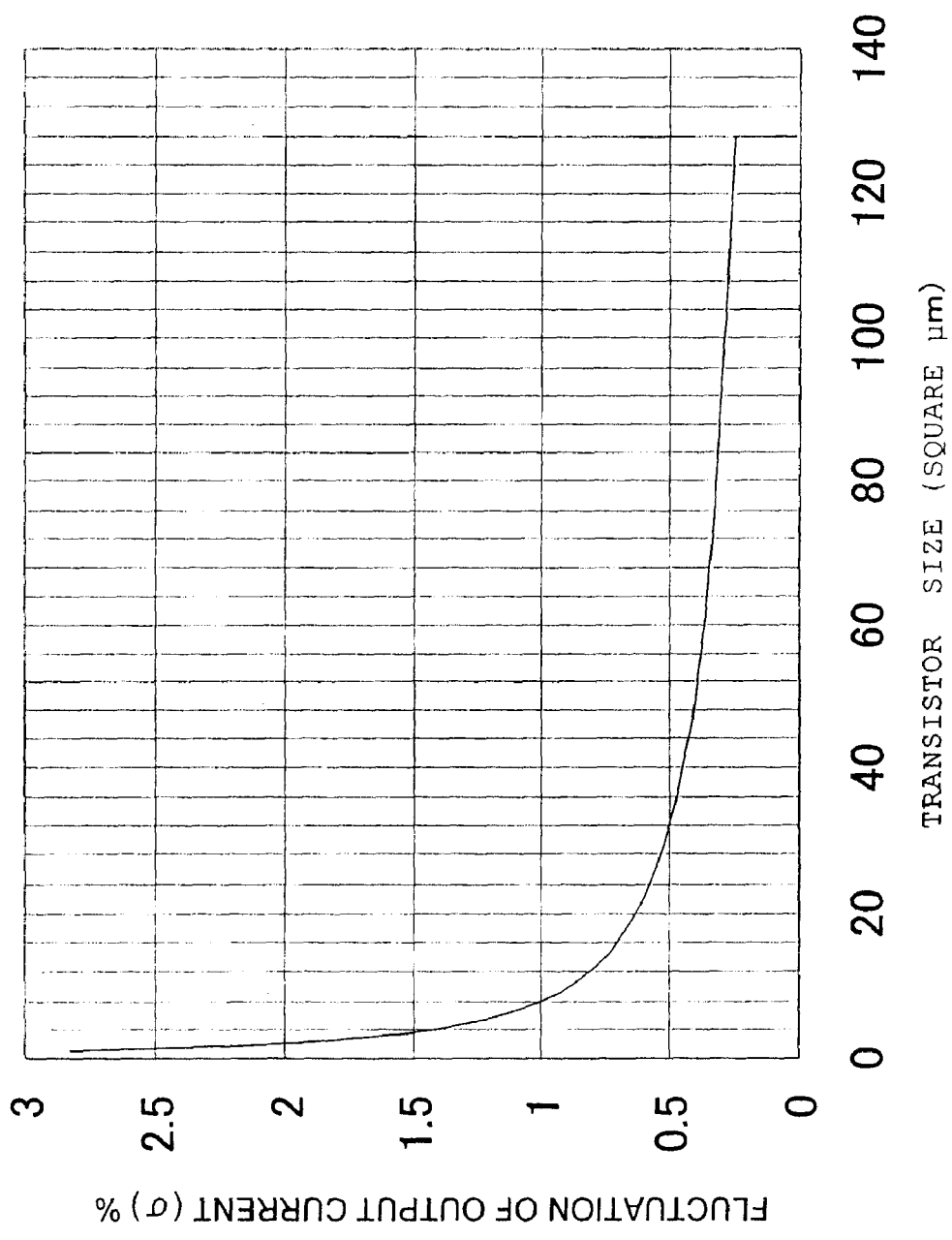
FIG. 38 is a diagram showing a relation between a transistor size of a current source for gradation display 113 of FIG. 35 and fluctuation in an output current.

Fluctuation in an output current for each terminal occurs depending upon a transistor size of the current source for gradation display 113 of performing current output. A relation between a transistor size (channel area) and fluctuation in an output current is shown in FIG. 38. Since it is necessary to reduce fluctuation between adjacent terminals in a chip and among chips to be 1% or less taking into account fluctuation in a reference current, it is desirable to reduce fluctuation in an output current in FIG. 38 (fluctuation in a current in an output stage) to 0.5% or less, and it is advisable to set a transistor size of the current source for gradation display 113 to 30 square microns or more.

Note that, in FIG. 37, a judgment signal for judging whether or not pre-charge is performed is not shown because the figure only shows the entire structure. Two kinds of structures shown in FIGS. 23 and 28 are possible and a circuit of controlling a switch according to a latch unit and a pre-charge pulse is provided when the structure of FIG. 23 is adopted. In FIG. 28, a structure only has to be adopted in which one bit signal is increased with respect to a video signal of each color, and a switch is controlled according to a latch output and a pre-charge pulse increased by one bit.

Figure 39:
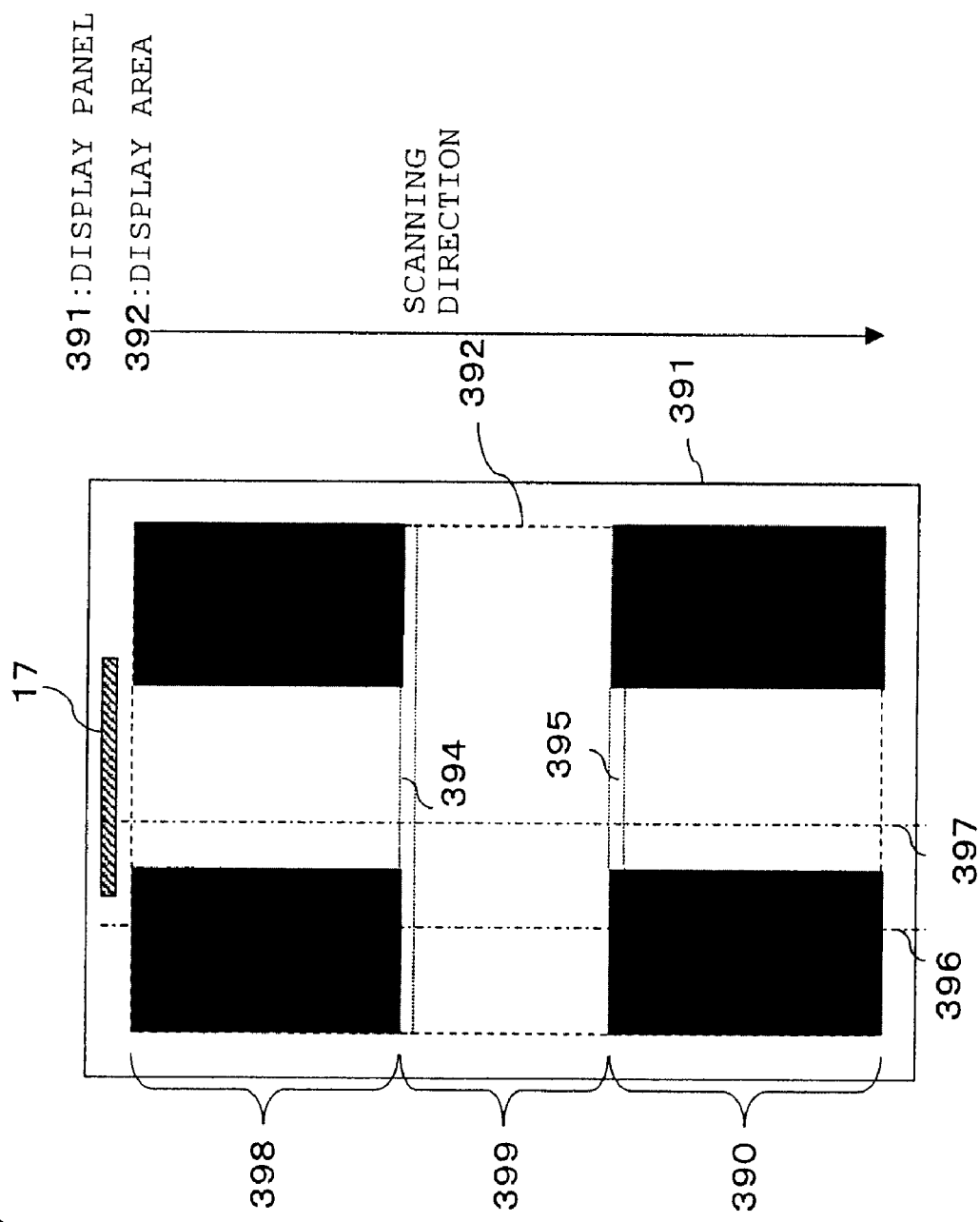
FIG. 39 is a diagram showing an example of a display image for indicating a place where a luminescent line and a black line are caused.

When display as shown in FIG. 39 is performed using the current driver IC 17 constituted as described above, a phenomenon, in which luminance in a row indicated by 394 is high compared white display of other rows and luminance in a part indicated by 395 is low compared with white display of other rows, tends to occur.

The part 394 where luminance is high (called luminescent line in this context) appears in a row where the number of terminals of outputting a black signal decreases in the terminals of the driver IC 17. The part 395 where luminance is low (called black line in this context) appears in a row where the number of terminals of outputting a black signal increases in the terminals of the driver IC 17.

Figure 8:
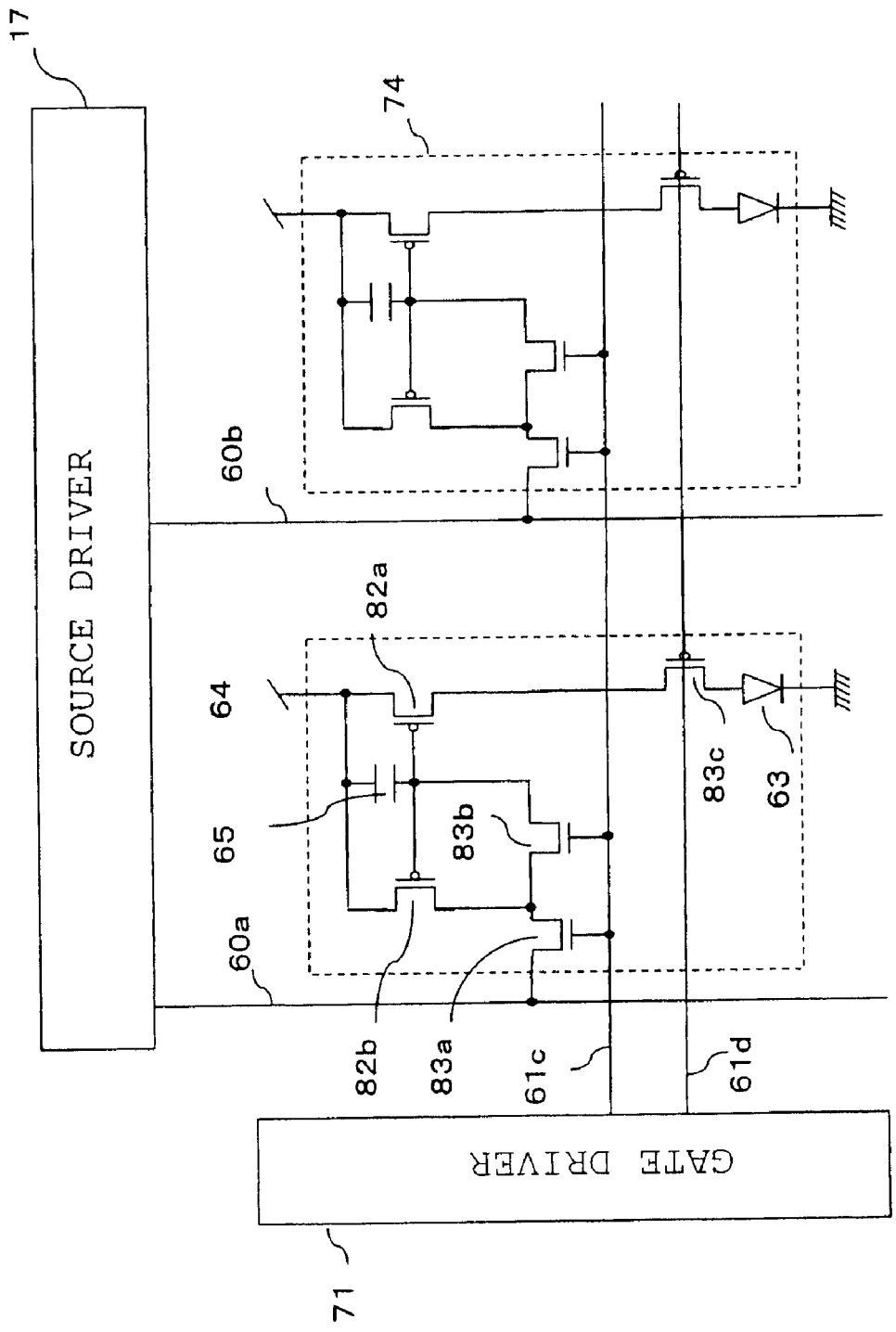
FIG. 8 is a diagram showing a circuit of an active matrix type display device using a pixel circuit of a current mirror structure.

In the display device having the pixel structure as shown in FIG. 7 or 8, a voltage of a source signal line connected to an output terminal of the driver IC 17 has a voltage waveform as shown in FIG. 40 in a signal line (column) 396 and a signal line (column) 397 of FIG. 39. Here, vb is a voltage at the time when a pixel displays black, and Vw is a voltage at the time when a pixel displays white.

As shown in FIG. 40(a), a voltage waveform of a source signal line corresponding to the column 396 outputs a voltage indicating black in a period 401, outputs a voltage indicating white in a period 402, and outputs a voltage indicating black in a period 403 in association with an image shown in FIG. 39.

On the other hand, as shown in FIG. 40(b), a voltage waveform of a source signal line corresponding to the column 397 outputs a voltage indicating white in all periods of one frame. In this case, in a display period of the row 394, a hazard occurs in a direction in which a voltage falls, and luminance further increases. In a display period of the row 395, a hazard occurs in a direction in which a voltage rises, and luminance further decreases. As a result, in the row 394 of FIG. 39, a luminescent line appears because luminance is high compared with other time of white display, and in the row 395, a black line appears because luminance is low compared with other time of white display.

A factor causing a hazard in such a source signal line voltage will be explained.

Figure 41:
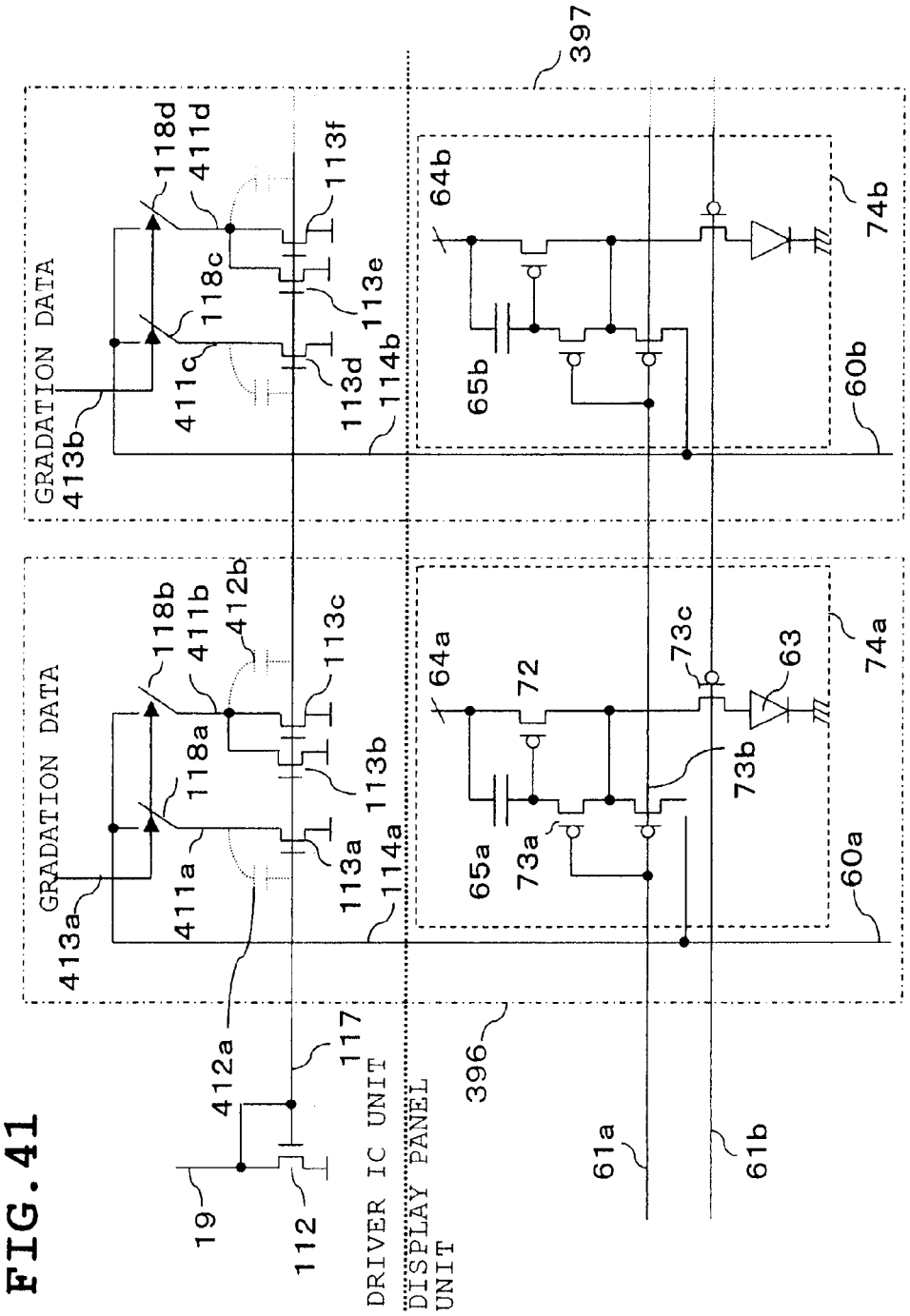
FIG. 41 is a diagram showing connection between an output stage of a driver IC and a pixel circuit.

A circuit at the time when the output stage circuit of the driver IC 17 and the pixel 74 of the display panel unit are connected is shown in FIG. 41. In this example, only two columns corresponding to the columns 396 and 397 are shown. Note that, although the explanation will be made assuming that gradation data is two bits here, in general, the same explanation is possible with N (N is a natural number) bits.

In the period 398 of FIG. 39, black data is outputted as gradation data 413a, and white data is outputted as gradation data 413b. Consequently, switches 118a and 118b come into a non-conduction state, and switches 118c and 118d come into a conduction state. As a result, a drain voltage of the transistor 113 takes a value close to a ground potential of the driver IC 17 (a voltage Vdb shown in FIG. 40) in nodes 411a and 411b and takes a value equal to a potential Vw of a source signal line 60b in 411c and 411d. A potential of a source signal line 60a is Vb. When black is written in a pixel 74a, since the switches 118a and 118b are in a non-conduction state, the source signal line 60a is in a state in which it is disconnected from the driver IC 17.

In the inside of the pixel 74a, the transistors 73a and 73b are brought into a conduction state, and the transistor 73c is brought into a non-conduction state by an operation of the gate signal line 61. In addition, all the other pixels connected to the source signal line 60a are brought into a state in which the pixels are electrically disconnected from the source signal line by an operation of the gate signal line. The source signal line 60a is in a state in which it is connected to the power supply 64 via the transistor 72. Since there is no path through which a current flows via the transistor 72, a drain potential of the transistor 72 is increased such that a current does not flow. Therefore, the voltage Vb is substantially equal to the power supply voltage 64.

Figure 42:
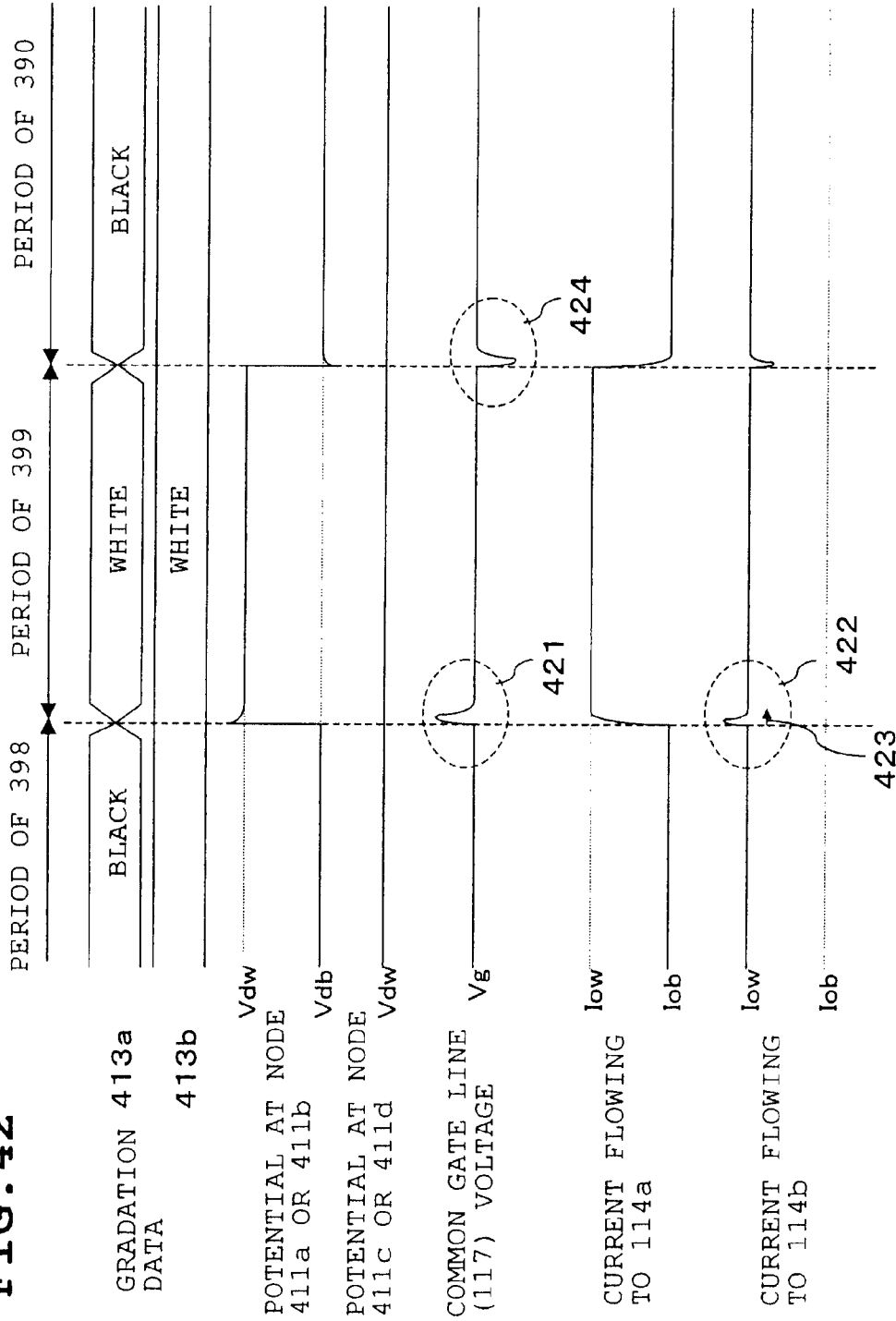
FIG. 42 is a diagram showing a voltage and a current waveform of each part of an output stage of a driver IC corresponding to input data.

In this state, as shown in FIG. 42, only the gradation data 413a is changed to a white signal. Then, the switches 118a and 118b come into a conduction state. At that instance, a potential of 411a and 411b rises to a potential of the source signal line 60a. This change propagates to the common gate signal line 117 as a capacitive coupling via a capacitor 412 which is parasitic on the transistor 113. As a result, as shown in FIG. 42, a period 421 in which a gate voltage rises in a hazard-like manner appears. Since the all the output transistors 113 outputs a current on the basis of a voltage of the identical common gate signal line 117, a hazard of the gate signal line affects all the driver outputs 18.

Since the data 413b does not change, a state of the switches 118c and 118d does not change. However, since the voltage of the gate signal line 117 has changed as in the period 421, an output current changes as indicated by 422. If a period 423, in which a current value different from a predetermined current value Iow is outputted, is long compared with one horizontal scanning period, a current value, which is written in the pixel 74 regulated when a pixel circuit is separated from a source signal line by the gate signal line 61, becomes large compared with Iow. Thus, luminance, which is high compared with a predetermined luminance, is outputted from the EL element 63.

Similarly, in the case in which the gradation data 413a has changed from white to black, immediately after the switches 118a and 118b close, a voltage of 411a and 411b changes from Vdw to Vdb, and this change propagates to the common gate signal line 117 through the stray capacitor 412, where by a gate voltage falls as in a period 424, and a current flowing to the switch 118b also falls. Consequently, similarly, if this hazard occurs for one horizontal scanning period or more, a pixel corresponding to a period in which the hazard occurs performs display at luminance which is low compared with a predetermined luminance.

Thus, in this embodiment, as a method of eliminating a luminescent line and a black line, three methods will be explained roughly. As a first method, swing in the gate signal line 117 is controlled. As a second method, a drain potential of the transistor 113 at the time of black display is increased to reduce an amount of voltage change at the time of data change which causes the swing in the gate signal line 117. As a third method, a change of an output current is reduced in response to a change of a voltage of the gate signal line 117 such that, even if the gate signal line swings, the swing does not effect an output. The three methods will be explained in order in conjunction with the drawings.

Figure 44:
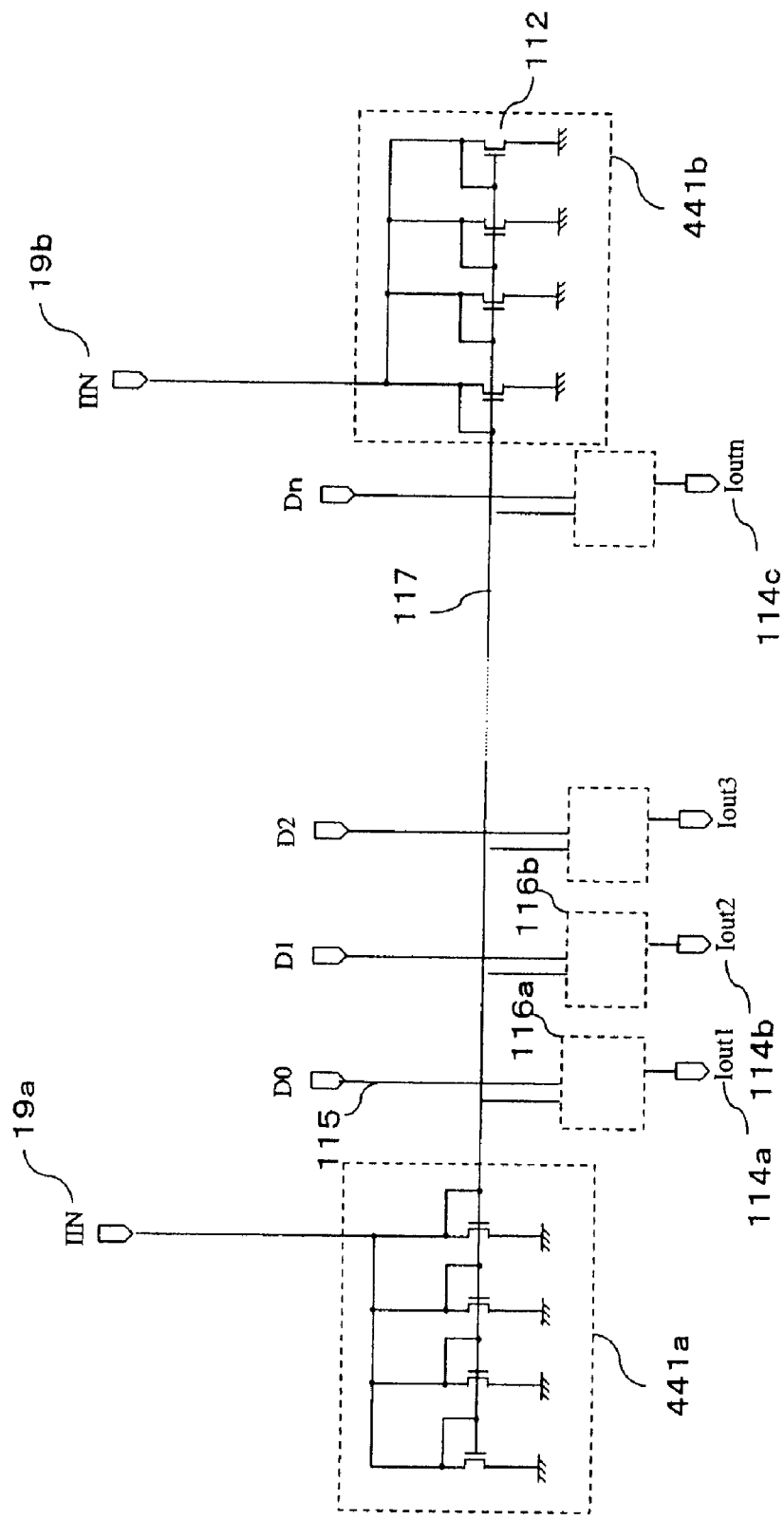
FIG. 44 is a diagram of a case in which the number of mirror transistors of distributing a reference current source is increased.

FIG. 44 is an embodiment of the first method. Compared with FIG. 34, the embodiment is characterized in that the number of the distributing mirror transistors 112, which decides a potential of the gate signal line 117, is increased. Consequently, since a mirror ratio changes, a current value of the reference current input 19 is also increased according to the change.

Figure 43:
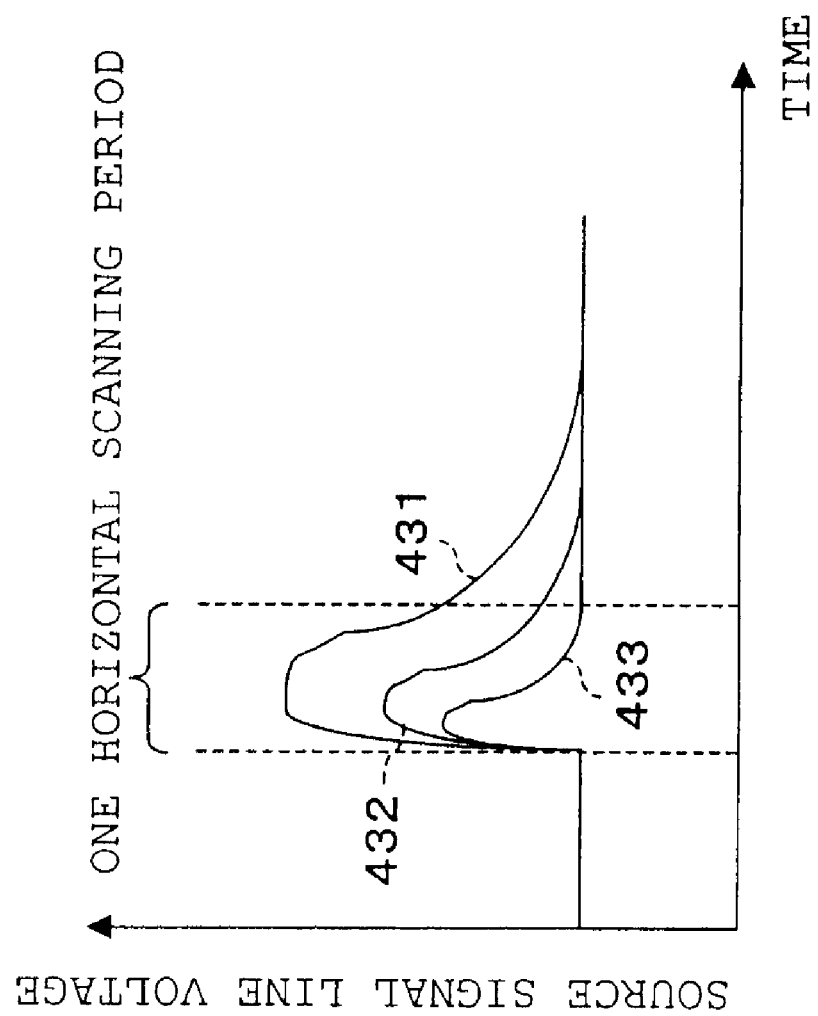
FIG. 43 is a diagram indicating that a hazard in a part 421 of FIG. 42 changes according to the number of mirror transistors.

An enlarged version of the hazard part 421 of a gate potential of FIG. 42 is shown in FIG. 43. In the structure of FIG. 34, there is a change of a gate voltage as indicated by a curve 431, and the gate voltage does not return to a predetermined voltage within one horizontal scanning period. Here, when the number of the mirror transistors 112 is increased, a change indicated by a curve 432 occurs. When the number of the mirror transistors 112 is further increased, a change indicated by a curve 433 occurs. In the case of the curve indicated by 433, since the gate voltage returns to the predetermined voltage value within the horizontal scanning period, a predetermined current value is written in a pixel.

Note that this can also be realized by increasing a size of the distributing mirror transistor 112 instead of increasing the number of the distributing mirror transistors 112.

Figure 45:
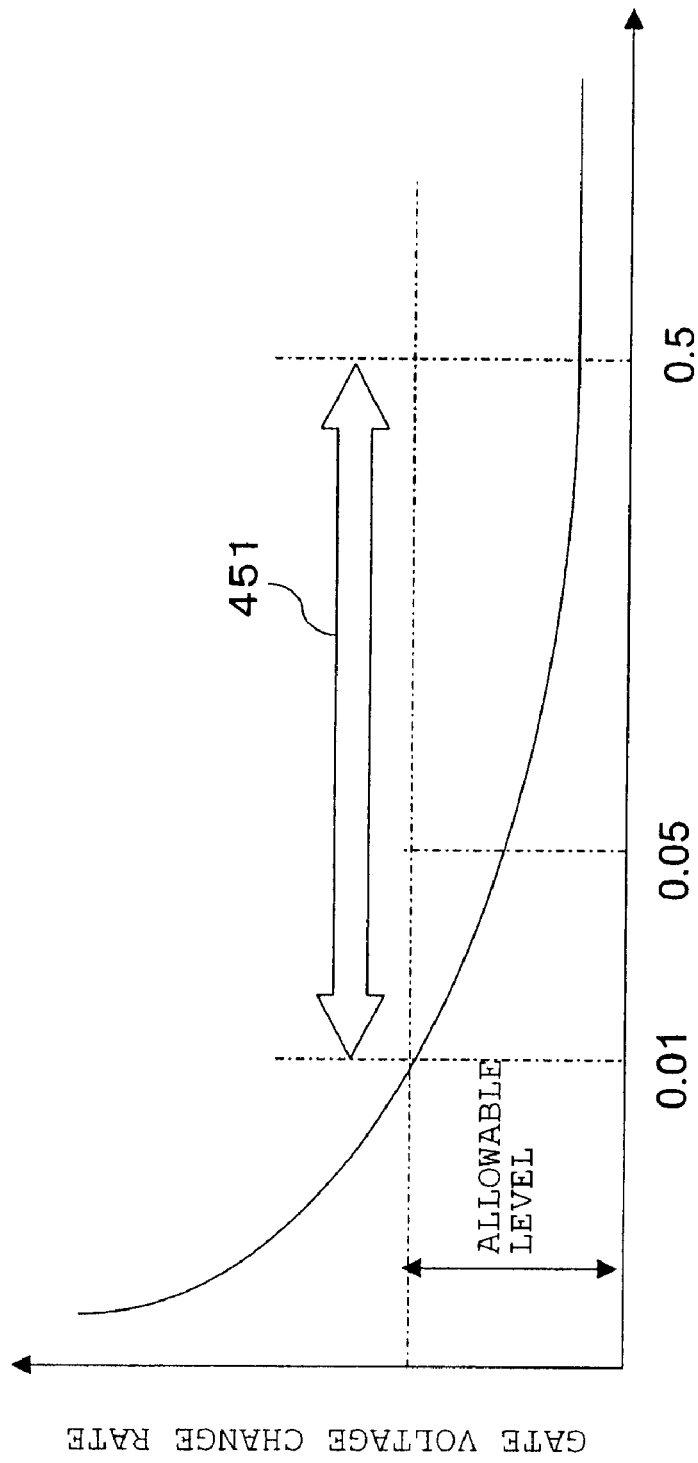
FIG. 45 is a diagram showing a relation between a channel total area of a distributing mirror transistor/a channel total area of a current source for gradation display and a gate voltage change rate.
Figure 46:
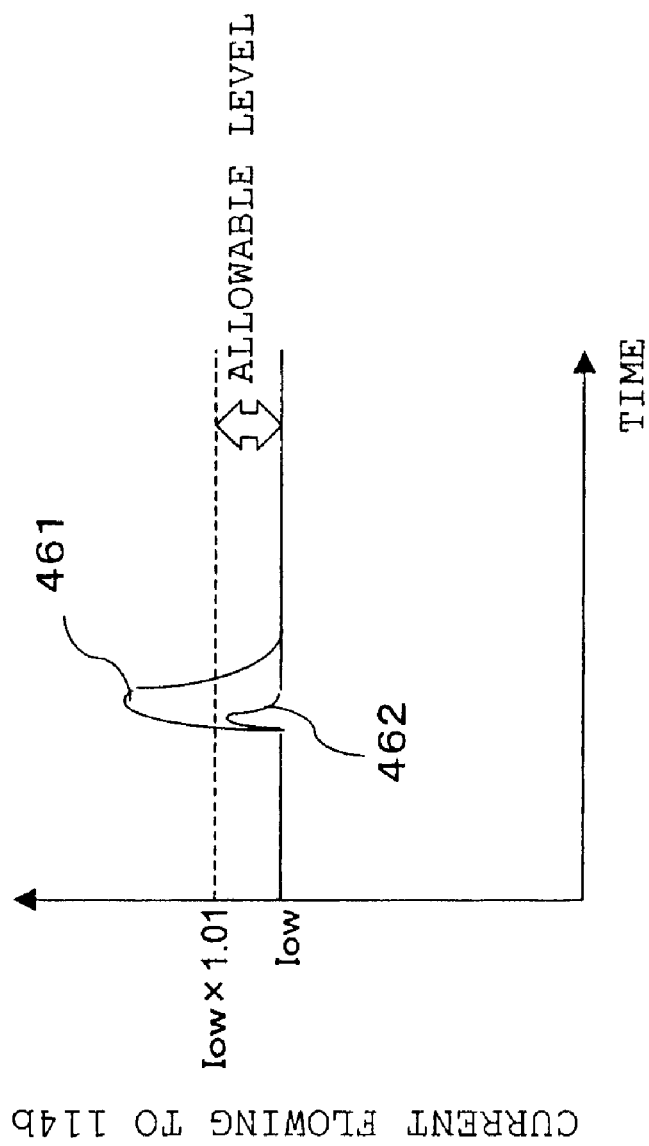
FIG. 46 is a diagram showing an allowable level of a hazard of 421 in FIG. 42.

It is desirable that a size of the distributing mirror transistor 112 is a size indicated by a range 451 of FIG. 45. That is, the range is a range in which a rate of change of a gate voltage is equal to or lower than an allowable level. This allowable level indicates a voltage fluctuation level at which a change of an output current is within 1% taking into account the fact that a luminance difference from the other rows cannot be visually recognized if an amount of change of output current is within 1%. Since fluctuation of a voltage (indicated by a curve 462 in FIG. 46) occurs via a stray capacitor of the transistor 113, the fluctuation depends upon a channel area and the number of current source for gradation displays. Therefore, a total size of the distributing mirror transistor 112 is defined by a ratio with respect to a total size of the transistor 113.

As a result of preparing various sizes and the numbers of distributing transistors and performing evaluation, a relation between (a channel total area of the distributing mirror transistor 112)/(a channel total area of the current source for gradation display 113) and a gate change rate was represented by a curve shown in FIG. 45.

According to this graph, a luminescent line and a black line are eliminated if the channel total area of the distributing mirror transistor 112 is 1% or more, preferably 5% or more of the channel total area of the current source for gradation display 113. On the other hand, if the ratio is 50% or more, a rate of change of a gate voltage does not decrease. Therefore, with the ratio of 50% or more, in whatever area the distributing mirror transistor 112 is designed, the area does not affect a hazard. It is preferable to set the ratio to 50% or less from the viewpoint of reducing a chip area.

Thus, the distributing mirror transistor 112 only has to be designed such that the channel total area thereof is 1% or more and 50% or less, preferably 5% or more and 50% or less of the current source for gradation display 113 as in the range 451.

Note that, in order to control fluctuation of a ratio a reference current and a certain gradation output current among chips, it is desirable to design the distributing mirror transistor 112 and current source for gradation display 113 in an identical size and with an identical layout. It is advisable to realize the above-described area ratio according to an increase or a decrease of the number of transistors. Consequently, even in a display device in which the plural driver ICs 17 are arranged and used, since fluctuation among chips of a ratio of an output current with respect to a reference current is reduced, display without block unevenness can be realized.

Figure 47:
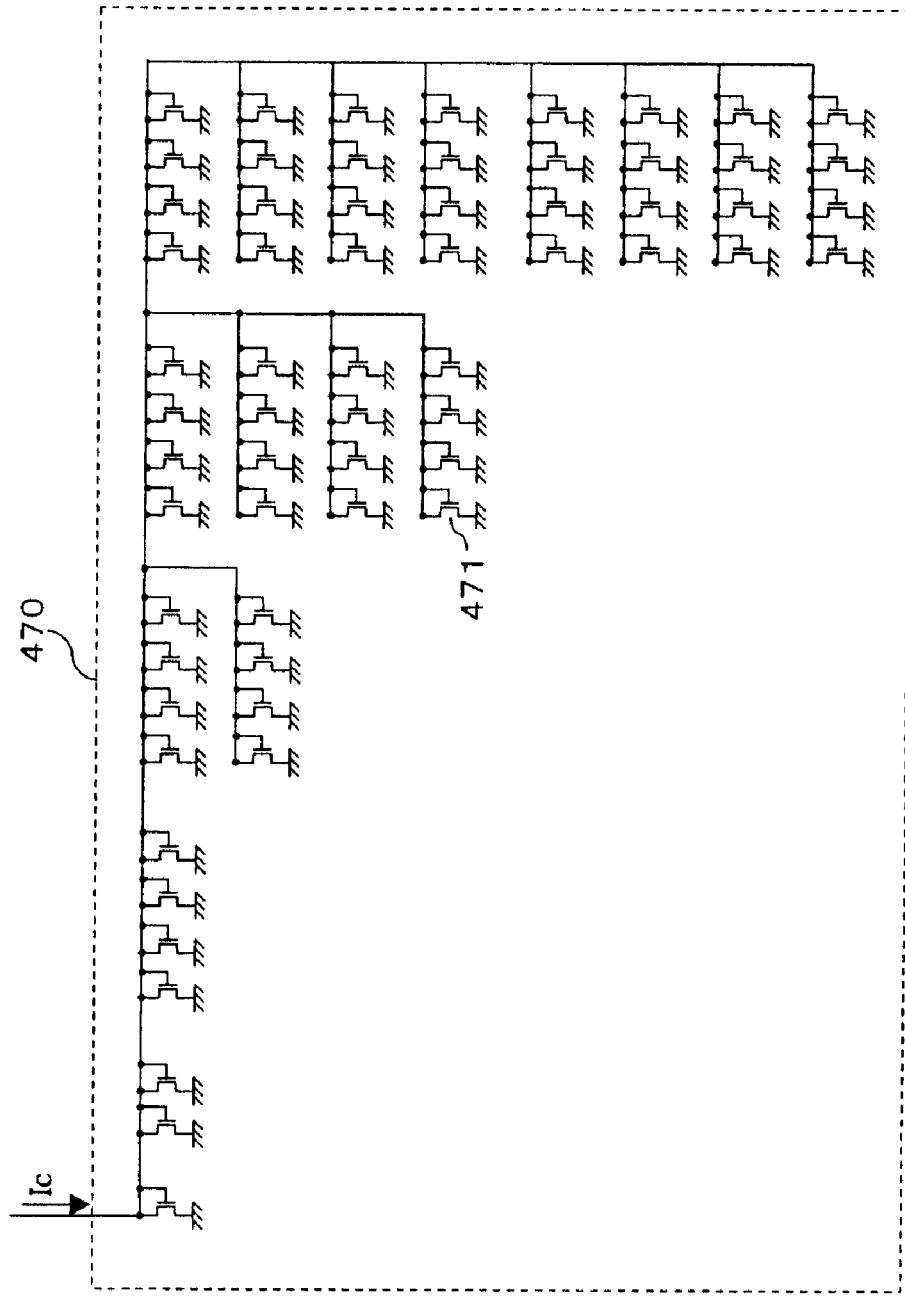
FIG. 47 is a diagram showing a distributing mirror transistor group.
Figure 48:
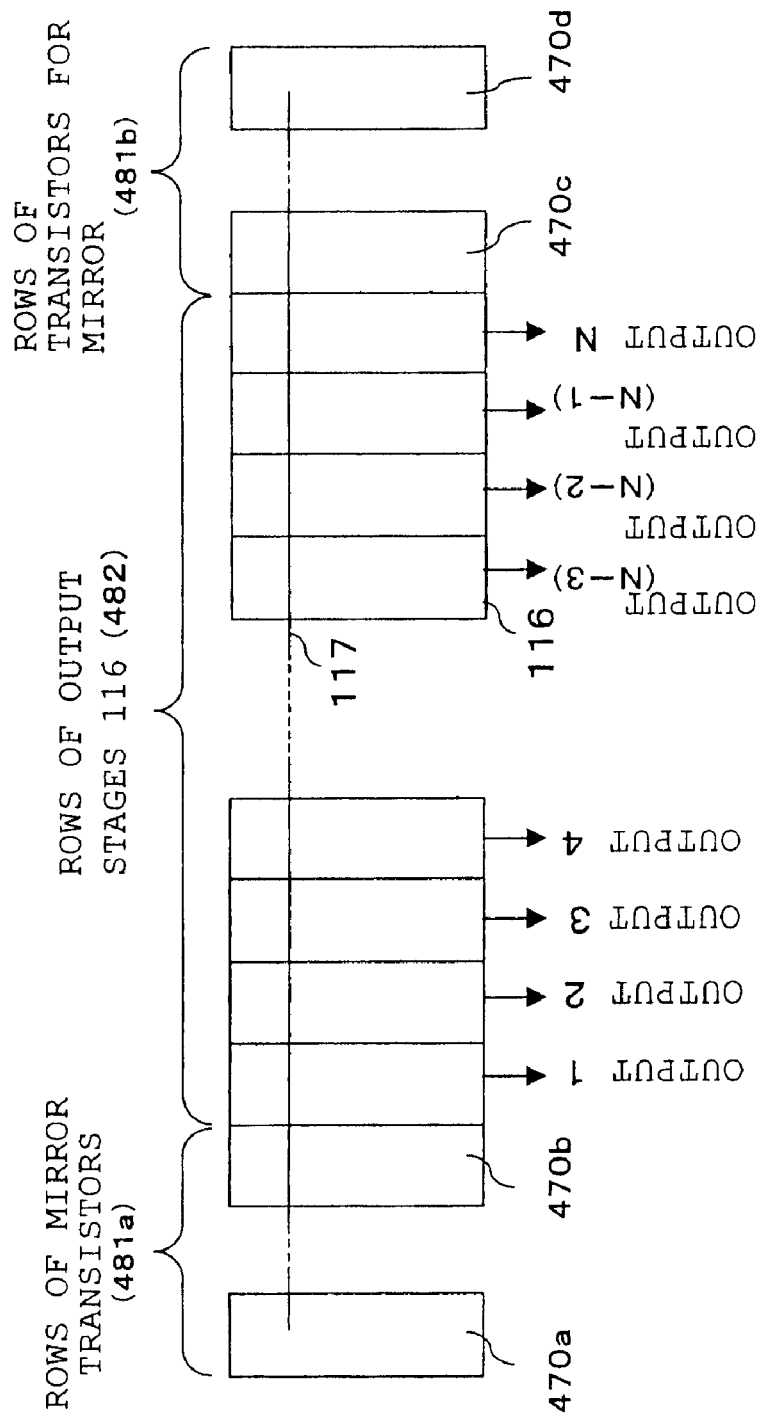
FIG. 48 is a schematic diagram of a layout of distributing mirror transistors and current output stages.

For example, in the case of a driver IC with 63 gradation display and 160 outputs, sixty-three transistors 113 are arranged in one output. An output stage, in which sixty-three transistors 113 are arranged, is prepared by the number of outputs, that is, 160. Moreover, nine output stages are prepared at both ends of the 160 outputs, respectively, and drain gates of the transistors are shorted, whereby sixty-three mirror transistors 112 are formed. A circuit in this case is shown in FIG. 47. Consequently, since a current mirror can be formed with a substantially identical layout and in an identical channel size, fluctuation of a mirror ratio among the chips can be reduced. A ratio of a channel total area of a distributing mirror transistor and a channel total area of a current source for gradation display in this case is 18/160=0.11, and a luminescent line and a black line do not occur. In general, it is desirable to arrange rows of transistors for mirror and rows of output stages 116 in the case of N outputs as shown in FIG. 48. The numbers of rows 481a and 481b of the transistors for mirror are equal and arranged in a range shown in FIG. 45 according to the number of output stages.

Figure 49:
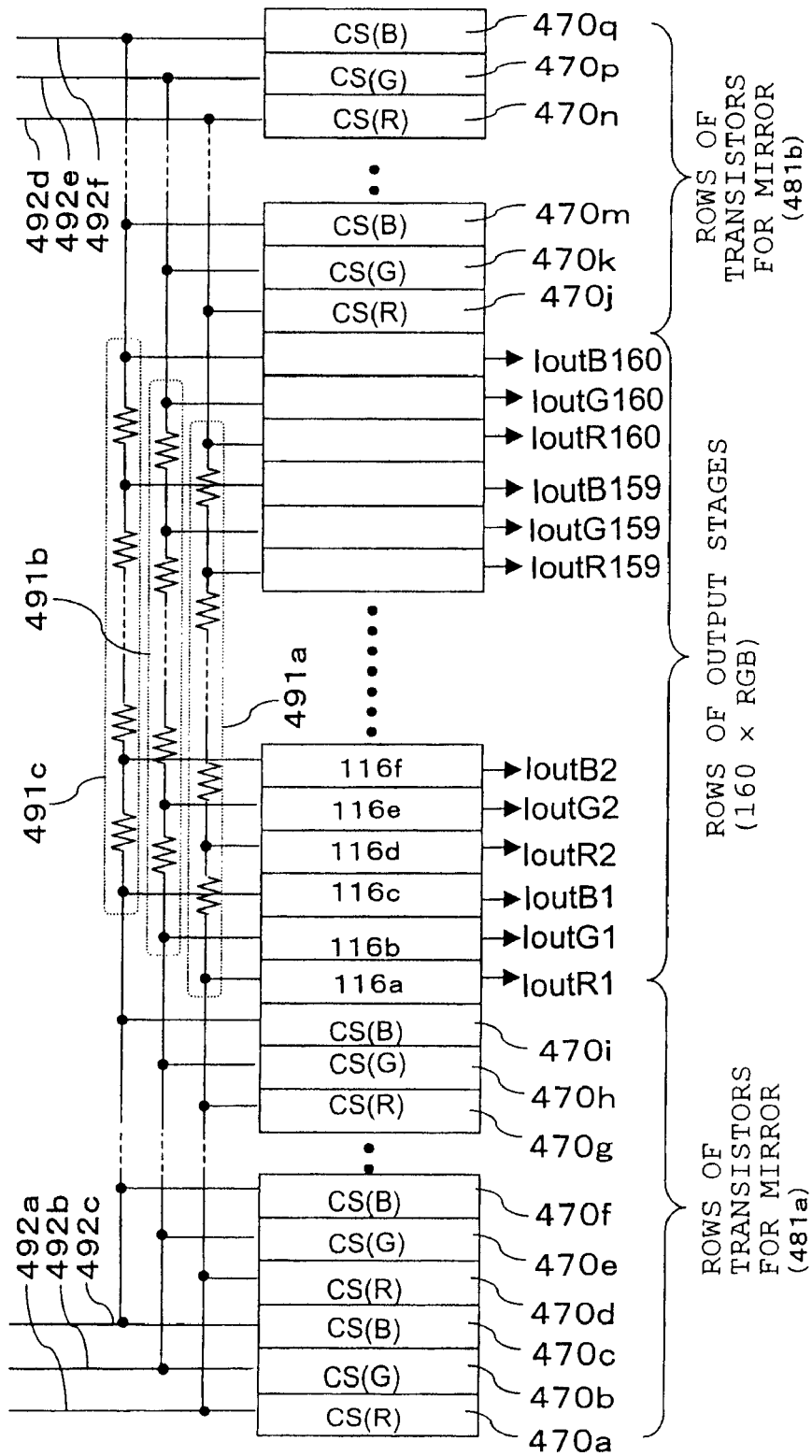
FIG. 49 is a schematic diagram of a layout of distributing mirror transistors and current output stages in a driver IC of performing multicolor display.

In FIG. 48, the arrangement is shown in the case of monochrome. However, in a color panel, an arrangement as shown in FIG. 49 is adopted. In this example, red, green, and blue were used as three primary colors, and a common gate line and a distributing mirror transistor were prepared independently for each color such that a current per one gradation could be set independently for each color. R, G and B are affixed to the ends of reference characters for circuits for red display, circuits for green display, and circuits for blue display, respectively. As the common gate signal lines, 491a, 491b, and 491c were prepared for red display, green display, and blue display, respectively. Consequently, since a gate potential of the current source for gradation display 113 can be set to a different value for each color, it becomes possible to adjust white balance and a maximum luminance according to a current-luminance characteristic and chromaticity coordinates value of a display element to be used. A reference current is inputted from two positions on the left and right for each color, that is, six positions in total. Three times as many reference current generation units are prepared.

In the rows 481 of the transistors for mirror consisting of plural distributing mirror transistor groups 470 for an identical color, the transistors are arranged with three primary colors of red, green, and blue as one set, and the number of sets are increased rather than arranging the transistors as a set for each color as shown in FIG. 49. Consequently, since the transistors arranged over a wide range, it becomes possible to reduce influence of a local change of a threshold voltage. In addition, deviation of a mirror ratio for each color is also eliminated. In FIG. 49, the transistors indicated by CS(R) belong to the distributing mirror transistor group 470 for red display, the transistors indicated by CS (G) belong to the distributing mirror transistor group 470 for green display, and the transistors indicated by CS (B) belong to the distributing mirror transistor group 470 for blue display.

Next, a second method will be explained.

The second method is a method of reducing an amount of change of the drain voltage of the current source for gradation display 113 which causes fluctuation of a voltage of the common gate line 117. By reducing the amount of change, it becomes possible to reduce an amount of change of the gate line 117, which changes a capacitive coupling, as well.

Figure 50:
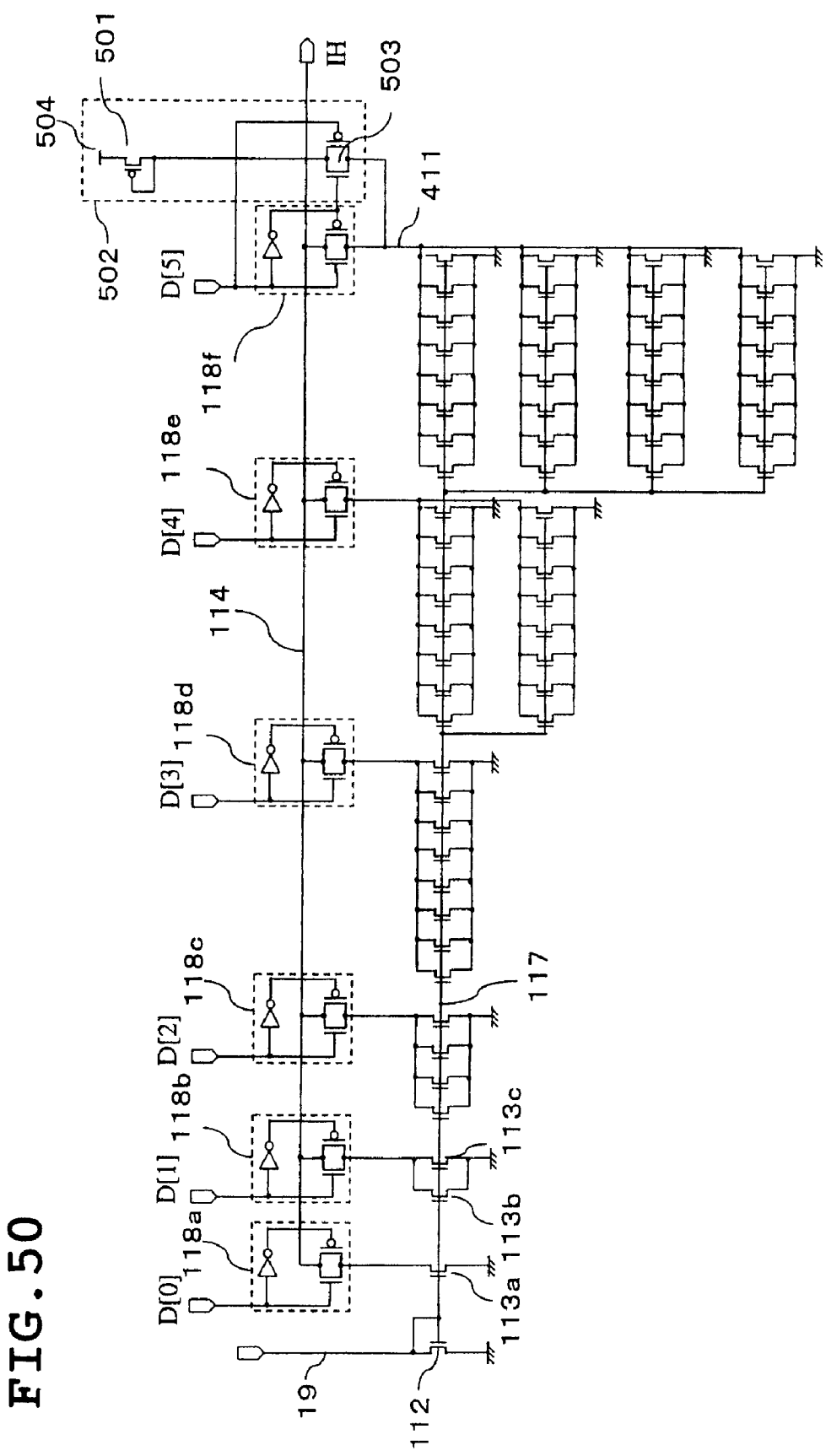
FIG. 50 is a diagram showing a digital/analog conversion unit in the case in which a transistor is added in order to control an amount of potential change at a node 411.

A circuit of the digital/analog conversion unit 116 and the distribution transistor for one output is shown in FIG. 50. In this example, gradation data is assumed to be six bits. It is a characteristic of the present invention that a circuit indicated by 502 is added. Switches 118$f$ and 503 are complementarily operated, whereby the node 411 is connected to a source signal line or a transistor 501, and it becomes possible to always flow a current to the current source for gradation display 113.

In a conventional method, when the switch 118 comes into a non-conduction state, since the transistor 113 attempts to flow a current regardless of the fact that there is no current path through which a current flows to the transistor 13, a drain voltage is reduced. As a result, a potential of 411 falls to a ground potential of a driver IC in a case in which the potential is the lowest.

Figure 51:
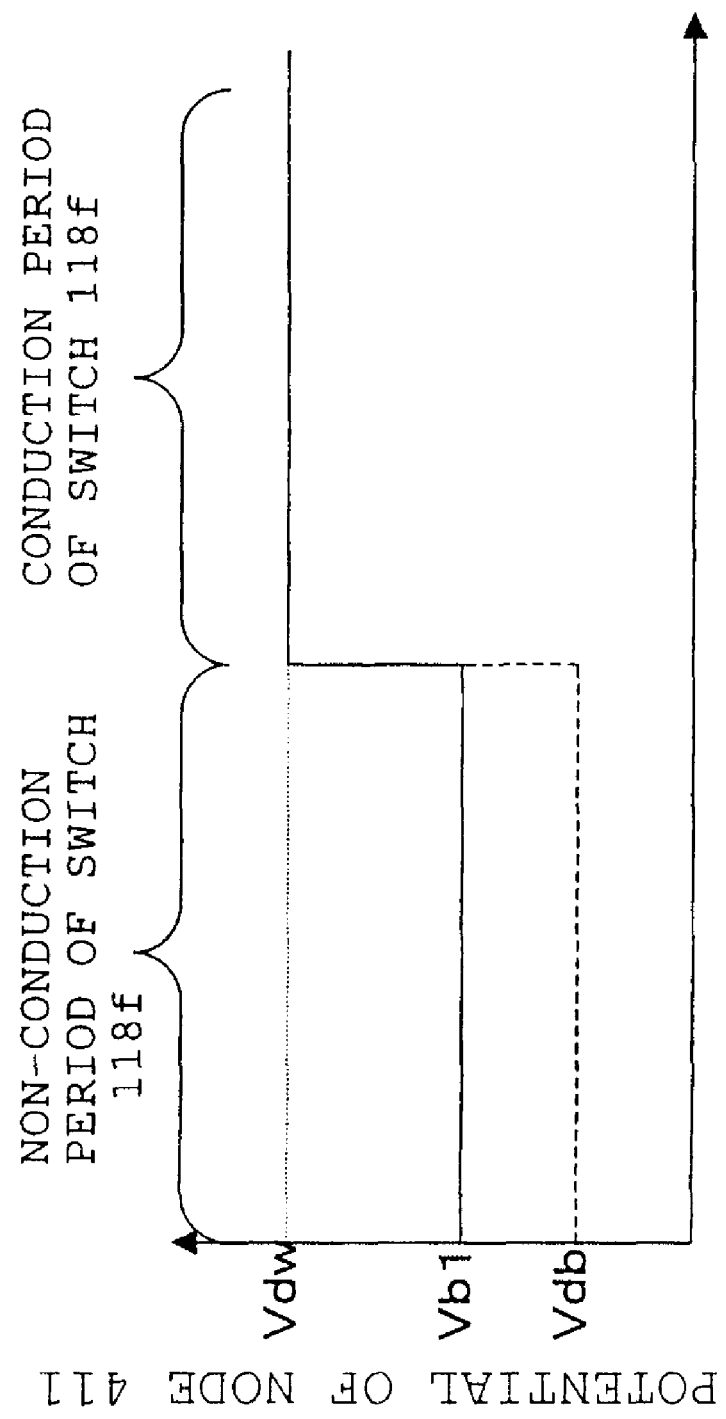
FIG. 51 is a diagram showing a relation between a switch 118f and a potential of the node 411.

On the other hand, in this embodiment, even if the switch 118 is non-conductive, the switch 503 comes into a conduction state, and a current is supplied from the power supply 504 to 113 via the transistor 501. It is possible to increase a voltage of 411 in which case to a potential of Vb1 shown in FIG. 51, although depending upon a channel size of the transistor 501 and a voltage of the power supply 504 (a conventional potential is Vdb. Here, Vb1>Vdb). Consequently, a change of a potential of the node 411 due to ON/OFF of the switch 118 decreases, whereby it becomes possible to reduce fluctuation of a potential of the common gate line 117 which fluctuates via a stray capacitor.

There is more effect if a gate voltage to drain current characteristic of the transistor 501 connected as a diode is made uniform with that of the drive transistor 72 used in the pixel 74, or a transistor size with which a gate potential further falls is adopted.

In the case in which a current is supplied to the pixel 74 from the source driver IC 17, an equivalent circuit of the pixel is changed as shown in FIG. 24 by an operation of the gate signal line 61. A drain electrode of the driver IC 17 is connected to the power supply 64 via the source signal line 60 and the drive transistor 72. It is seen that, in this case, a circuit of a part indicated by 502 and the circuit of the pixel 74 have an identical structure except a capacitor. (Since it is unnecessary to retain a gate voltage, a capacitor is unnecessary in the circuit of 502.) Therefore, if the power supplies 501 and 64 as well as the transistors 72 and 501 can be formed with identical characteristics, it can be expected that a potential of the node 411 is substantially uniform.

A potential of the source signal line changes according to a gradation. A lowest voltage is at the time of white (highest gradation), and a highest voltage is in the case of a gradation 1. The potential changes between the lowest voltage and the highest voltage according to a gradation. Therefore, if a potential of 411 at the time when the switch 118$f$ is in a non-conduction state and 503 is in a conduction state is set within a range of a change of a voltage of the source signal line, a change of the potential at the time when the switch 118$f$ comes into a conduction state can be reduced. In the case of FIG. 50, a transistor size of 501 is designed such that a voltage of 411 is within a range of a change in the source signal line when a current corresponding to a gradation 32 flows to 501.

In FIG. 50, a case in which the added circuit 502 is connected to a most significant bit at the time of six bit gradation data is illustrated. However, in general, if a transistor size of the transistor 501 in the added circuit 502 only has to be designed such that a gate voltage of the transistor 501 is within a variable range of a voltage, which the source signal line 60 could take, when a current of a gradation (here, denoted by K), which matches the number of transistors connected to a signal line to which the added circuit 502 is connected, flows to 501, it becomes possible in general to control a change of a drain voltage of a transistor which outputs the gradation K of J bit gradation data.

Therefore, in the case of FIG. 50, a circuit like 502 may be used for signal lines from D[0] to D[4] as well.

Figure 52:
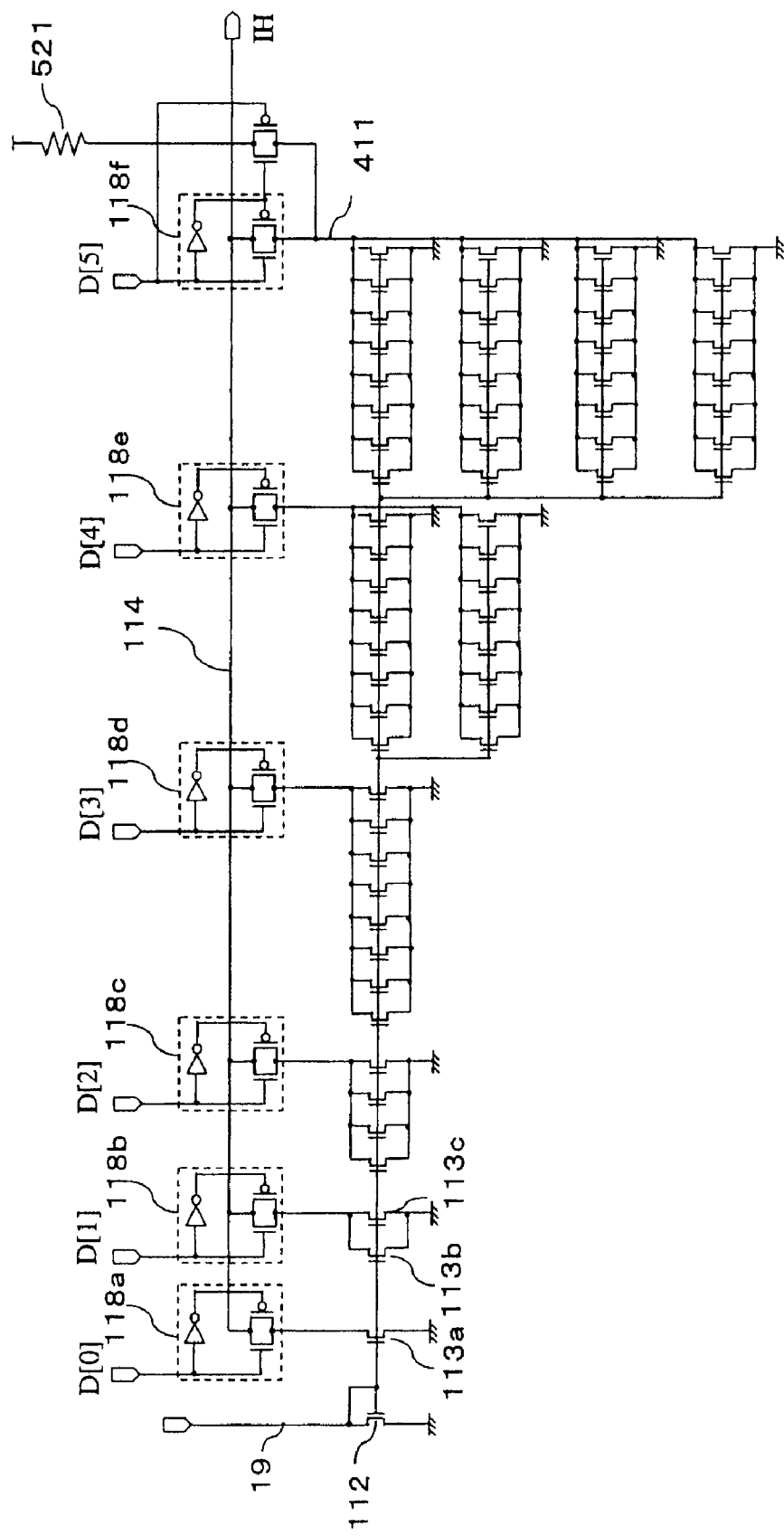
FIG. 52 is a diagram in the case in which a resistor is used instead of the transistor in FIG. 50.

In addition, as shown in FIG. 52, the circuit can be realized in the same manner if a resistance element 521 is used instead of the transistor 501. Further, if a circuit structure, in which a current always flows to the transistor 113 even if the switch 118$f$ comes into a non-conduction state, can be adopted, an element other than a resistor and a transistor may be used.

Next, a third method will be explained.

Figure 53:
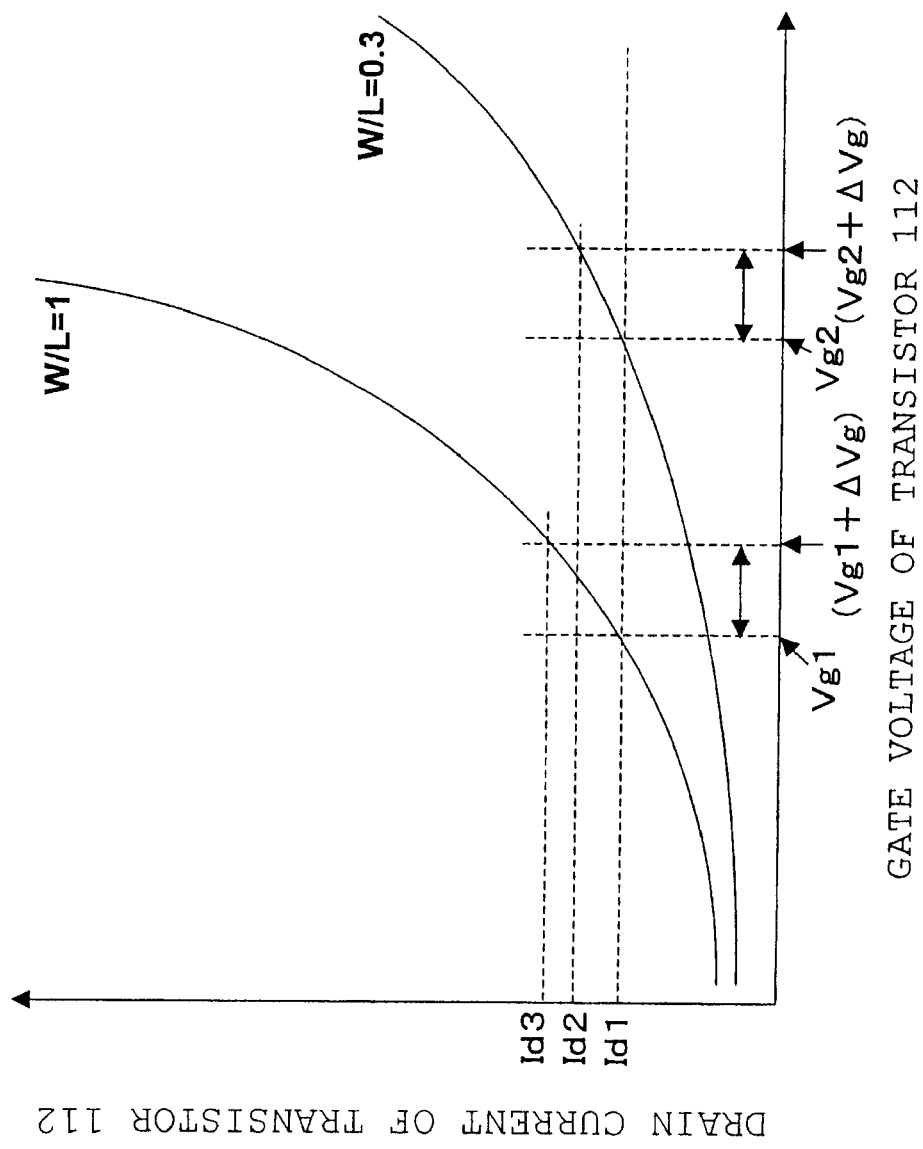
FIG. 53 is a diagram showing a relation between a gate voltage and a drain current of a transistor 32 to which gate and drain electrodes are connected.

When a channel width/a channel length (hereinafter referred to as W/L) of the mirror transistor 112 of distributing a reference current is changed, a characteristic of a drain current versus a gate voltage characteristic changes. As shown in FIG. 53, when W/L is reduced, a change of the drain current with respect to a change of a gate voltage decreases.

Now, a value of the reference current 19 is assumed to be Id1. In this case, it is assumed that the common gate line 117 (here, matching a gate voltage of the transistor 112) has changed by ΔVg at a point of a change in gradation data. As shown in FIG. 53, the change of the drain current is smaller with W/L=0.3 compared with the case of W/L=1. Since a transistor 32 and a transistor 33 form a current mirror, this change of the drain current corresponds to a change of an output current of the transistor 113. If the change of the drain current is small, appearance of a luminescent line and a black line can be prevented even if a voltage of the common gate signal line 117 changes.

Thus, as shown in FIGS. 54 (*a*) and (*b*), respectively, a rate of change of an output current with respect to a difference of W/L was measured. (A channel area was fixed.) As a result, the change of the output current is within 1% with respect to fluctuation of a voltage of the gate line 117 when W/L is 0.6 or less. If an amount of current change is within 1%, a change of luminance cannot be visually recognized. Thus, a difference of luminance of white in the part indicated by 394 in FIG. 39 and the other parts is unclear, a luminescent line is unseen. The same is true for a black line.

Figure 55:
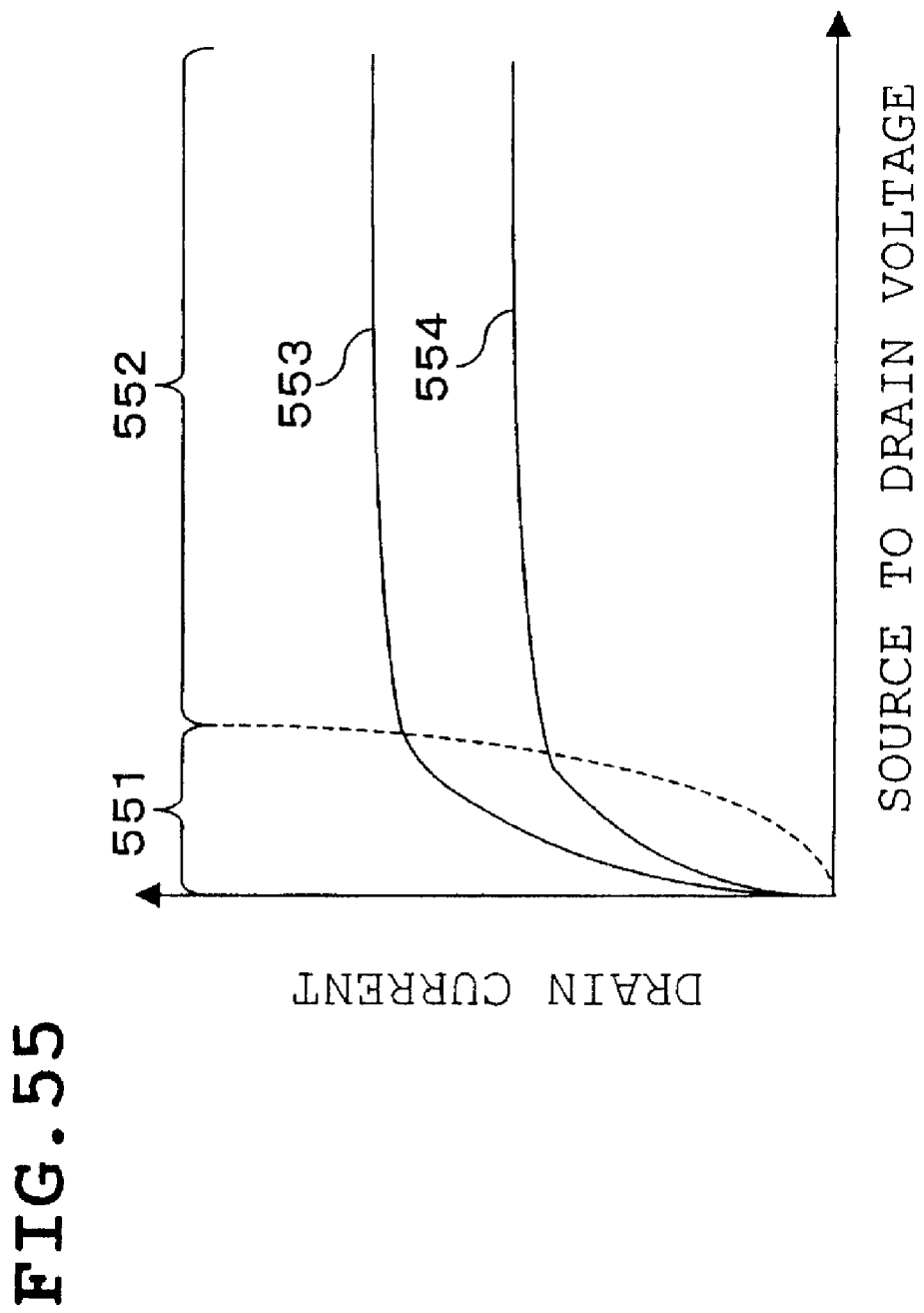
FIG. 55 is a diagram showing a relation between a source to drain voltage and a drain current of a transistor 113.

When a value of W/L is reduced, a gate voltage necessary for obtaining an identical drain current rises. When W/L decreases to 0.01 or less, the gate voltage exceeds 1.5 V. A characteristic of a drain current versus a source to drain voltage of the current source for gradation display 113 (at the time when a current flowing to one current source for gradation display 113 is about 10 nA to 100 nA) is indicated by curves 553 and 554 of FIG. 55. Regardless of a load of an output, it is necessary to operate the transistor 113 in a saturation region indicated by a range 552 further to the right than a dotted line part in order to output a fixed current. In order to operate the transistor 113 in the saturation region, a drain voltage higher than a gate voltage of the transistor 113 is necessary. Therefore, when W/L decreases to 0.01 or less in FIGS. 54(a) and (b) and a gate voltage of 1.5 V or more is required, a drain voltage of 1.5 V is also required. If an operation margin is taken into account, a drain voltage of about 2 V is required. Moreover, a source signal line voltage (=a drain voltage of 113) is different according to a gradation signal, and an amplitude necessary for white to black levels is about 2 V. In addition, there is a voltage loss due to a wiring resistance and a switching ON resistance. In total, a necessary voltage is about 5 V. As the driver IC 17, a withstanding voltage of a voltage level of this order is necessary.

On the other hand, in order to reduce a chip size of the driver IC 17, a micro process is used. For a cellular phone, functions of a memory and a controller are further provided inside the driver IC 17. Since the micro process is used, a withstanding voltage cannot be set large and can be increased up to about 5 V at the most realistically.

From such a viewpoint, a lower limit value of W/L is determined by a withstanding voltage of an IC and cannot be reduced to be less than 0.01. As a range which W/L can take, 0.01 or more and 0.6 or less is desirable as indicated by a range 541 of FIG. 54. In this range, a luminescent line and a black line do not occur, and an effect of reduction of a chip size by a micro rule can be expected.

Note that the first to the third methods may be implemented in combination. By combining the methods, there is an effect that an operation margin increases, and a luminescent line and a black line appear less easily.

Figure 21:
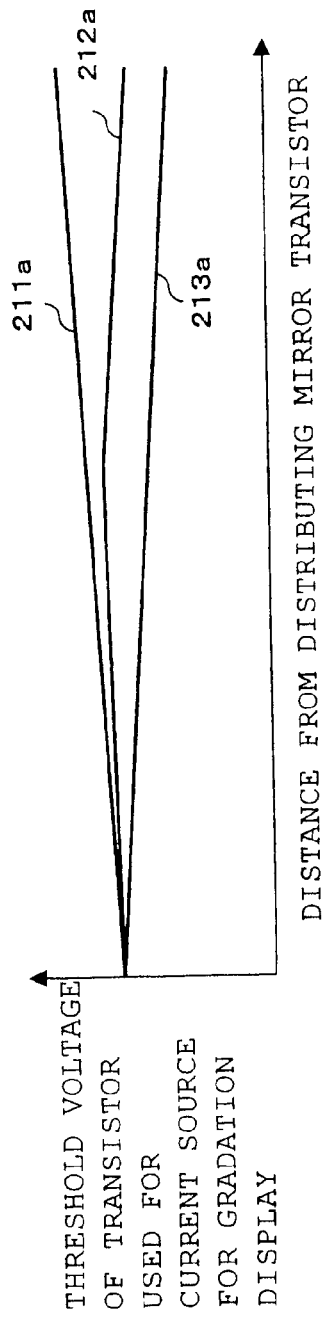
FIG. 21 is a diagram showing a distribution of a threshold voltage of a transistor in an identical IC chip and dependency on a distance from a distributing mirror transistor of an output current value following the distribution.
Figure 21:
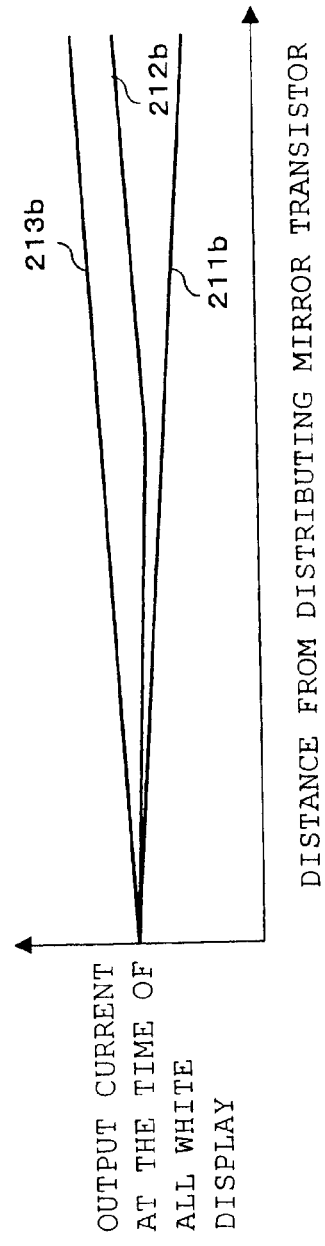
Figure 22:
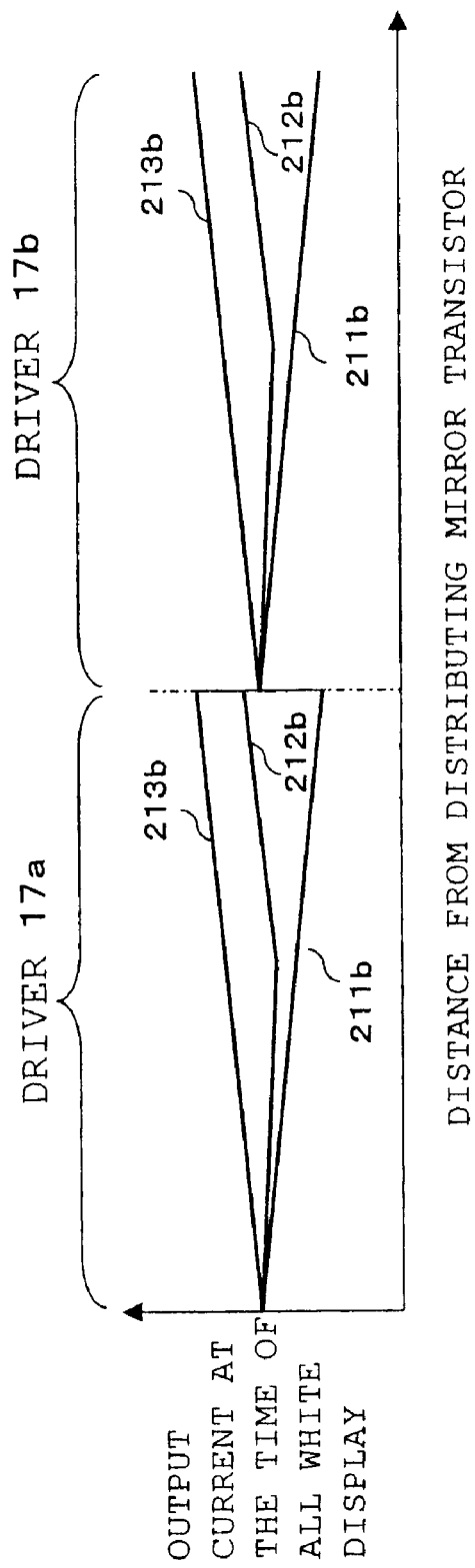
FIG. 22 is a diagram showing each output current value at the time when two driver ICs having the output characteristic of FIG. 21(b) are connected.
Figure 56:
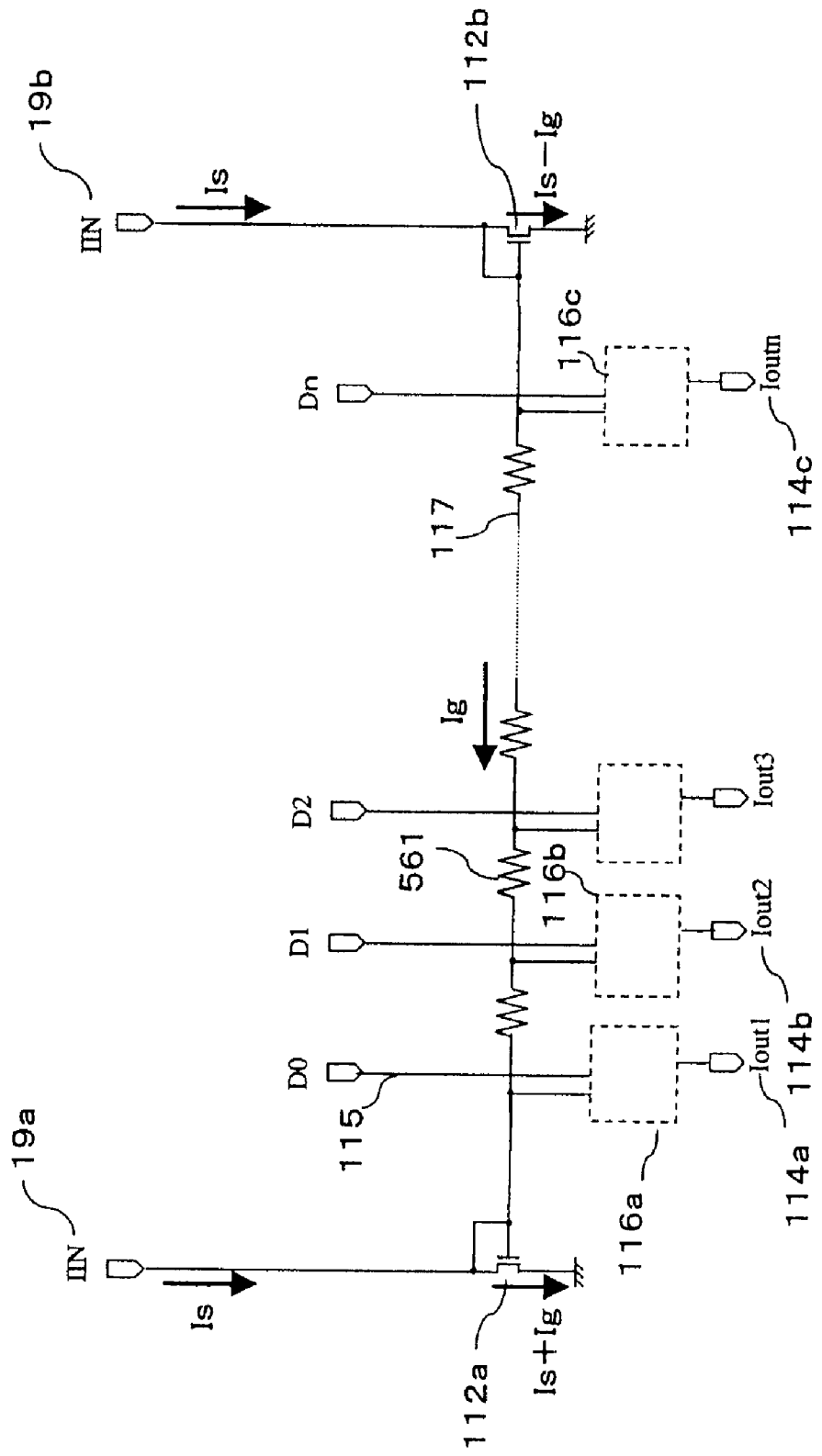
FIG. 56 is a diagram showing a relation among a reference current, a gate current, and a current flowing in a distributing mirror transistor in a structure of a current output stage in the embodiment of the present invention.

In the embodiment of supplying the reference current 19 from both sides in order to compensate for a change of a threshold voltage of a transistor in a wafer as shown in FIG. 34, when there is a change of the threshold voltage of the transistor as shown in FIG. 21(a), a potential is high on the right side of the common gate signal line 117 and is low on the left side. Then, as shown in FIG. 56, a current Ig flows to the common gate line 117. A drain current of the distributing mirror transistor 112 arranged on the left and right changes, and Is+Ig in the mirror transistor 112a because a current flowing in from a common gate increases, and Is−Ig in the mirror transistor 112b.

Figure 57:
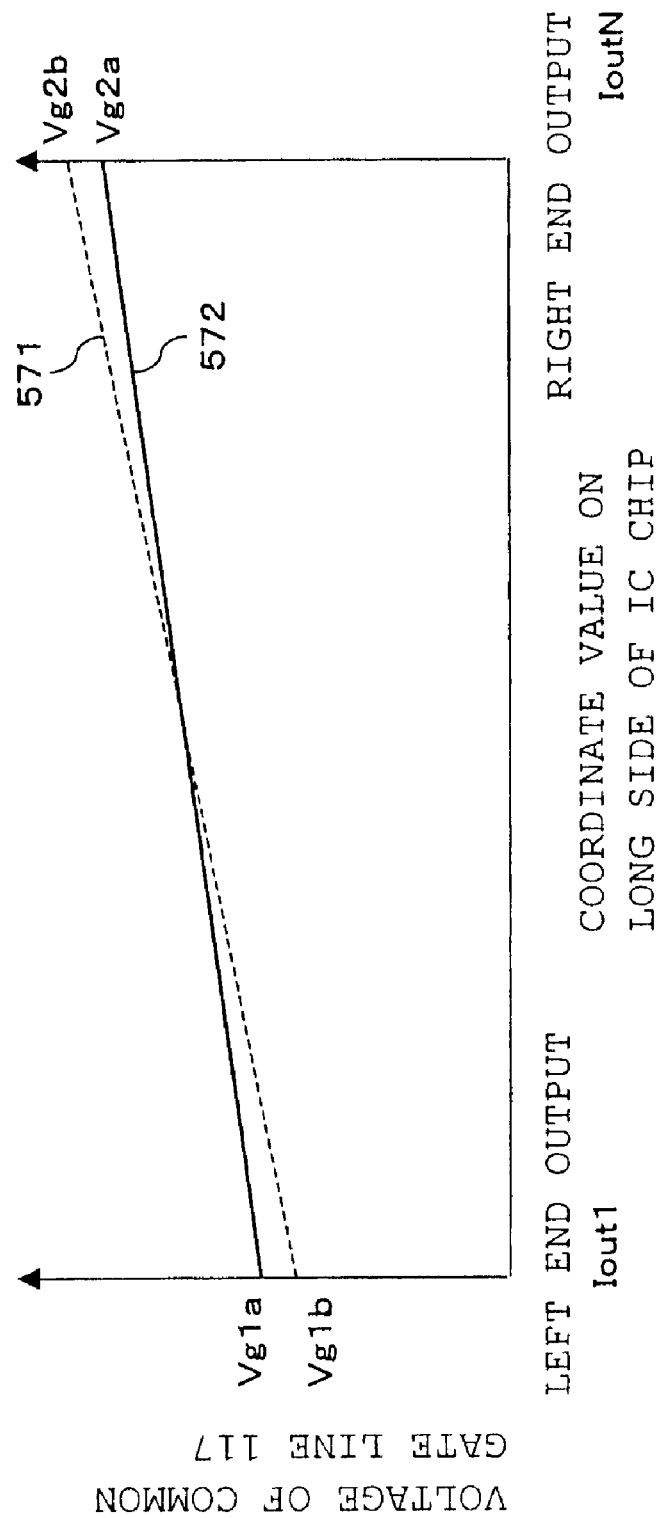
FIG. 57 is a diagram showing a voltage distribution of a common gate line at each output in the case in which a current flows to the common gate line and in the case in which a current does not flow to the common gate line.

Since the drain current has changed, the common gate line 117 changes, a voltage on the left side where the drain current has increased rises, and a voltage on the right side where the drain current has decreased falls. As a result, a voltage of the common gate line 117 changes as indicated by a straight line 572 compared with the case in which Ig does not flow (straight line 571) as shown in FIG. 57.

Figure 58:
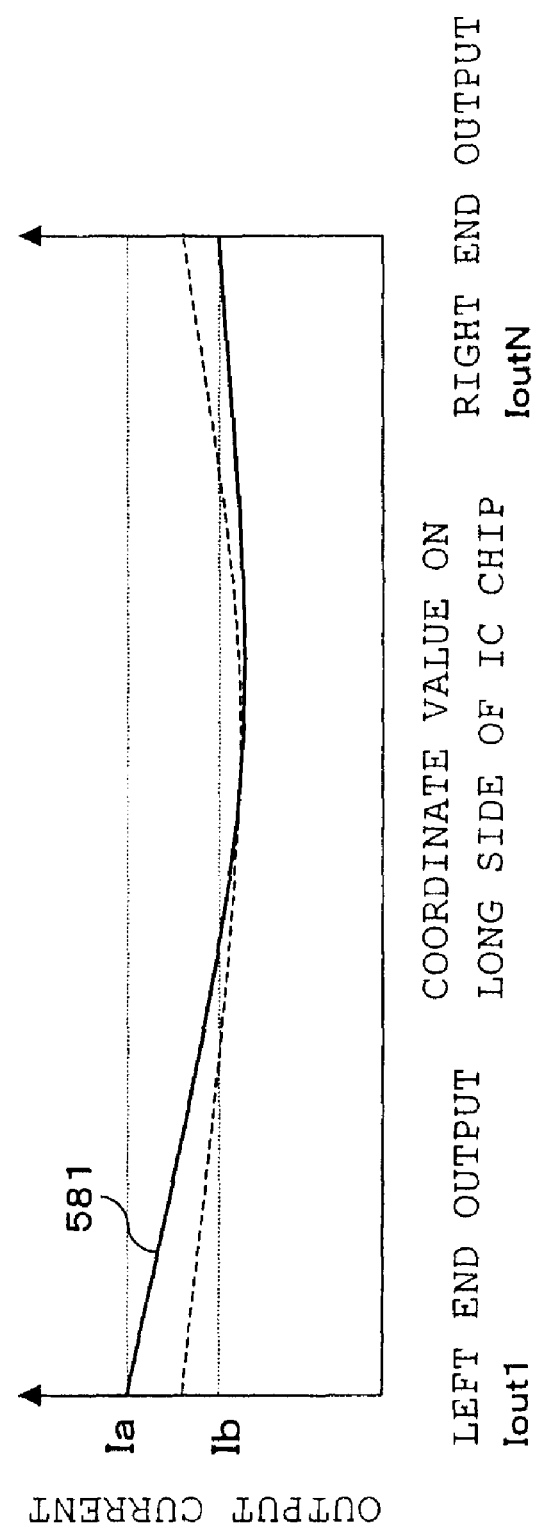
FIG. 58 is a diagram showing a distribution of an output current at each terminal in the case in which a current flows to a common gate signal line.

Consequently, as indicated by a curve 581 of FIG. 58, an output current at both the ends increases by an increase of a gate voltage to be Ia at the left end and decreases by a decrease of a gate voltage to be Ib at the right end. A difference of Ia−Ib is caused at both the ends. When plural driver ICs 17 are used to perform display in this state, it is likely that, in boundaries of the driver ICs 17, the boundaries are seen according to an amount of Ia−Ib.

In order to distribute the reference current 19 to an output stage more accurately, it is preferable that the output stages 116 and the distributing mirror transistor groups 470 are arranged as shown in FIG. 48. A structure of the output stage 116 and a structure of the distributing mirror transistor group 470 in the case of a driver of performing six bit output are shown in FIGS. 35 and 47, respectively (other than six bits, the same effect is obtained if transistors 471 are arranged to agree with the number of the transistors 113).

FIGS. 35 and 47 are different only in presence or absence of the switches 118 in drains of sixty-three n type transistors. Thus, if the transistors 113 and 471 are laid out in a same arrangement, it is possible to make a mirror ratio more accurate. In the case in which a mirror ratio of a reference current and an output current is changed, the number of the distributing mirror transistor groups 470 to be arranged only has to be changed.

For example, in the case one distributing mirror transistor group 470 is arranged on both the sides, respectively, that is, two distributing mirror transistor groups 470 are arranged in total, a ratio of the output current with respect to the reference current value at the time of sixty-three gradation display is one. In the case five distributing mirror transistor groups 470 are arranged on both the sides, respectively, that is, ten distributing mirror transistor groups 470 are arranged in total, the ratio is 1/5. Note that, since it is necessary to make the left and right output current values the same, it is necessary to make the number of distributing mirror transistor groups 470 constituting the rows 481a of the transistors for mirror and the number of the distributing mirror transistor groups 470 constituting rows 481b of transistors for mirror identical of FIG. 48.

In addition, a method of controlling a value of (a channel total area of the distributing mirror transistor 112)/(a channel total area of the current source for gradation display 113) to be within the range of FIG. 45 can be realized by adjusting the number of the distributing mirror transistor group 470 constituting the rows 481 of the transistors for mirror in the same manner.

In FIG. 48, the arrangement is shown in the case of monochrome. However, in a color panel, an arrangement as shown in FIG. 49 is adopted. In this example, red, green, and blue were used as three primary colors, and a common gate line and a distributing mirror transistor were prepared independently for each color such that a current per one gradation could be set independently for each color. R, G and B are affixed to the ends of reference characters for circuits for red display, circuits for green display, and circuits for blue display, respectively. As the common gate signal lines, 491a, 491b, and 491c were prepared for red display, green display, and blue display, respectively.

Consequently, since a gate potential of the current source for gradation display 113 can be set to a different value for each color, it becomes possible to adjust white balance and a maximum luminance according to a current-luminance characteristic and a chromaticity coordinates value of a display element to be used. A reference current is inputted from two positions on the left and right for each color, that is, six positions in total. Three times as many reference current generation units are prepared.

In the rows 481 of the transistors for mirror consisting of plural distributing mirror transistor groups 470 for an identical color, the transistors are arranged with three primary colors of red, green, and blue as one set, and the number of sets are increased rather than arranging the transistors as a set for each color as shown in FIG. 49. Consequently, since the transistors arranged over a wide range, it becomes possible to reduce influence of a local change of a threshold voltage. In addition, deviation of a mirror ratio for each color is also eliminated. In FIG. 49, the transistors indicated by CS(R) belong to the distributing mirror transistor group 490 for red display, the transistors indicated by CS(G) belong to the distributing mirror transistor group 490 for green display, and the transistors indicated by CS(B) belong to the distributing mirror transistor group 490 for blue display.

Incidentally, in order to prevent left and right output current values from deviating from each other, the current Ig flowing to the common gate line 117 shown in FIG. 56 is reduced. If a deviation of drain currents of the distributing mirror transistor 112 on the left and right is within 1%, deviation of an output is also within 1%. Thus, boundaries of the driver ICs 17 are not recognized. That is, a value of (Is+Ig)−(Is−Ig)=2×Ig only has to be 1% or less with respect to Is.

Figure 60:
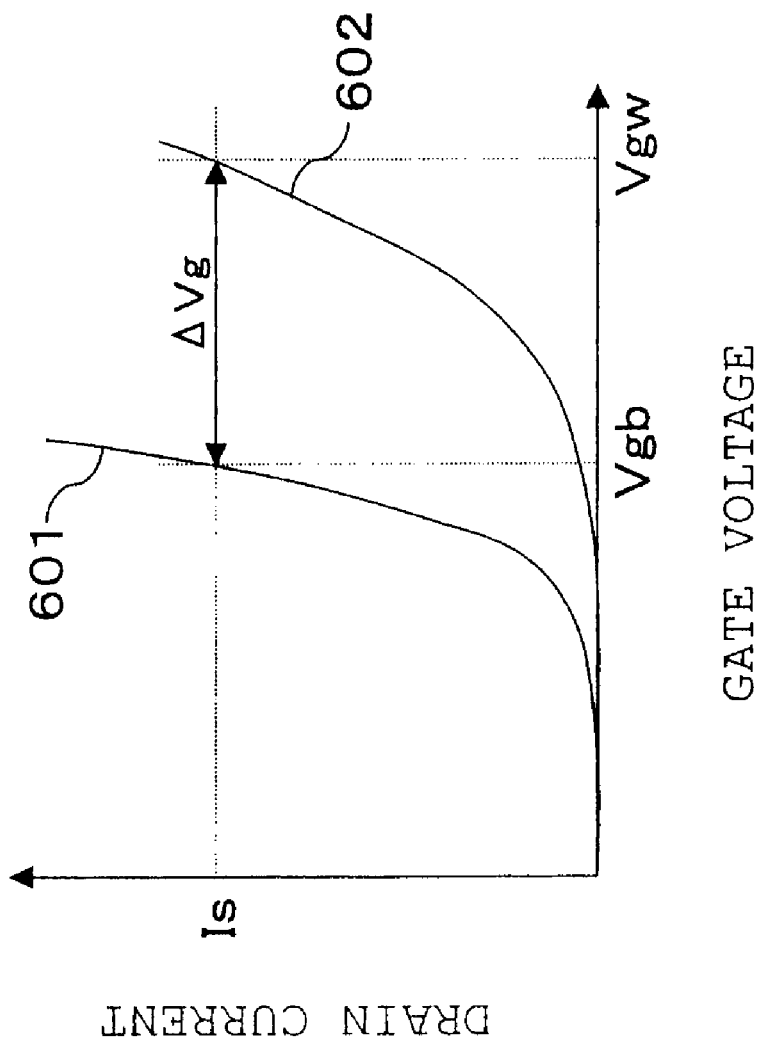
FIG. 60 is a diagram showing characteristics of a gate voltage and a drain current of a distributing mirror transistor.

From the Ohm's law, Ig takes a value found by dividing a potential difference between both the ends of the common gate line 117 by a resistance value. Since it is better that Ig is smaller, it is necessary to regulate a maximum value. Ig is maximized when the potential difference between both the ends of the common gate line 117 is maximized and in the case in which one of the left and right distributing mirror transistors 112 has a low threshold value and high mobility, and the other has a high threshold value and low mobility. In this case, since one of the left and right distributing mirror transistors 112 has a minimum gate voltage and the other has a maximum gate voltage, the difference increases. A gate voltage–drain current characteristic of the distributing mirror transistor 112 is shown in FIG. 60. Here, 601 indicates a characteristic of a low threshold value and high mobility, and 602 indicates a characteristic of a high threshold value and low mobility. As shown in FIG. 56, when a reference current Is is flown to a transistor having the characteristics of 601 and 602, a gate voltage of 601 is Vgb, and a gate voltage of 602 is Vgw. Then, a voltage applied to the common gate line 117 is ΔVg=(Vgb−Vgw). Therefore, Ig=(Vgb−Vgw)/Rg. Here, Rg is a total resistance value of the common gate line 117.

Since a condition for preventing the boundaries of the driver ICs 17 from being visible is (2×Ig)≦(Is×0.01), after all, the total resistance value Rg of the common gate line 117 and the reference current Is are required to have a relation as described below. (Vgb−Vgw)/Rg≦(Is×0.005)

Figure 59:
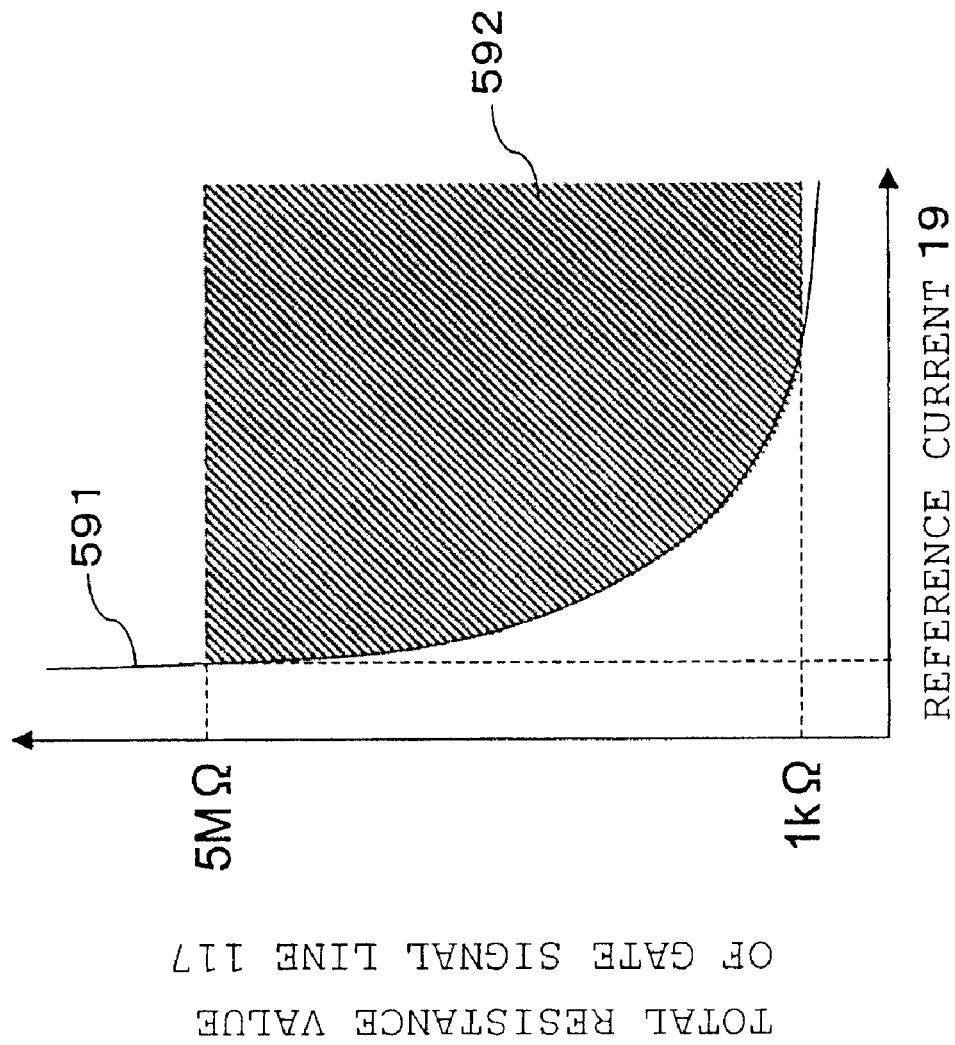
FIG. 59 is a diagram showing a range of a resistance value, which is necessary for a gate signal line, with respect to a reference current value.

Here, Vgb and Vgw are known in advance because these are determined according to a use process. Thus, if a reference current is determined, a necessary gate resistance value is determined. A range of a total resistance value of the gate signal line 117, which could be taken with respect to the reference current 19, is shown in FIG. 59. In order to eliminate the boundaries of the driver ICs 17, the total resistance value is required to be within a range 592.

A minimum value of the total resistance value is a larger one of a value satisfying (Vgb−Vgw)/Rg≦(Is×0.005) and 1 KΩ. This is because it is difficult to reduce the total resistance value to 1 kΩ or less due to a resistance of a contact of a common gate line, a wiring resistance, and the like. (Even if this could be realized, cost increases because a circuit size becomes larger.)

Figure 61:
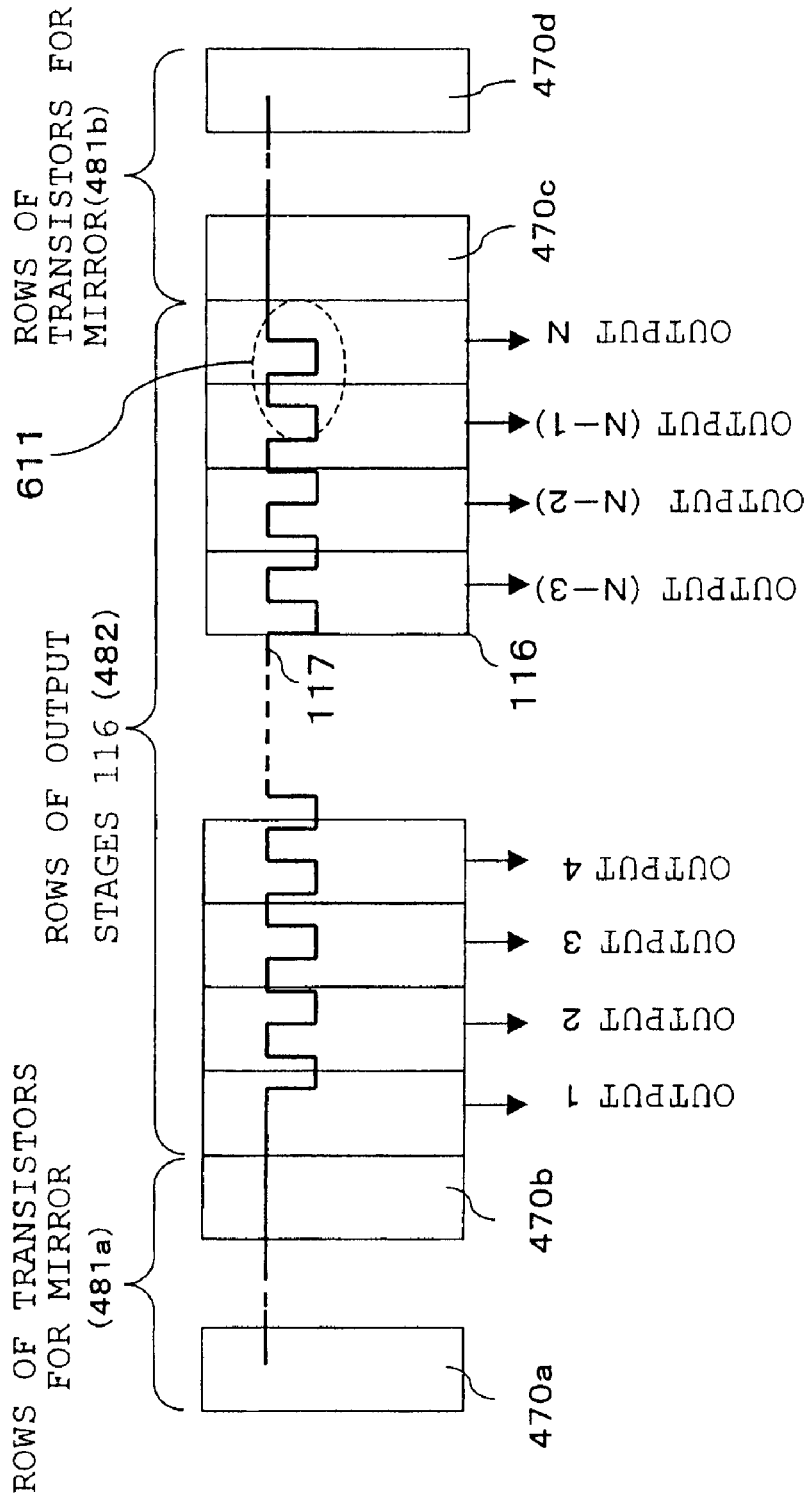
FIG. 61 is a diagram showing an example of a wiring method for increasing a resistance of a gate signal line.

In addition, since Ig decreases as a resistance value is larger, a difference between the left and the right is eliminated, but 5 MΩ is the maximum. In relation to a realizable maximum sheet resistance value, if it is attempted to increase a resistance value of the gate signal line 117 to 5 MΩ or more, as shown in FIG. 61, the gate signal line 117 is required to be made long by providing bent portions 611 formed by bending parts of wiring of the common gate line 117. In addition, if the resistance value of the gate line increases, the gate line is susceptible to noises. In addition to susceptibility to noises, since a wiring length is secured, if the gate line is wired as shown in FIG. 61, the gate line becomes like an antenna and easily picks up noises. If a potential of the gate signal line 117 fluctuates due to noises, an output current is affected. Therefore, 5 MΩ, which is a maximum resistance value to be obtained even if the wiring is not bent as shown in FIG. 61, is a maximum value.

From the above, it is possible to prevent unevenness of boundaries among chips due to a difference of currents at both ends of a chip by setting the resistance value of the gate line 117 in a region of 592 with respect to the reference current 19. Note that the above-described each numerical value is a practical value and may include a predetermined error such of, for example, a few %.

With the structure of the output stage as described above, fluctuation of currents at the left and right ends of the driver IC 17 decreases, and display without block unevenness, which occurs in boundaries of chips, is possible.

In the above-described method, the resistance element 301 in the reference current generation unit for generating a reference current is formed of a component externally attached to the driver IC 17. In order to reduce the number of packaged components and simplify wiring of an array, incorporation of a resistance element is necessary. In this embodiment, next, a structure has been devised in which fluctuation of the reference current 19 is also reduced in the case in which this resistance element 301 is incorporated.

Figure 62:
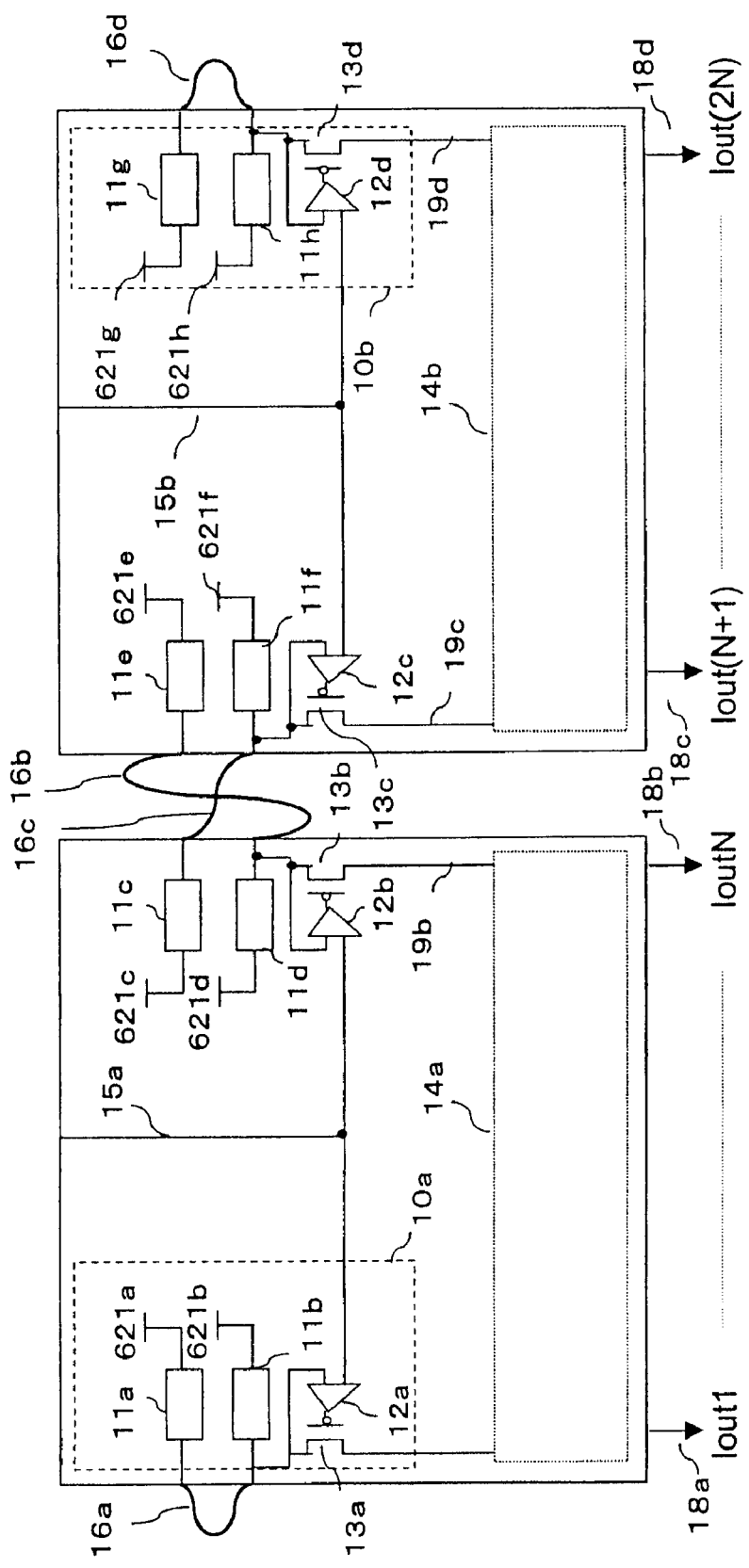
FIG. 62 is a diagram showing an example in which resistance elements are connected in parallel to perform cascade connection in a second embodiment.

In order to reduce the fluctuation of the reference current 19, structures of FIGS. 1 and 62 have been devised.

FIG. 1 showing a first method will be explained.

In the method of FIG. 1, in order to form two reference current sources in a chip, components shown in FIG. 30 are incorporated in the chip by the number of two, respectively. In addition, the resistance element 301 is divided into two parts, and there are four parts in total (11*a* to 11*d*). Although a resistor is often externally attached due to a problem of accuracy of a resistance value, a structure of incorporating a resistor is adopted in this embodiment. It is possible to reduce the number of externally attached components and reduce cost and a packaging area.

In the case in which one driver IC 17 is used, or in the case in which plural chips are used and a driver IC is not adjacent to the other driver ICs, it is assumed that a current source adopts a structure indicated by 10*a* of FIG. 1.

A structure of a current source in the case in which two driver ICs 17 are in contact with each other is like a structure of two current sources shown in the center of FIG. 1. One of the two necessary resistance elements 11 is taken in from different ICs 17 by the external wiring 16. A constant current source circuit at a right end of a driver 17*a* is shown in FIG. 66(*a*), and a constant current source circuit at a left end of a driver 17*b* is shown in FIG. 66(*b*). Reference numerals affixed to components of FIG. 66 correspond to those in FIG. 1.

One resistance element 11 is brought from both the ICs 17 adjacent to each other, respectively. In FIG. 66(*a*), a resistance element 11*d* is from the IC 17*a*, and a resistance element 11*e* is from the IC 17*b*. In addition, in FIG. 66(*b*), a resistance element 11*c* is from the IC 17*a*, and a resistance element 11*f* is from the IC 17*b*. When a resistance value of the resistance element 11 is defined as shown in FIG. 66, a current (I19*b*) flowing to 19*b* is Vstd1/(R1+R2), and a current (I19*c*) flowing to 19*c* is Vstd2/(R3+R4). Since reference current signal lines of 15*a* and 15*b* are connected outside the IC 17, Vstd1=Vstd2.

Therefore, I19b and I19c are different due to fluctuation in four resistance elements 11. In order to form a resistor inside the IC 17, a diffused resistor and a polysilicon resistor can be used. In order to create a resistor with less fluctuation, it is preferable to use the polysilicon resistor. Fluctuation is about 5% including fluctuation among chips and among lots. However, in the case in which two resistance elements 11 are created close to each other in an identical chip, fluctuation of a resistance value is about 0.1%. Thus, fluctuation between the resistance elements 11c and 11d (R3 and R2) and between the resistance elements 11e and 11f (R1 and R4) shown in FIGS. 1 and 66 is controlled to 0.1% respectively. Therefore, fluctuation between (R1+R2) and (R3+R4), which causes fluctuation between I19b and I19c, is 0.14% which is a root mean square of 0.1.

In this way, resistors determining a current value are taken from two chips adjacent to each other, whereby a current becomes independent from fluctuation among chips and among lots, and the polysilicon resistor having fluctuation of about 5% is also available for practical use. Thus, an incorporated resistor and the driver IC 17 without block unevenness can be realized.

Figure 65:
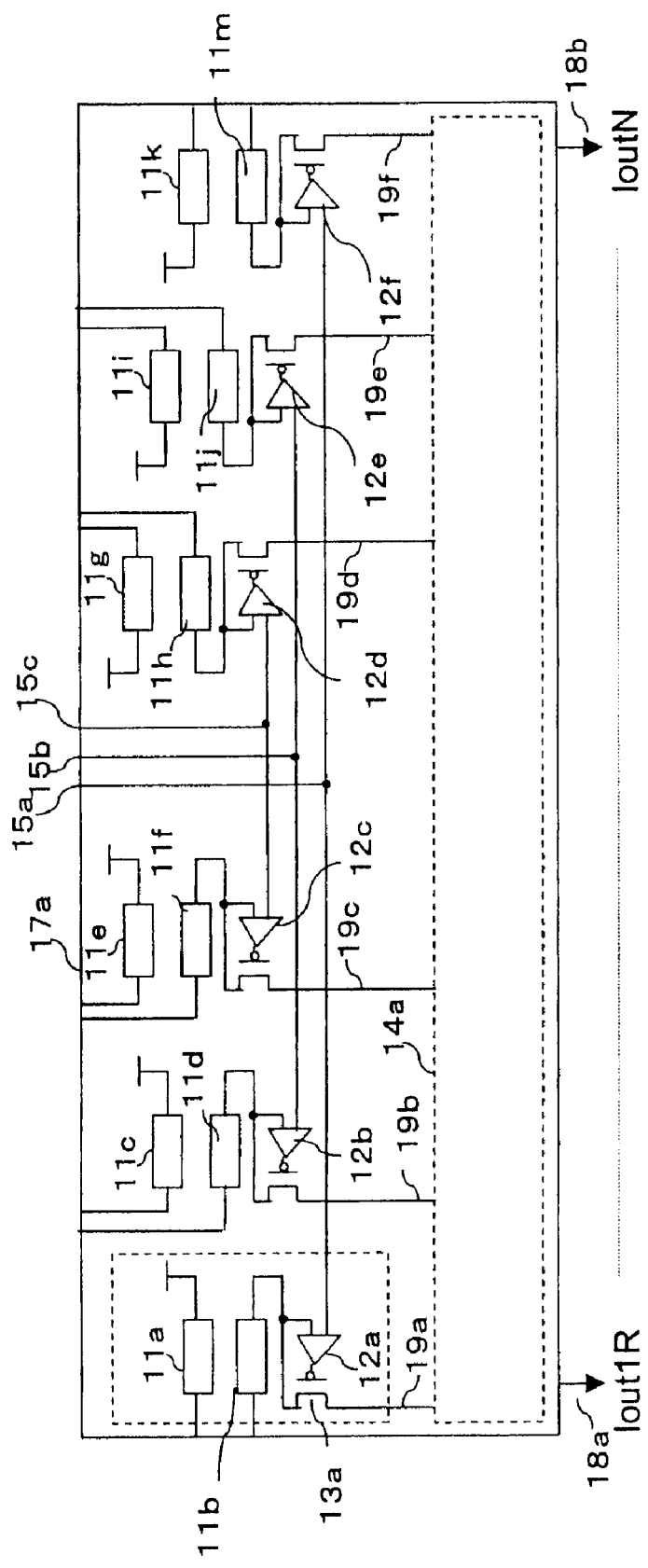
FIG. 65 is a diagram showing a reference current generation unit in a driver IC of performing multicolor output.

Note that, in the above explanation, the explanation is made assuming that a driver is a driver of a monochrome output. However, the present invention is also applicable to a drive of a multicolor output. Identical circuits only have to be prepared by the number multiplied by the number of display colors. For example, in the case of three color outputs of red, green, and blue, it is sufficient to incorporate three identical circuits in an identical IC as shown in FIG. 65 and use the circuits as circuits for red, green, and blue, respectively.

Figure 64:
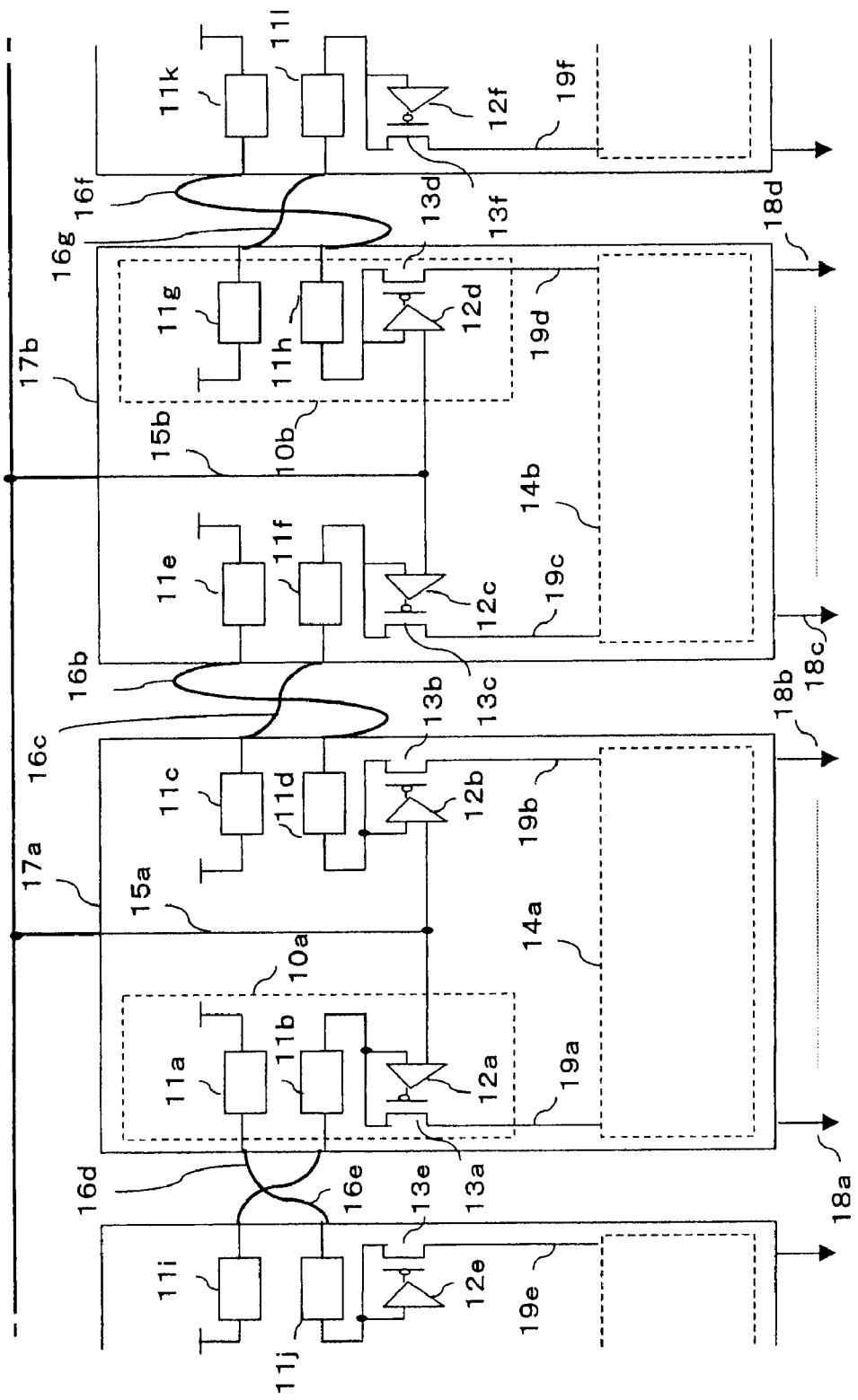
FIG. 64 is a diagram showing an external wire bound in the case in which two or more driver ICs are connected in cascade.

In addition, in FIG. 1, the description is made with the two driver ICs 17. In general, the present invention can be implemented in the same manner in the case in which M (M is an arbitrary natural number) driver ICs are arranged. An example thereof is shown in FIG. 64.

FIG. 62 shows a second embodiment.

FIG. 62 is different from FIG. 1 in a connection method for the resistance elements 11. In all the four resistance elements, a terminal opposite to an external connection end is connected to a power supply.

Figure 67:
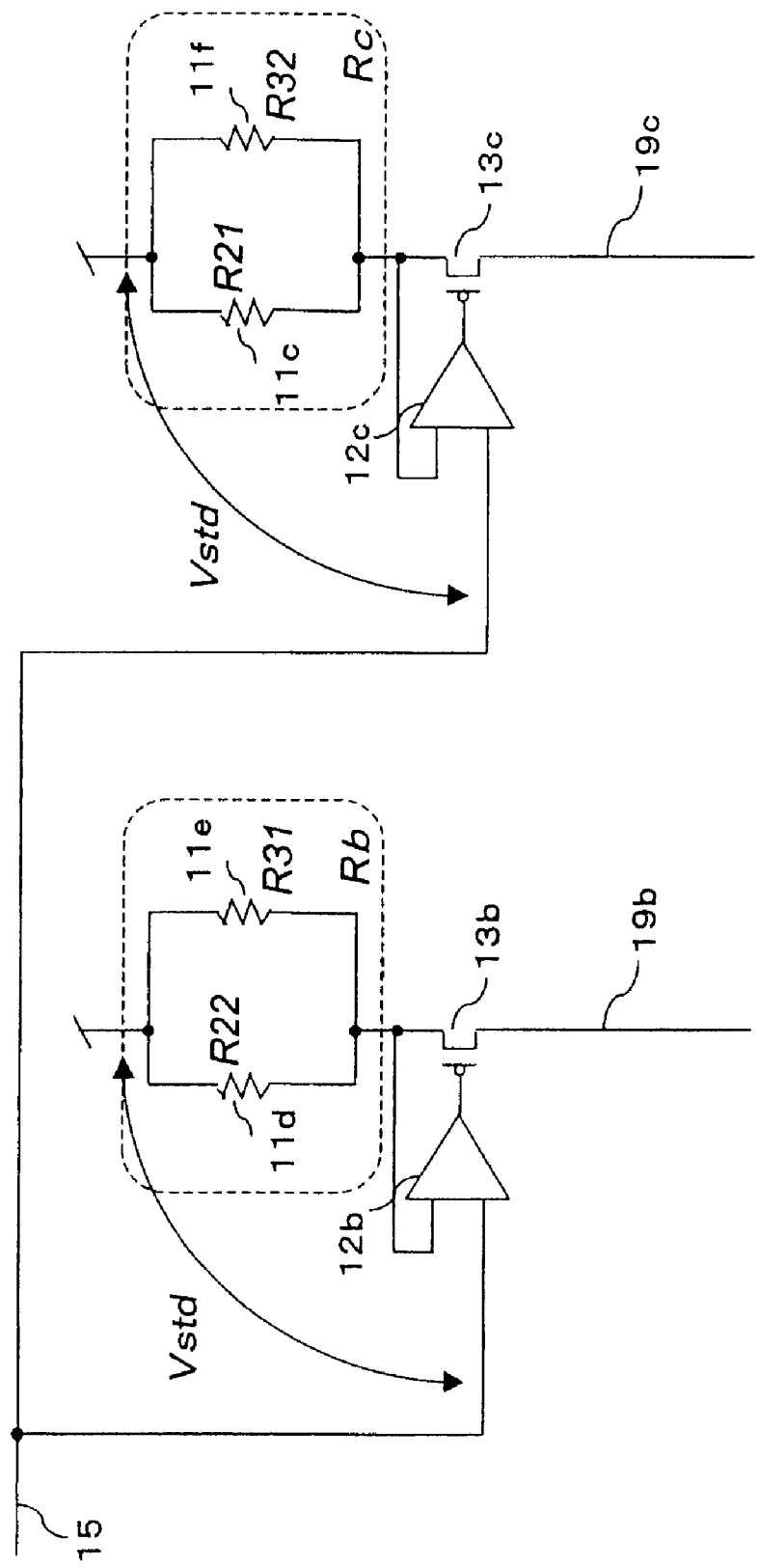
FIG. 67 is a diagram showing an example of a circuit in which fluctuation in two reference currents is reduced in two reference current generation units in the case in which the second embodiment is implemented using plural driver ICs.

A circuit diagram of a reference current generation unit is shown in FIG. 67. Note that, here, the reference voltage signal line 15 is connected outside an IC chip.

Fluctuation of the reference current 19 depends upon fluctuation of a resistance value as in the first embodiment. Since resistors R21 and R22 and resistors R31 and R32 are in an identical chip, fluctuation among the resistors is about 0.1%. Therefore, fluctuation between a combined resistance Rb of R22 and R31 and a combined resistance Rc of R21 and R32 is 0.14%.

In this case, since influence of fluctuation among chips is eliminated outwardly, even if the resistors are formed of the polysilicon resistor, display without block unevenness is also possible.

Figure 70:
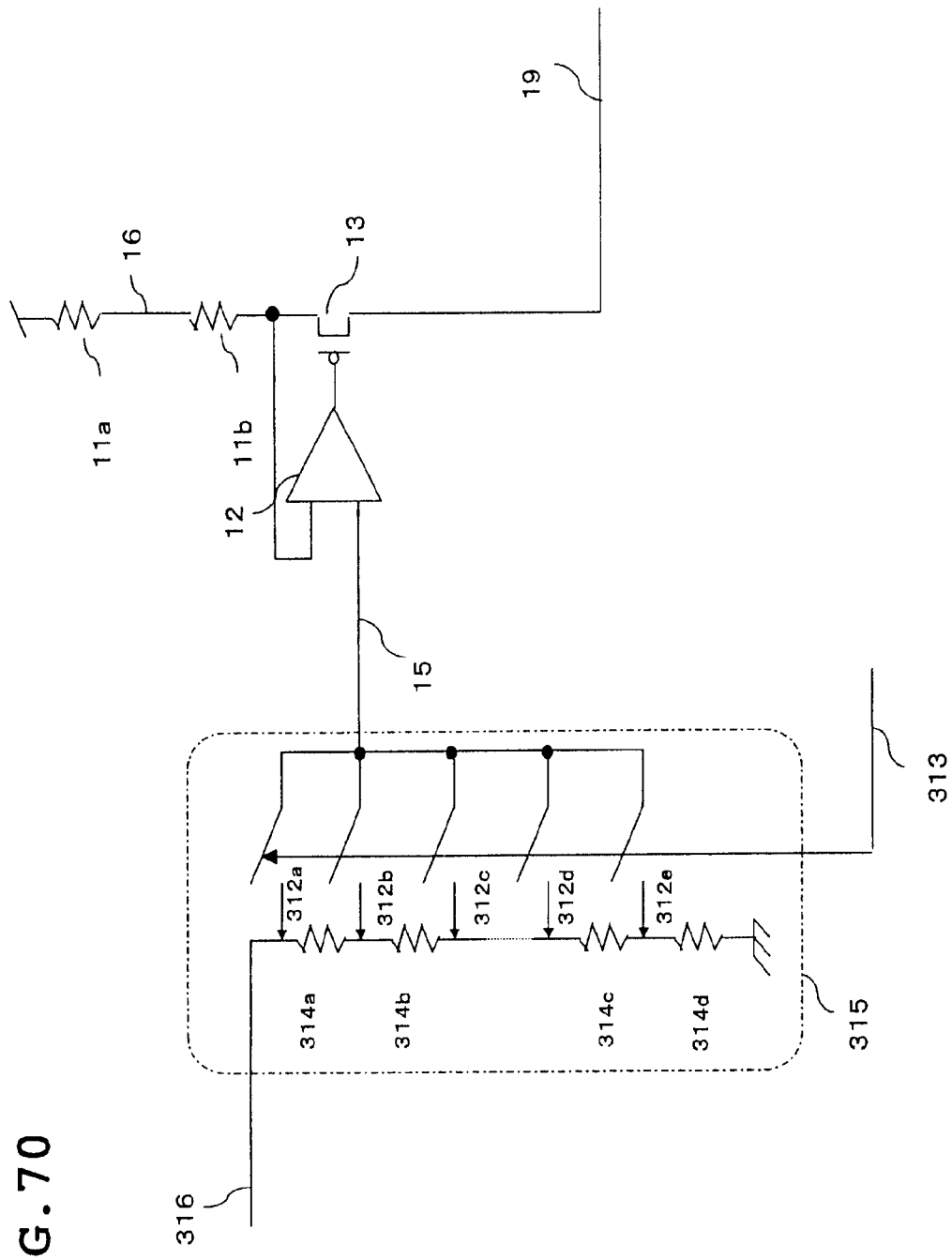
FIG. 70 is a diagram showing a case in which resistors of different driver ICs are also used in a constant current source circuit shown in FIG. 31.
Figure 73:
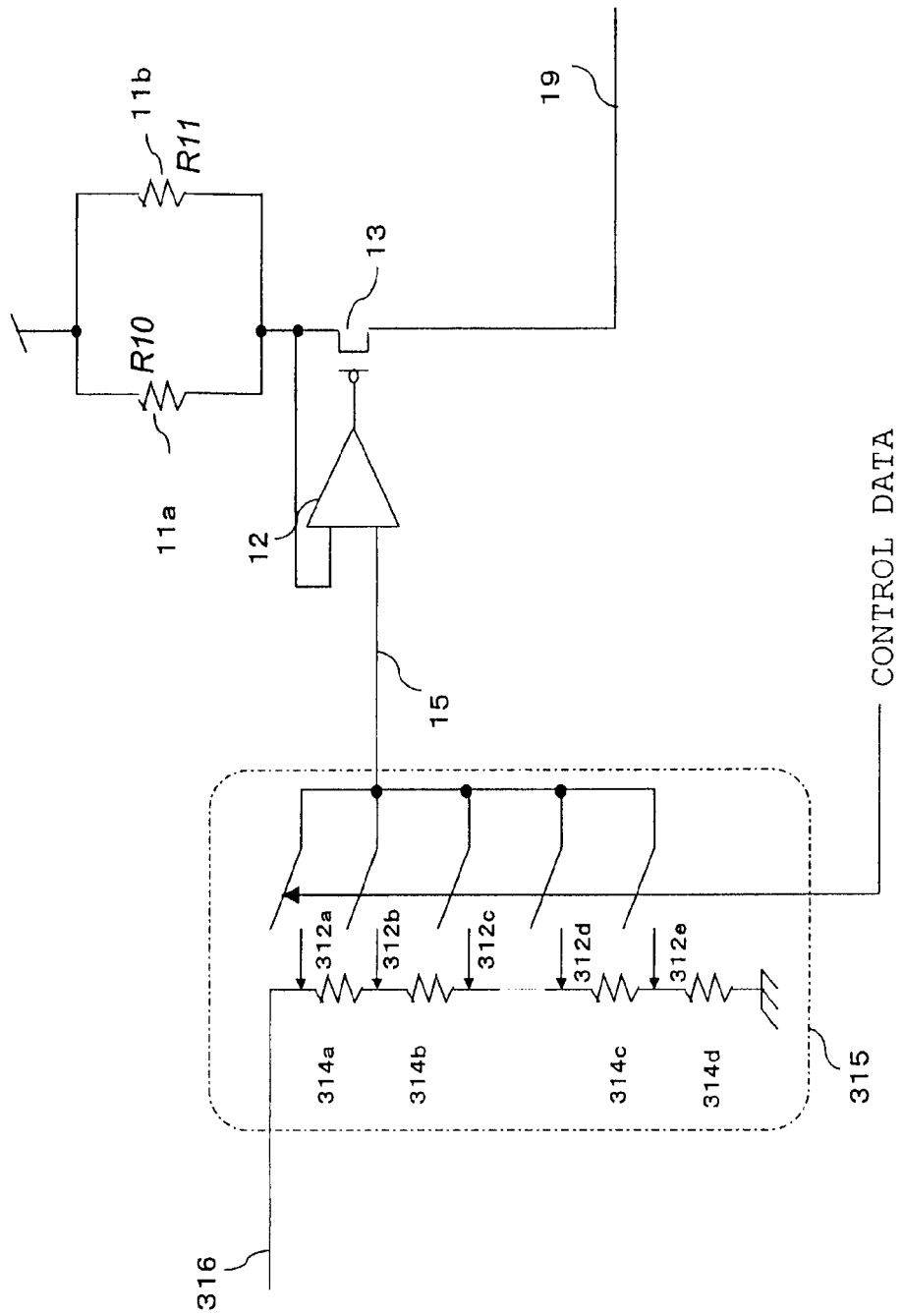
FIG. 73 is a diagram showing a circuit of one reference current generation unit in the second embodiment.

In the above explanation, the reference voltage signal line 15 is explained with the example in which an analog voltage is inputted thereto from the outside. However, as shown in FIG. 70, an analog voltage may be changed in a programmable manner. In FIG. 70, an ON/OFF state of a switch 312 changes and a value of a reference voltage 15 changes according to control data 313. It is possible to change not only a value of the reference current 19 but also luminance of a display panel according to the control data 313. A structure shown in FIG. 70 is adopted in the first embodiment, and a structure shown in FIG. 73 is adopted in the second embodiment.

Figure 72:
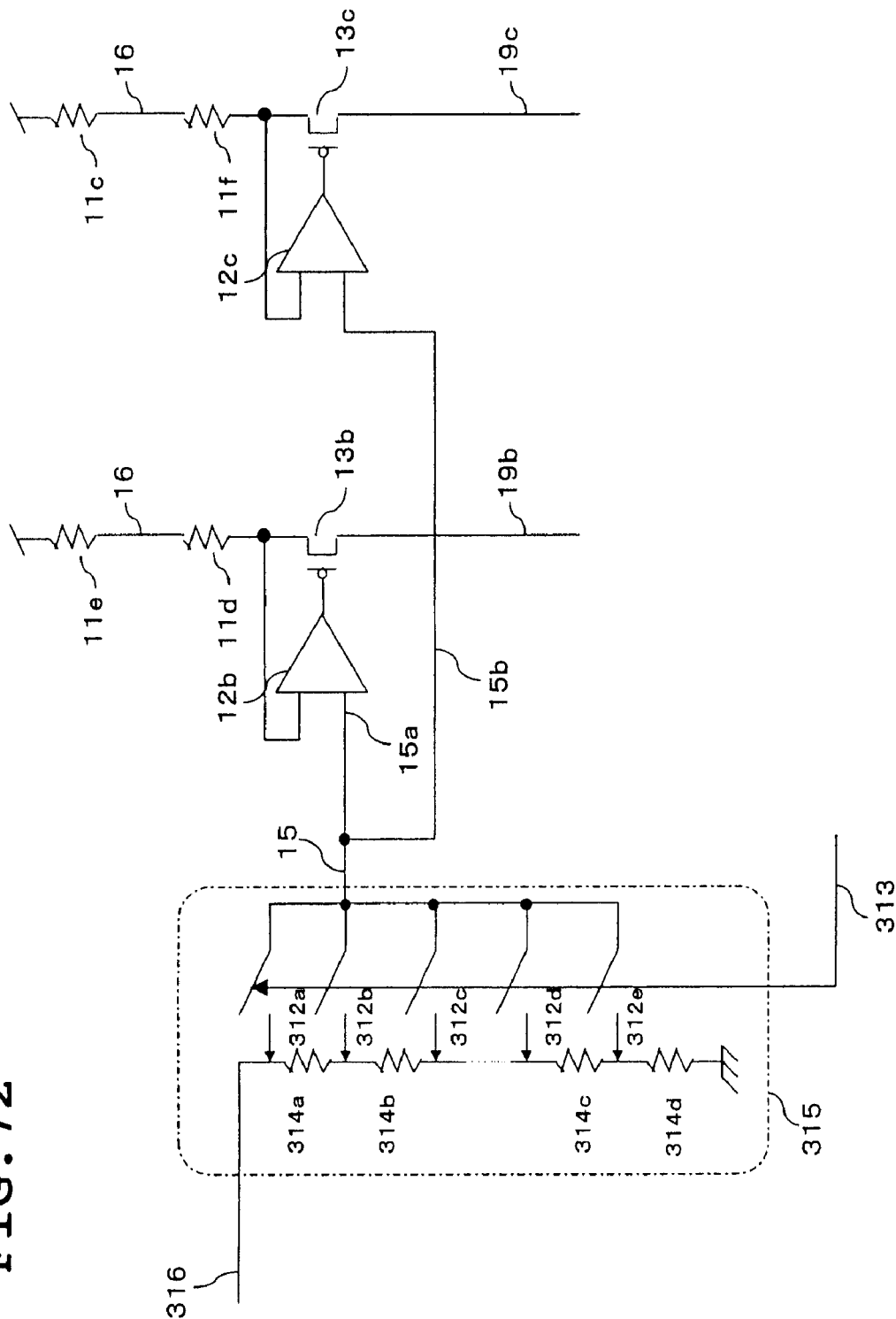
FIG. 72 is a diagram showing an example of connection of a reference current generation unit using an electronic volume in the case in which plural driver ICs are used.

Note that, in the case in which the plural driver ICs 17 are used as in FIG. 1, the circuit of FIG. 70 may be operated individually for each IC 17. Alternatively, as shown in FIG. 72, the reference voltage signal line 15 supplied to plural reference current generation circuits may be controlled by one voltage adjustment unit 315. In this way, the reference current 19 can be adjusted inside the IC 17, whereby, for example, in the personal digital assistant shown in FIG. 14, in order to lengthen a life of a battery, it is possible to perform display at a normal luminance when the button 142 is operated, and the luminance is reduced after a fixed period has elapsed.

Figure 68:
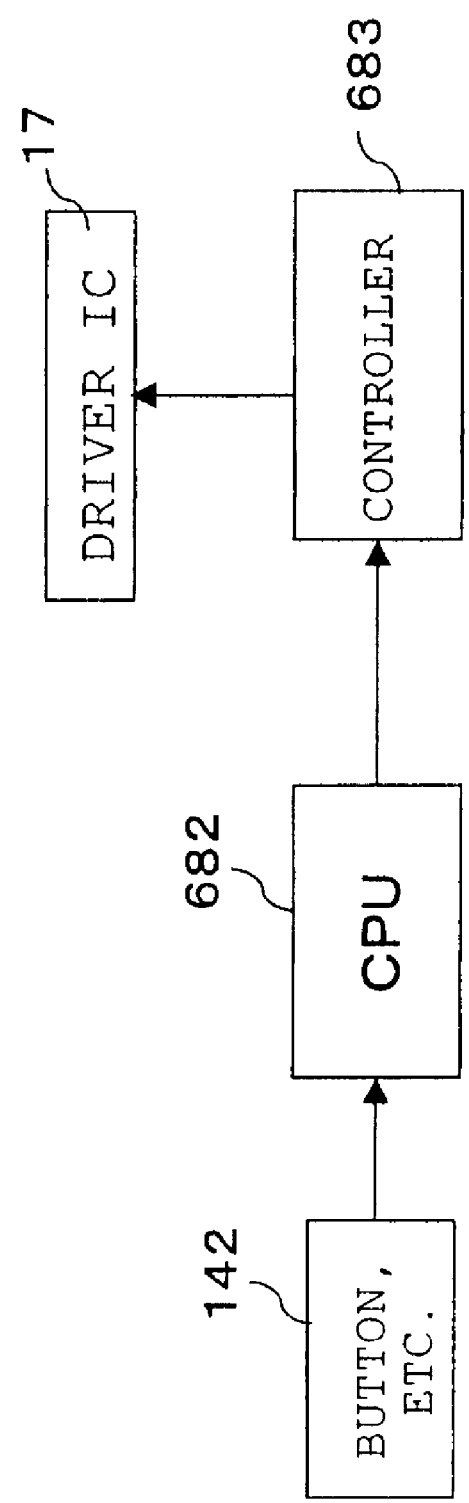
FIG. 68 is a block diagram for performing control of a driver IC of the present invention according to button input of the personal digital assistant shown in FIG. 14.

More specifically, when an input is made in the button 142 as shown in FIGS. 14 and 68, information is transferred to a CPU 682. The CPU sends a signal to a controller 683, causes the controller 683 to rewrite control data inside the driver IC 17, and sets the reference voltage 15 to a default value decided in advance. On the other hand, the CPU 682 counts a certain fixed time and sends a signal to the controller 683 again after the fixed time, and the controller 683 rewrites the control data of the driver IC 17 to reduce a voltage of the reference voltage signal line 15 to thereby decrease luminance. To put it in an extreme way, setting of the reference voltage 15, with which a reference current rarely flows, may be performed by the voltage adjustment unit 315.

Consequently, it is possible to reduce a current value flowing to the inside of the driver IC 17. Moreover, a current flowing to a display element is also reduced, whereby it also becomes possible to reduce power consumption.

Besides, if an optical sensor is used instead of 142 such as the button of FIG. 14, there is also an advantage that luminance can be adjusted according to an environment around a display panel (brightness around a display panel). In an organic luminance element in which this driver IC 17 is mainly used, visibility is high in the dark and is low under bright extraneous light (e.g., under the sunlight).

Thus, with the optical sensor, it is possible to flow a large amount of a reference current of the driver IC 17 according to control of a CPU or a controller when ambient illumination is high and reduce an amount of the reference current of the driver IC 17 when the ambient illumination is low. There is an advantage that control for performing display at luminance allowing most comfortable viewing according to the surrounding environment becomes possible, In the case in which the plural driver ICs 17 are used to implement the first embodiment shown in FIG. 1, a structure as shown in FIG. 70 is adopted. Here, only one constant current source circuit is shown, plural constant current source circuits may be controlled by one voltage adjustment unit 315. For example, a structure as shown in FIG. 72 is possible.

Figure 69:
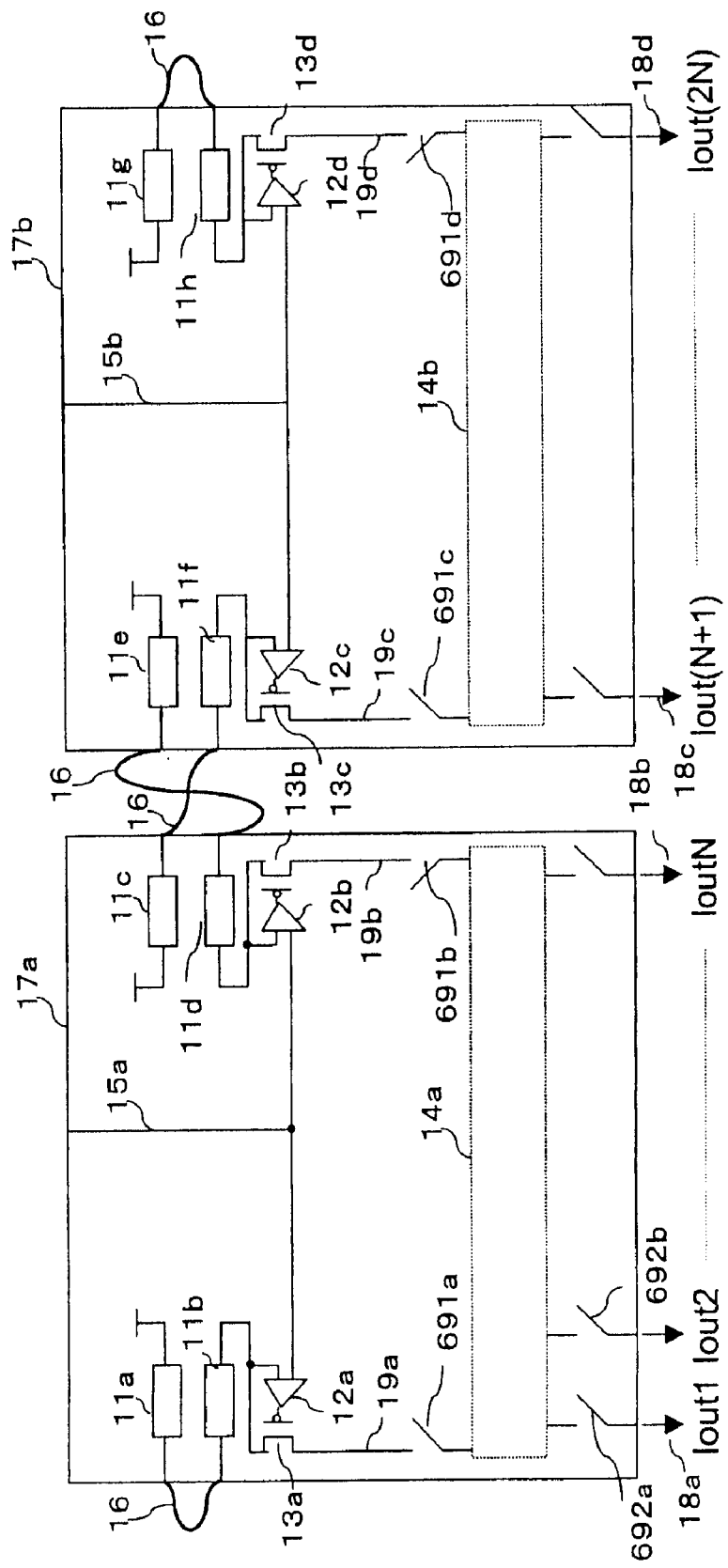
FIG. 69 is a diagram showing a method of reducing power consumption by disconnecting a reference current from the first embodiment of the present invention.

As a method for reduction of power, it is also possible to adopt a structure as shown in FIG. 69. A switch 691 is provided in the reference current line 19 with respect to the structure of FIG. 1. By bringing the switch 691 into a non-conduction state, a reference current can be reduced to 0, and it is possible to reduce power to be consumed inside the IC 17.

In a display device using a display element, which has a temperature characteristic, in a display unit, a function of compensating for the temperature characteristic is required. For example, in some elements, a current-luminance characteristic changes according to temperature, and luminance changes with respect to an identical current input.

In order to keep luminance constant, a reference current only has to be changed according to temperature. For example, there is a method of connecting a temperature compensation element 631 to the resistor 11 in parallel. Consequently, a combined resistance value changes according to temperature, and the reference current 19 also changes. By changing the reference current in a direction of compensating for the temperature characteristic, it becomes possible to realize a display device which is resistant to temperature change.

Figure 63:
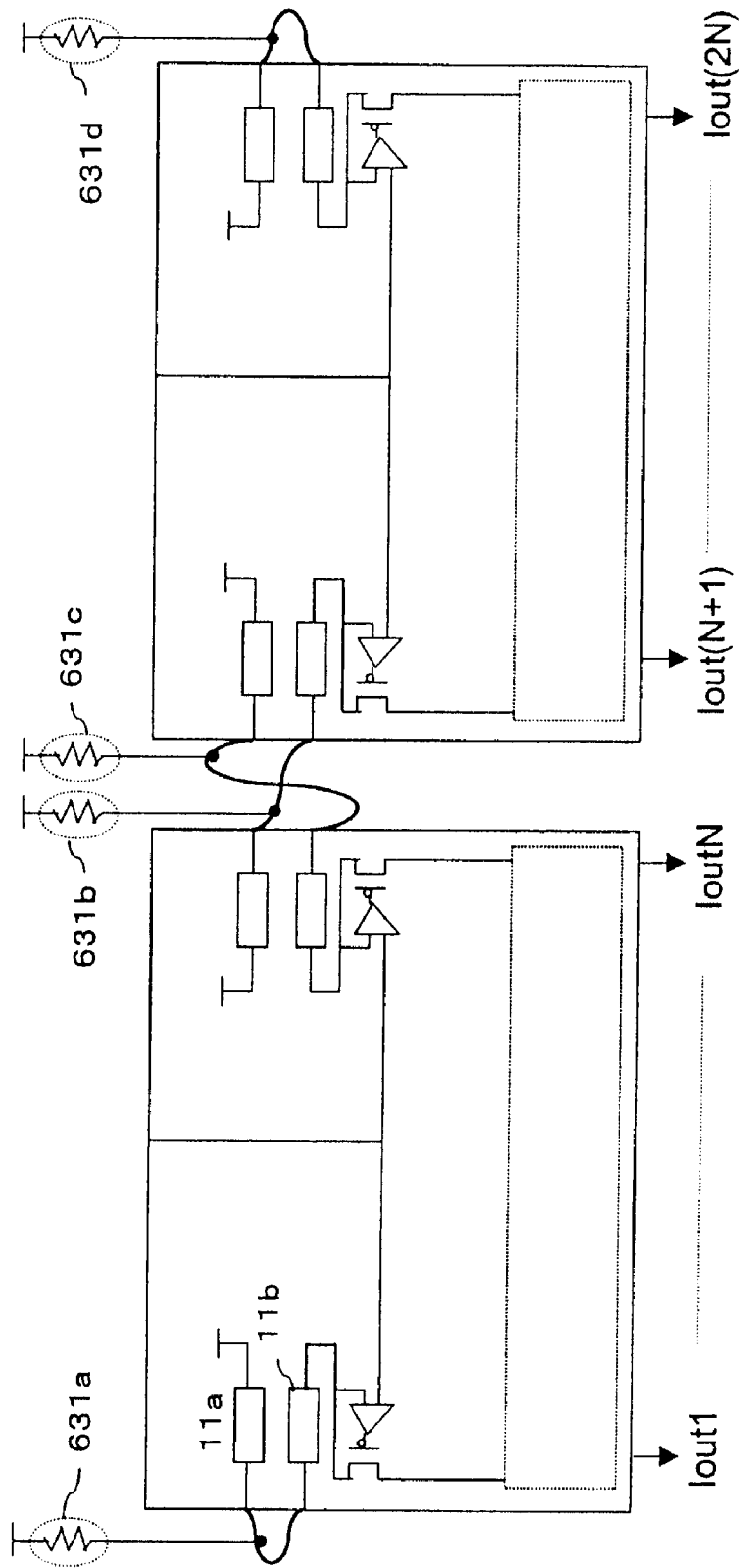
FIG. 63 is a diagram showing a case in which a temperature compensation function is provided in the structure of FIG. 1.

In the case in which temperature characteristic compensation is performed in the structure of FIG. 1, a temperature compensation element 631 only has to be attached as shown in FIG. 63. Since a resistance value determining a reference current changes according temperature, the temperature characteristic compensation becomes possible.

Figure 71:
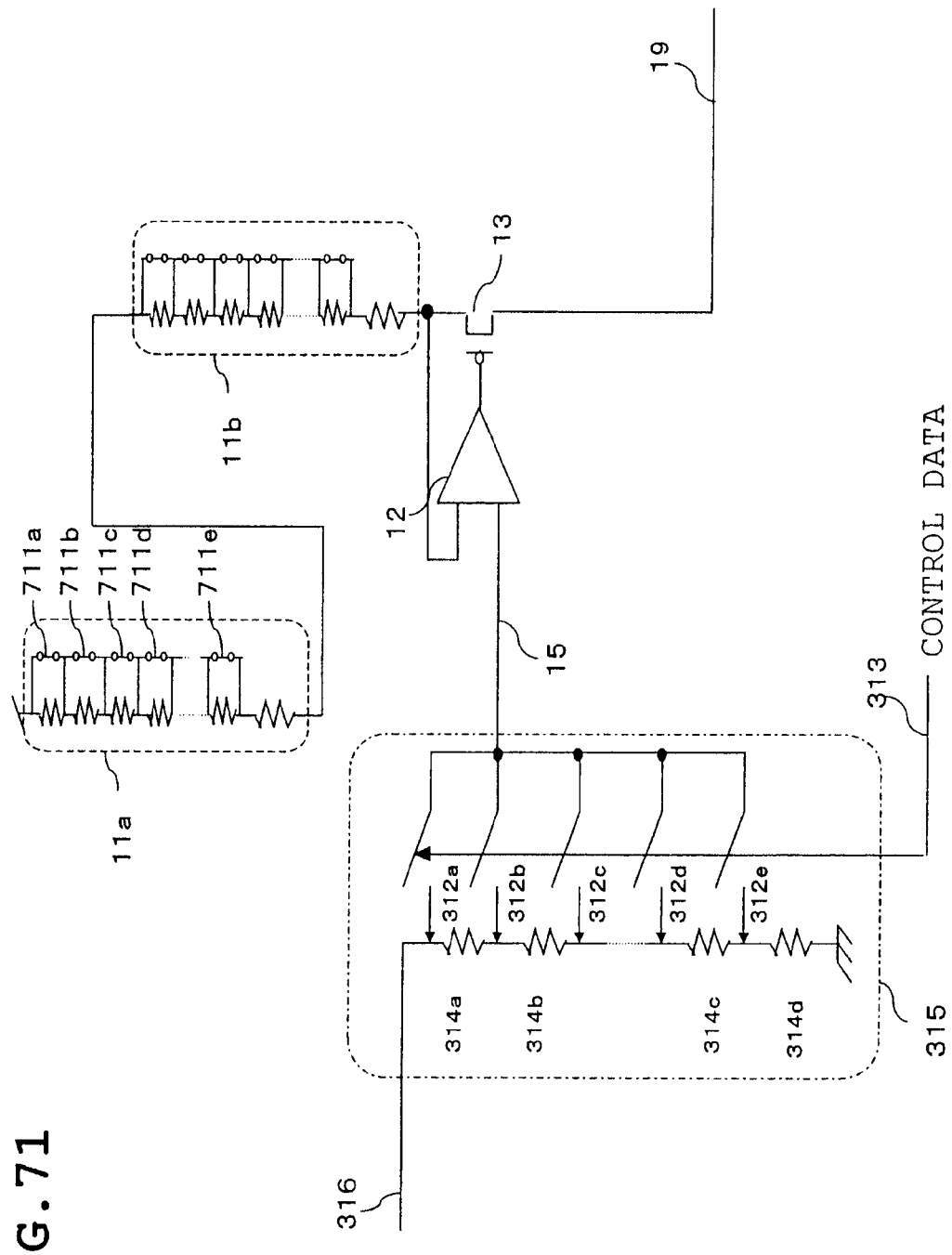
FIG. 71 is a diagram showing a circuit at the time when a function is provided for allowing a value of a resistor to be changed by a trimming operation in the constant current circuit shown in FIG. 70.

Fluctuation in the polysilicon resistors is about 0.1% when the resistors are close to each other inside a chip and about 5% among chips and among lots. In this range, block unevenness can be eliminated by using the present invention. However, fluctuation may increase due to a problem in processes. When fluctuation increases, the resistor becomes defective, and yield of the driver IC 17 falls. Thus, as shown in FIG. 71, a function which can adjust resistance values of the resistance elements 11 is provided to reduce a value of a driver IC deviating from the fluctuation range to a value within the fluctuation range, whereby it is possible to obtain a conforming item.

More specifically, the resistance elements 11 are divided into plural parts. Wirings of Some of the plural parts are short-circuited (711). In order to increase a resistance value of the resistance element 11a, the short-circuited wirings 711 only have to be pattern-cut by an FIB or the like. A magnitude of the increase of the resistance value is adjustable according to the number of wirings 711 to be pattern-cut. The same is true for the resistance element 11b, and this method is applicable to all the resistance elements 11 used in the present invention. Consequently, the resistance values of the resistance elements 11 are adjusted such that fluctuation is reduced to obtain a confirming item judgment.

In this way, the structure which can make many driver ICs conforming is adopted, whereby yield increases, and a display device, which is low in cost and has less unevenness, can be realized.

The example in the case in which a transistor used in the pixel 74 is the p type transistor has been described. The circuit can be realized in the same manner if an n type transistor is used.

Figure 74:
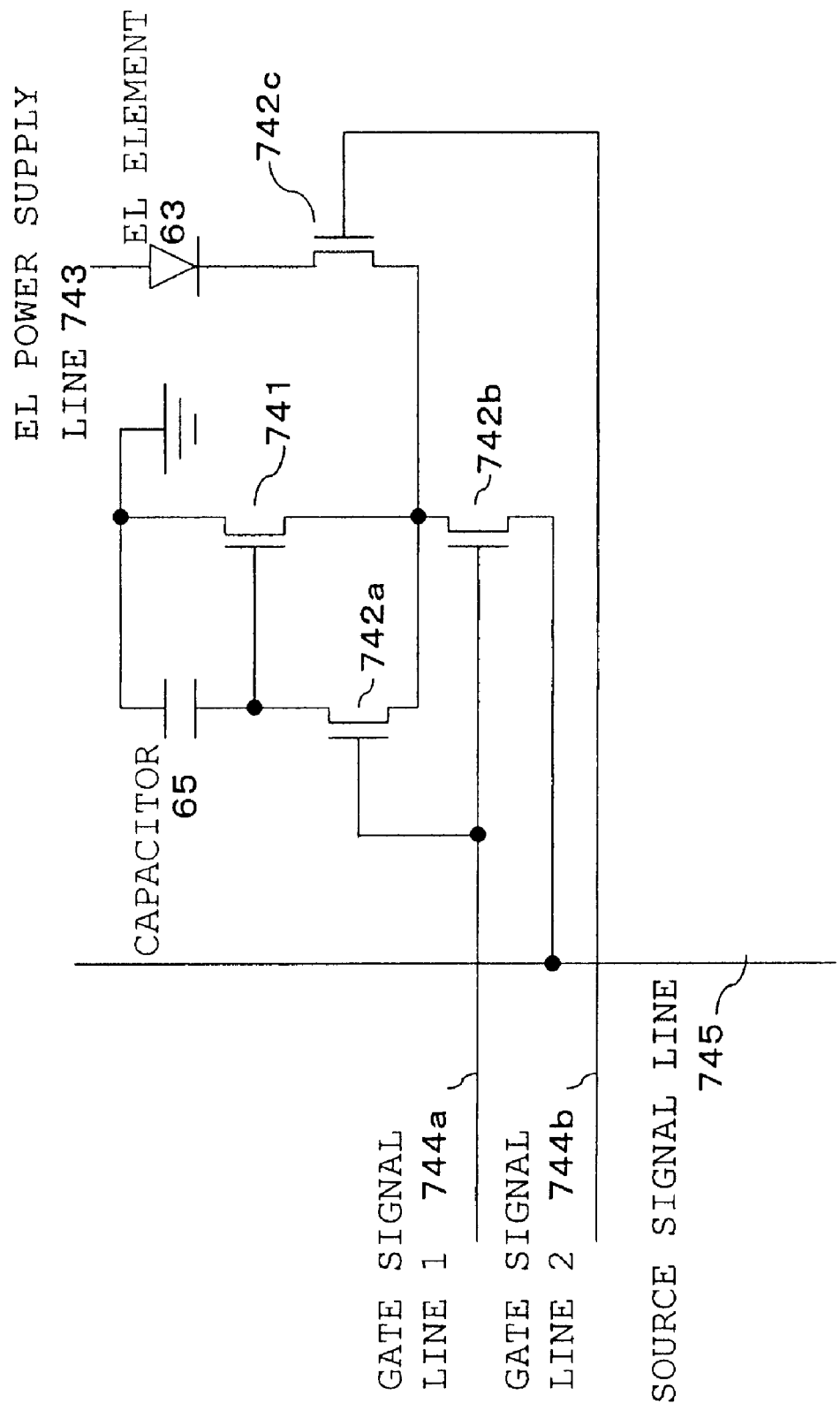
FIG. 74 is a diagram showing a pixel circuit using a current copier in the case in which an n type transistor is used.
Figure 75:
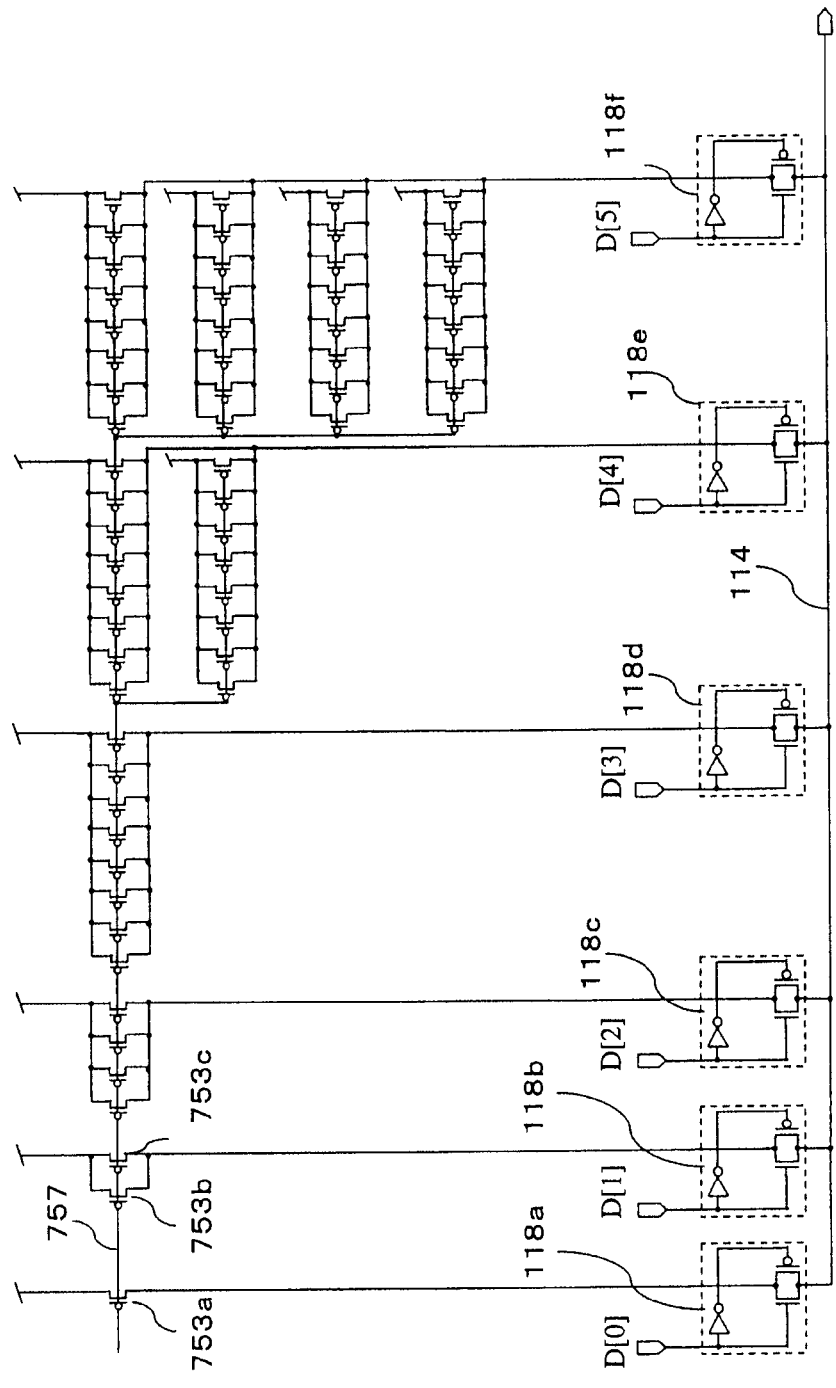
FIG. 75 is a diagram showing an output stage of a driver IC in the case in which the n type transistor is used in a pixel circuit.
Figure 76:
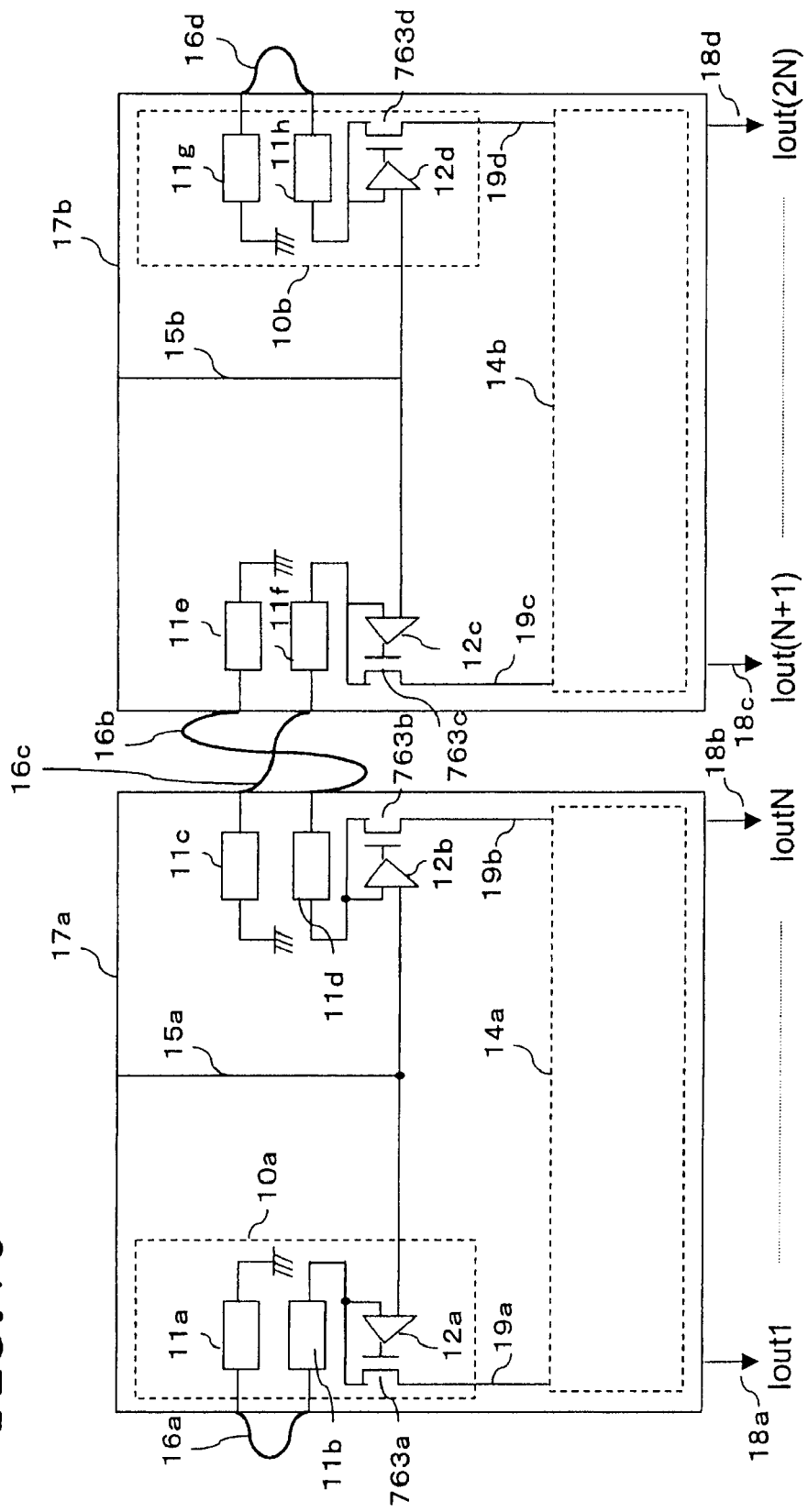
FIG. 76 is a diagram showing a schematic circuit of a driver IC of the present invention in a display device in which the n type transistor is applied to a pixel.

FIG. 74 shows a circuit for one pixel at the time when a pixel structure of a current mirror is formed of the n type transistor. A direction in which a current flows is reversed, and a power supply voltage changes accordingly. Therefore, a current flowing through a source signal line 745 needs to flow from the source driver IC 17 toward the pixel 74. As shown in FIG. 75, the structure of the output stage 14 is a current mirror structure of the p type transistor so as to discharge a current to the outside of the driver IC. A direction of a reference current is also reversed to change the structure to the structure of FIG. 76 as opposed to the structure of FIG. 1.

Figure 77:
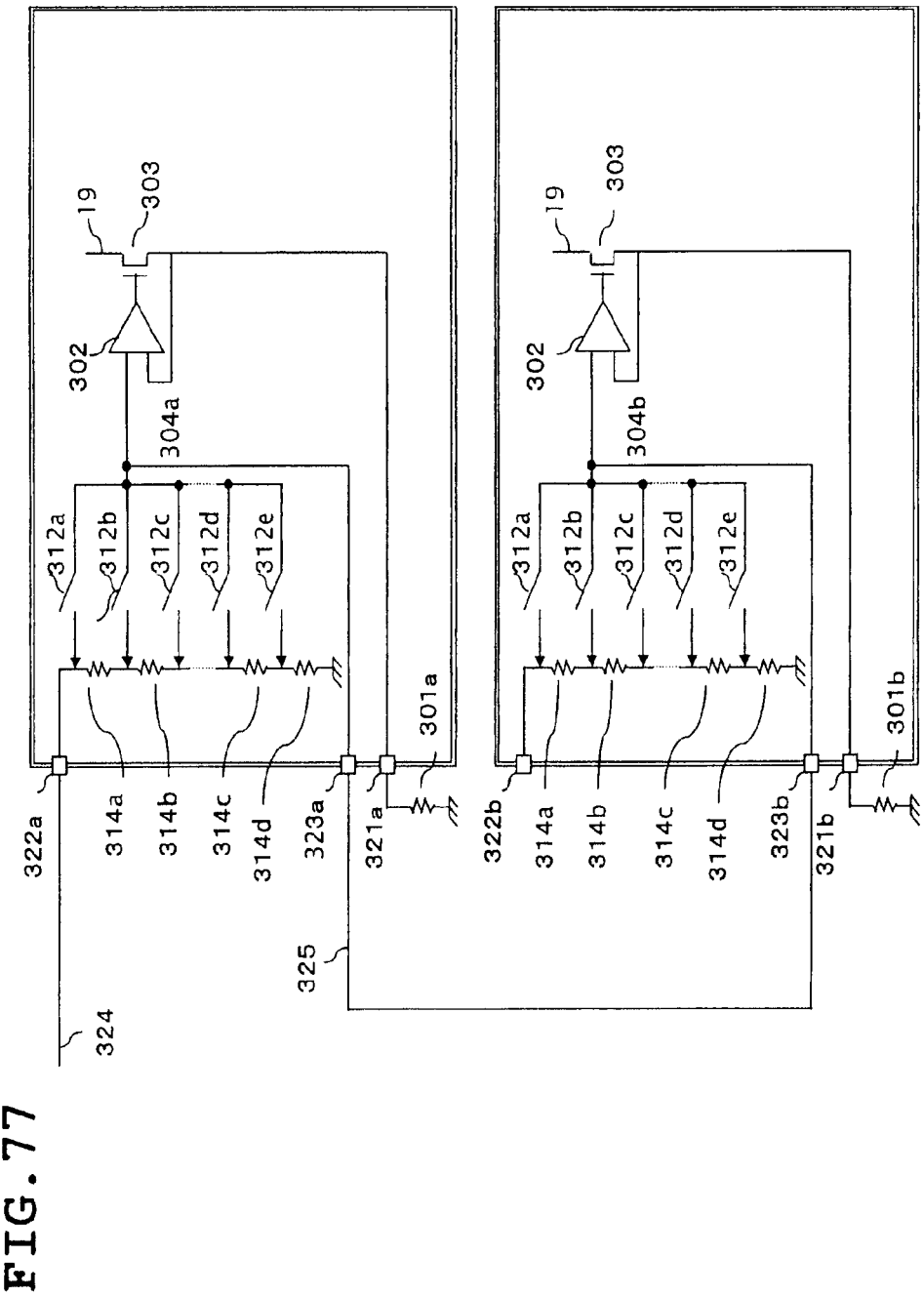
FIG. 77 is a diagram showing a reference current generation unit in the case in which the n type transistor is applied to a pixel circuit and a method of distributing voltage, based on which a reference current is generated, plural driver ICs.

A method of simultaneously controlling the reference voltage control units of the plural driver ICs 17 is also changed as shown in FIG. 77.

In this way, it is possible to apply a transistor used in a pixel in both the p and n types.

In the case in which the current output stage 14 has the structure shown in FIG. 34, as described above, when a wafer having a threshold value characteristic as shown in FIG. 21(a) is used, an output current is outputted with an inclination for each terminal. Although it is possible to make current values at the left and right ends substantially identical according to the structure of FIG. 34, it is difficult to make a current value the same for all output terminals. In general, if output fluctuation between adjacent output terminals is 1% or less, there is no problem in display, and an inclination of a threshold value characteristic only has to be in that range. However, an inclination may be steep depending upon process fluctuation at the time when an IC is produced, a state of a film formation device, or the like. In that case, it is likely that the pertinent IC becomes defective, and yield is deteriorated.

Thus, in this embodiment, a method has been further devised which realizes a structure, with which uniform display can be realized without depending upon an inclination as in FIG. 21(a), and block unevenness at the time when plural ICs are used is prevented.

Figure 78:
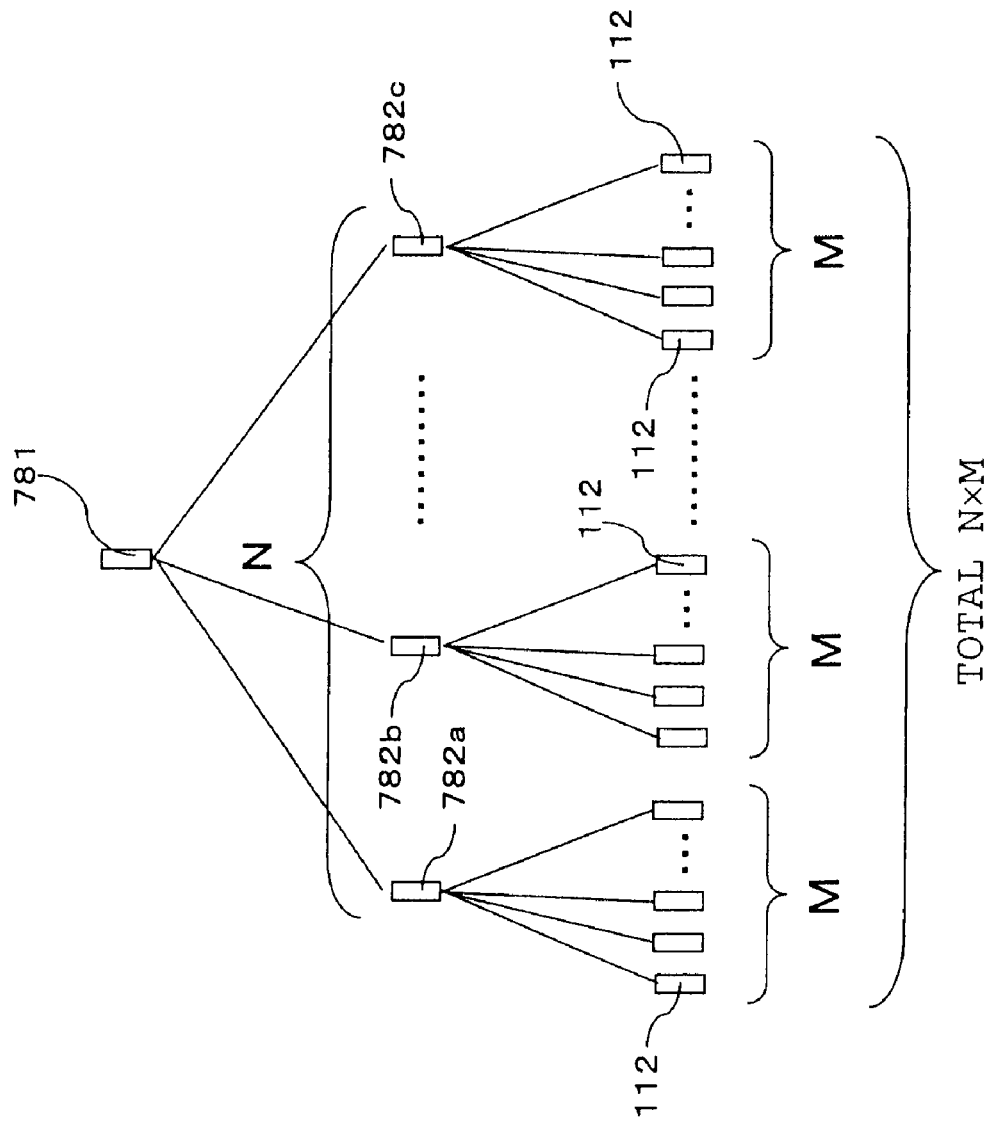
FIG. 78 is a diagram showing a concept of distributing reference current to each output.
Figure 79:
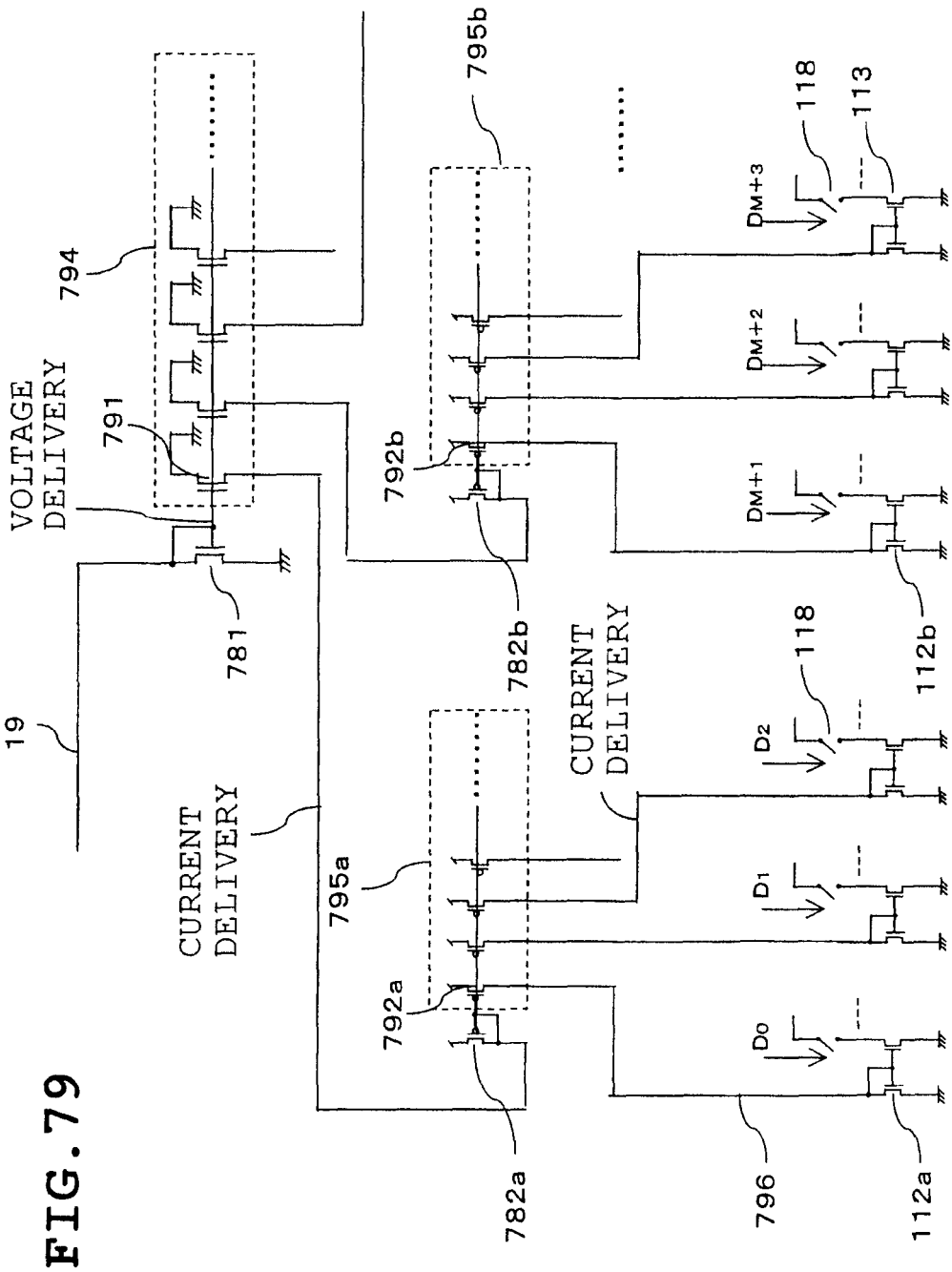
FIG. 79 is a diagram showing a circuit of distributing reference current.

In order to realize uniform display, a reference current is distributed to each output to perform gradation display on the basis of the reference current provided for each output. A method of performing current distribution is shown in FIGS. 78 and 79, and a structure of an output stage is shown in FIG. 35.

The distribution of the reference current to each output is performed in three stages. First, a current is distributed from one reference current source 781 (parent current source) to N current sources 782 (child current sources). Further, currents of the child current sources 782 are distributed to M current sources 112 (grandchild current sources). Consequently, it has become possible to distribute M×N currents from one reference current.

In this figure, in distributing one current source into M×N pieces, current distribution is performed twice. The distribution can be realized whether the number of times of distribution is once or three times or more. However, it is most preferable to perform division twice or three times.

Current fluctuation in each distributing means affects as fluctuation of an output current in accordance with an increase of the number of times of distribution. Since the current fluctuation affects an output as a root mean squares of fluctuation in each distribution stage, in order to control fluctuation of an adjacent output to 1% or less, it is necessary to reduce the number of times of distribution or reduce fluctuation in distribution performed once. In order to reduce fluctuation in the distribution performed once, in general, there is no way but to increase a transistor size, which leads to an increase of a chip area, and there is a disadvantage that a size of the chips of the IC 17 increases. In addition, if the number of times of distribution increases, the number of transistors also increases so much more for that, which also increases the chip area. Therefore, the number of times of distribution is three times at the most.

On the other hand, in the case in which a current is distributed to all outputs at a time, this is effective for a driver IC having 30 or less outputs, but it is difficult to apply it to an driver IC having more than 100 outputs. In order to distribute a current by the number of outputs in distribution performed once, it is necessary to form a current mirror consisting of at least the number of outputs+1 transistors. In general, in the current mirror, transistors forming the mirror are arranged close to each other, whereby mirroring is performed utilizing the fact that transistor characteristics are substantially equal when the transistors are close to each other. When the number of outputs+1 current mirrors are formed, since a transistor of a mirror source and a transistor of a mirror destination may be arranged apart from each other, it becomes difficult to perform mirroring accurately. It is desirable to set the number of outputs, to which a current is distributed at a time, to about thirty at the most.

A method of current distribution is shown in FIG. 79. The reference current 19 is divided into N currents by the parent current source 781 and a transistor 791. In this case, a set of transistors 794 and 781 are arranged close to each other such that there is no fluctuation in N currents. Next, the distributed each current is further divided into M currents In this case, the transistors 782 and 795 are arranged close to each other to control current fluctuation due to characteristic fluctuation. A reference current could be distributed for each output. A current corresponding to input gradation data is outputted from the output line 114 with the structure shown in FIG. 35 on the basis of this distributed current 796 (grandchild reference current). (In this example, an appropriate amount of current is outputted according to data of six bits.) Note that M and N may be arbitrary natural number, but in particular, 2 or more and 3 or less is preferable.

The driver IC 17 often created in a rectangular shape, and output pads are often arranged on a long side thereof. Each output of the current output stage 14 is often placed near the output pads for effective utilization of a chip area. Therefore, in a driver IC of M×N outputs, a first output stage and an M×Nth output stage are often about 10 to 25 mm apart from each other. When one reference current is divided into M×N, wiring to each output is also important. In the structure of FIG. 79, a current mirror is formed, and is arranged close to a part where information is delivered in a form of a voltage is arranged close and wound around to the vicinity of an output stage in a place where information is delivered in a form of a current. Consequently, it becomes possible to distribute a current to an output 10 to 25 mm apart with less fluctuation.

Incidentally, in the case in which display is performed using the plural driver ICs 17 having the output current stages as described above, in order to prevent block unevenness, it is necessary to supply a reference current of an identical amount to each IC.

Figure 80:
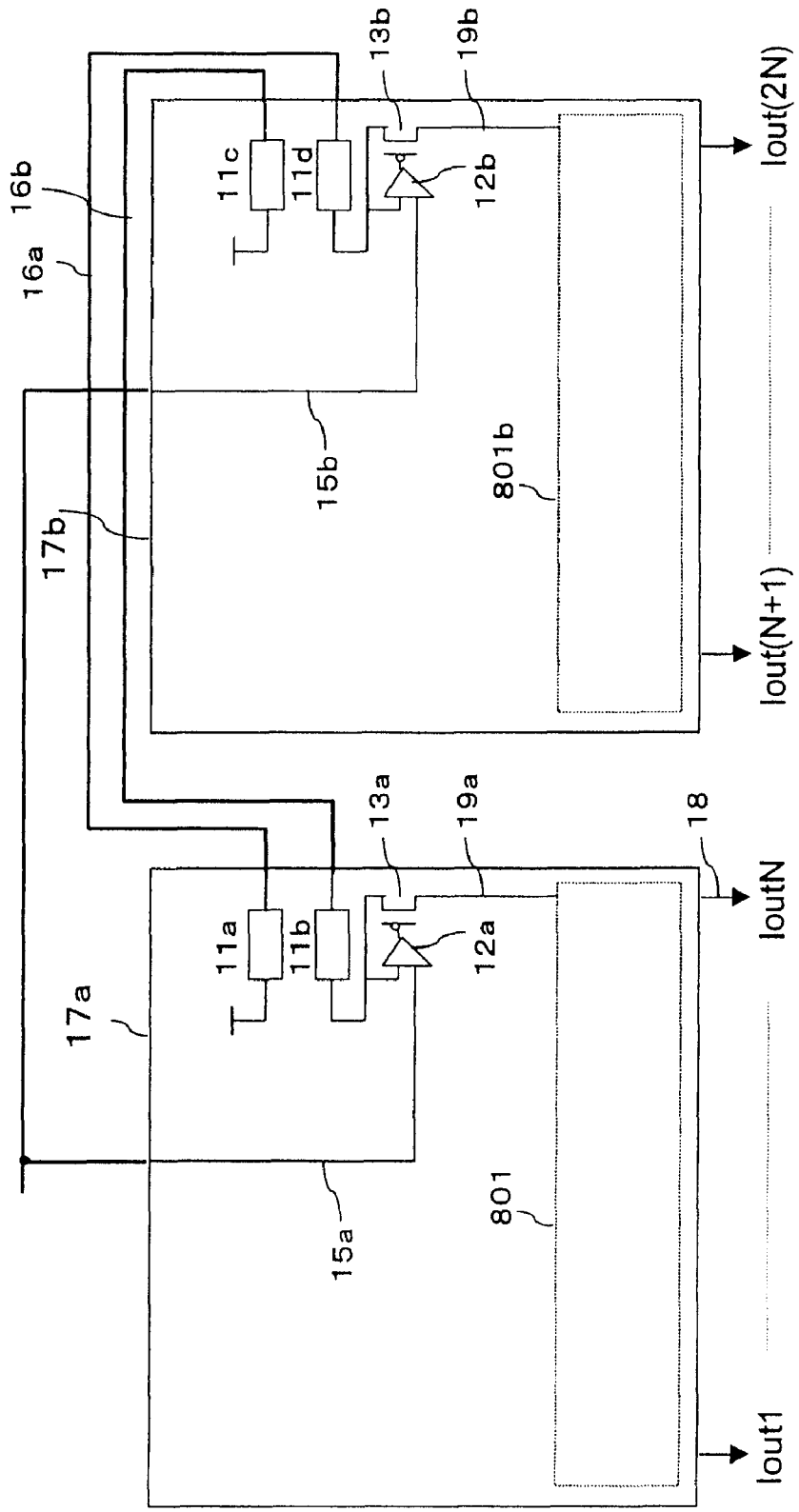
FIG. 80 is a diagram showing a connection relation of plural driver ICs in an embodiment of distributing a reference current to each output.

A structure, in which fluctuation of the reference current 19 decreases between the two driver ICs 17, is shown in FIG. 80.

The reference voltage 15 determining a reference current value is connected in the outside, whereby an identical voltage is supplied. Next, the resistance element 11 is divided into two in the same manner as the first and the second embodiments, one of two is incorporated in an adjacent IC and another is incorporated in the IC are respectively used, whereby fluctuation between a combined resistance value of 11b and 11c and a combined resistance value of 11a and 11d is about 0.14% which is a root mean square of 0.1% which is fluctuation in a chip of an incorporated polysilicon resistor. A reference current only has fluctuation of 0.14%. This is equivalent to the first and the second embodiments. Consequently, display without block unevenness, which occurs in boundaries of chips, has become possible in the driver IC 19 using the structures of FIGS. 78 and 79 as well.

In the above explanation, the explanation is made assuming that a driver is a driver of a monochrome output. However, the present invention is also applicable to a drive of a multicolor output. Identical circuits only have to be prepared by the number multiplied by the number of display colors. For example, in the case of three color outputs of red, green, and blue, it is sufficient to incorporate three identical circuits in an identical IC as shown in FIG. 65 and use the circuits as circuits for red, green, and blue, respectively.

In the above explanation, the transistor is assumed to be a MOS transistor. However, the present invention is also applicable to a MIS transistor and a bipolar transistor in the same manner.

In addition, the present invention is applicable to a transistor of any material such as crystal silicon, low-temperature polysilicon, high-temperature polysilicon, amorphous silicon, and a gallium arsenide compound.

The explanation is made using an organic luminance element as a display element. However, the present invention can be implemented using any element as long as the element is a display element, in which a current and luminance are in a proportional relation, such as an inorganic electroluminescent element and a light-emitting diode.

Note that, in the above-described embodiments, the ICs 17a and 17b serving as driver ICs are equivalent to the driving semiconductor circuit of the present invention. In addition, the reference current generation units 10a and 10b and the parts equivalent thereto are equivalent to the reference current generating means of the present invention. Further, the current output stages 14a and 14b are equivalent to the drive current output mechanism of the present invention.

In addition, the common gate line 17 is equivalent to the common gate line of the present invention, and the distributing mirror transistors 112a and 112b are equivalent to the current distributing means of the present invention. Further, the digital/analog conversion units 116a to 116c are equivalent to the drive current generating means of the present invention. Moreover, the power supply 51 and the parts equivalent thereto are equivalent to the predetermined power supply of the present invention, and the reference voltage signal inputted from the reference voltage signal line 15 is equivalent to the reference voltage signal of the present invention.

Further, the resistance elements 11c to 11f are equivalent to the plural resistance elements connected in series of the first present invention. In particular, in the case in which the resistance elements 11c and 11d shown in FIG. 1 are the resistance elements formed on the chip of one of the pair of driving semiconductor circuits adjacent to each other of the first present invention, the resistance elements 11e and 11f shown in the figure corresponds to the resistance elements formed on the chip of the other of the pair of driving semiconductor circuits adjacent to each other.

Moreover, the structure for distribution of a reference current shown in FIG. 78 is equivalent to the multistage structure of the drive current output mechanism of the present invention.

INDUSTRIAL APPLICABILITY

As described above, according to the present invention, since output current values at left and right ends in an identical driver IC can be made the same, and a reference current determining an output current value can be made identical both in a chip and among chips, it has become possible to, in a display device of performing display using plural driver ICs, eliminate luminance unevenness which occurs in boundaries of driver ICs due to fluctuation in the driver ICs. Consequently, cascade connection of a current output type driver IC can be realized. In addition, it has become possible to incorporate resistors, for which externally attached parts have been used conventionally, by using the reference current generation unit of the present invention, and reduction of the number of packaged parts and simplification of array wiring have become possible.

This application is related to U.S. Ser. No. 10/508,698, filed Sep. 29, 2004, the entire contents of which are incorporated herein by reference, and claims priority under 35 U.S.C. §120 to this application.

The invention claimed is:

1. An active matrix type display device comprising:
a display including a matrix of pixels, each of the pixels having an organic luminous element and a driving transistor;
a driver circuit including a current output unit configured to output a current to be applied to each of the pixels; and a reference current generation circuit configured to generate a reference current, wherein the current output unit has transistor groups as output stages thereof, each of the transistor groups having one transistor or a plurality of transistors, so that the outputted current is applied to the driving transistor, and the current outputted from at least one transistor of the transistor groups is changeable according to a magnitude of the generated reference current.

2. The active matrix type display device according to claim 1, wherein
a value of (channel width)/(channel length) of the transistor of the transistor group is 0.01 or more and 0.6 or less.

3. The active matrix type display device according to claim 1, further comprising a current path forming circuit which is supplied a current outputted from the transistor groups for a predetermined period.

4. The active matrix type display device according to claim 1, wherein
a total resistance value of the gate line of the transistor groups is set to a value equal to or larger than a larger one of a value, which is found by dividing a voltage of a difference between a maximum value and a minimum value of a gate voltage with respect to a reference current value in a use process by a value of 0.5% of the reference current, and 1 KΩ, and equal to or smaller than 5 MΩ.

5. The active matrix type display device according to claim 1, wherein
the driver circuit has a voltage output unit.

6. The active matrix type display device according to claim 1, wherein
a change of the reference current is capable of setting according to control data.

7. An active matrix type display device comprising:
a display including a matrix of pixels, each of the pixels having an organic luminous element and a driving transistor;
a driver circuit including a current output unit configured to output a current to be applied to each of the pixels;
a reference current generation circuit configured to generate a reference current;
a first coupling circuit; and
a seconu coupling circuit, wherein
the current output unit has transistor groups as output stages thereof, each of the transistor groups having one transistor or a plurality of transistors, so that the outputted current is applied to the driving transistor, and
the first coupling circuit and the second coupling circuit are electrically coupled to a gate line of at least one transistor of the transistor groups, and are supplied the generated reference current.

8. The active matrix type display device according to claim 7, wherein
a value of (channel width)/(channel length) of the transistor of the transistor group is 0.01 or more and 0.6 or less.

9. The active matrix type display device according to claim 7, further comprising a current path forming circuit which is supplied a current outputted from the transistor groups for a predetermined period.

10. The active matrix type display device according to claim 7, wherein
the driver circuit has a voltage output unit.

11. The active matrix type display device according to claim 7, wherein
a change of the reference current is capable of setting according to control data.

12. An active matrix type display device comprising:
a display including a matrix of pixels, each of the pixels having an organic luminous element and a driving transistor;
a driver circuit including a voltage output unit configured to output a voltage to be applied to each of the pixels and a current output unit configured to output a current to be applied to each of the pixels;
a judgment circuit configured to judge whether the voltage output unit outputs the voltage or the current output unit outputs the current, wherein
the current output unit having has transistor groups as output stages thereof,
each of the transistor groups having one transistor or a plurality of transistors, so that the outputted current is applied to the driving transistor.

13. The active matrix type display device according to claim 12, wherein
a value of (channel width)/(channel length) of the transistor of the transistor group is 0.01 or more and 0.6 or less.

14. The active matrix type display device according to claim 12, further comprising a current path forming circuit which is supplied a current outputted from the transistor groups for a predetermined period.

15. The active matrix type display device according to claim 12, wherein
a total resistance value of the gate line of the transistor groups is set to a value equal to or larger than a larger one of a value, which is found by dividing a voltage of a difference between a maximum value and a minimum value of a gate voltage with respect to a reference current value in a use process by a value of 0.5% of the reference current, and 1 KΩ, and equal to or smaller than 5 MΩ.

16. The active matrix type display device according to claim 12, wherein
a period which the voltage output circuit is allowed to output for one horizontal scanning period is capable of setting.

17. A display device comprising:
a display including a matrix of pixels, each of the pixels having an organic luminous element;
a driver circuit including a current output unit configured to output a current to be applied to each of the pixels; and
a reference current generation circuit configured to generate a reference current, wherein
the current output unit has transistor groups as output stages thereof, each of the transistor groups having one transistor or a plurality of transistors,
the current outputted from at least one transistor of the transistor groups is changeable according to a magnitude of the generated reference current, and
a total resistance value of the gate line of the transistor groups is set to a value equal to or larger than a larger one of a value, which is found by dividing a voltage of a difference between a maximum value and a minimum value of a gate voltage with respect to a reference current value in a use process by a value of 0.5% of the reference current, and 1 KΩ, and equal to or smaller than 5 MΩ.

18. A display device comprising:
a display including a matrix of pixels, each of the pixels having an organic luminous element;
a driver circuit including a voltage output unit configured to output a voltage to be applied to each of the pixels and a current output unit configured to output a current to be applied to each of the pixels;
a judgment circuit configured to judge whether the voltage output unit outputs the voltage or the current unit outputs the current, wherein the current output unit has transistor groups as output stages thereof, each of the transistor groups having one transistor or a plurality of transistors, and a total resistance value of the gate line of the transistor groups is set to a value equal to or larger than a larger one of a value, which is found by dividing a voltage of a difference between a maximum value and a minimum value of a gate voltage with respect to a reference current value in a use process by a value of 0.5% of the reference current, and 1 KΩ, and equal to or smaller than 5 MΩ.

* * * * *